United States Patent [19]

Vinal et al.

[11] Patent Number: 5,374,836

[45] Date of Patent: * Dec. 20, 1994

[54] HIGH CURRENT FERMI THRESHOLD FIELD EFFECT TRANSISTOR

[75] Inventors: Albert W. Vinal, Cary; Michael W. Dennen, Raleigh, both of N.C.

[73] Assignee: Thunderbird Technologies, Inc., Research Triangle Park, N.C.

[*] Notice: The portion of the term of this patent subsequent to Mar. 16, 1993 has been disclaimed.

[21] Appl. No.: 37,636

[22] Filed: Feb. 23, 1993

Related U.S. Application Data

[63] Continuation-in-part of Ser. No. 977,689, Nov. 18, 1992, which is a continuation of Ser. No. 826,939, Jan. 28, 1992, Pat. No. 5,194,923.

[51] Int. Cl.$^5$ .............................................. H01L 29/10
[52] U.S. Cl. ..................................... 257/344; 257/386; 257/403; 257/408; 257/900
[58] Field of Search ............... 257/327, 336, 340, 344, 257/345, 403, 408, 386, 900, 404

[56] References Cited

U.S. PATENT DOCUMENTS

| | | |
|---|---|---|
| Re. 32,800 | 12/1988 | Han et al. . |
| 3,653,978 | 4/1972 | Robinson et al. . |
| 3,789,504 | 2/1974 | Jaddam . |
| 3,872,491 | 3/1975 | Hanson et al. . |
| 4,042,945 | 8/1977 | Lin et al. . |
| 4,108,686 | 8/1978 | Jacobus, Jr. . |
| 4,274,105 | 6/1981 | Crowder et al. . |
| 4,491,807 | 1/1985 | Hoover .............................. 331/111 |
| 4,697,198 | 9/1987 | Komori et al. . |
| 4,737,471 | 4/1988 | Shirato et al. . |
| 4,771,012 | 9/1988 | Yabu et al. ........................ 257/344 |
| 4,819,043 | 4/1989 | Yazawa et al. . |
| 4,831,422 | 5/1989 | Ohno . |
| 4,841,346 | 6/1989 | Noguchi . |
| 4,899,202 | 2/1990 | Blake et al. . |
| 4,907,048 | 3/1990 | Huang . |
| 4,928,156 | 5/1990 | Alvis et al. . |
| 4,984,043 | 1/1991 | Vinal . |
| 4,990,974 | 2/1991 | Vinal . |
| 4,994,872 | 2/1991 | Nishizawa et al. . |
| 5,119,152 | 6/1992 | Mizuno .............................. 257/336 |
| 5,151,759 | 9/1992 | Vinal ................................. 257/403 |
| 5,192,990 | 3/1993 | Stevens ............................. 257/336 |
| 5,194,923 | 3/1993 | Vinal ................................. 257/268 |

FOREIGN PATENT DOCUMENTS 0070744 1/1983 European Pat. Off. .

(List continued on next page.)

OTHER PUBLICATIONS

*Characteristics of P-Channel MOS Field Effect Transistors with Ion-Implanted Channels*, Hswe, M. et al., Solid-State Electronics, vol. 15, pp. 1237-1243, 1972.

(List continued on next page.)

Primary Examiner—William D. Larkins
Assistant Examiner—Courtney A. Bowers
Attorney, Agent, or Firm—Bell, Seltzer, Park & Gibson

[57] ABSTRACT

A high current Fermi-FET includes an injector region of the same conductivity type as the Fermi-Tub region and the source and drain regions, located adjacent the source region and facing the drain region. The injector region is preferably doped at a doping level which is intermediate the relatively low doping concentration of the Fermi-Tub and the relatively high doping concentration of the source region. The injector region controls the depth of the carriers injected into the channel and maximizes injection of carriers into the channel at a predetermined depth below the gate. The injector region may also extend to the Fermi-tub depth to decrease bottom leakage current. Alternatively, a bottom leakage current control region may be used to decrease bottom leakage current. Lower pinch-off voltage and increased saturation current are obtained by providing a gate sidewall spacer which extends from adjacent the source injector region to adjacent the sidewall of the polysilicon gate electrode of the Fermi-FET. The gate sidewall spacer preferably comprises an insulator having permittivity which is greater than the permittivity of the gate insulating layer.

146 Claims, 28 Drawing Sheets

FOREIGN PATENT DOCUMENTS

| | | |
|---|---|---|
| 0073623 | 3/1983 | European Pat. Off. . |
| 0274278 | 7/1988 | European Pat. Off. . |
| 55-87481 | 7/1980 | Japan ............................ 257/403 |
| 55-87483 | 7/1980 | Japan . |
| 56-91473 | 7/1981 | Japan . |
| 57-10268 | 1/1982 | Japan . |
| 59-29460 | 2/1984 | Japan . |
| 61-53775 | 3/1986 | Japan ............................ 257/900 |
| 61-160975 | 7/1986 | Japan . |
| 62-248255 | 10/1987 | Japan . |
| 63-53975 | 3/1988 | Japan . |
| 1097139 | 4/1987 | U.S.S.R. . |

OTHER PUBLICATIONS

*The Junction MOS (JMOS) Transistor–A High Speed Transistor for VLSI,* Sun, E. et al., IEEE, pp. 791–794, 1980.

*Optimization of Sub-Micron P-Channel FET Structure,* Chiang, S. et al., IEEE, pp. 534–535, 1983.

*Gate Material Work Function Considerations for 0.5 Micron CMOS,* Hellenius, S. J. et al., IEEE, pp. 147–150, 1985.

*A Normally-Off Type Buried Channel MOSFET for VLSI Circuits,* Nishiuchi, K. et al., IEDM Technical Digest, 1979, pp. 26–29.

*Ultra-High Speed CMOS Circuits in Thin SIMOX Films,* A. Kamgar et al., IEDM vol. 89, pp. 829–832, 1989.

*Fabrication of CMOS on Ultrathin SOI Obtained by Epitaxial Lateral Overgrowth and Chemical-Mechanical Polishing,* G. Shahidi et al., IEDM vol. 90, pp. 587–590, 1990.

*Submicron MOSFET Structure for Minimizing Channel Hot-Electron Injection,* Takeda E., et al., 1981 Symposium on VLSI Technology, Hawaii (Sep. 1981), Dig. Tech. Papers pp. 22–23.

*A New Half-Micrometer P-Channel MOSFET with Efficient Punchthrough Stops,* Odanaka S., et al., IEEE Transactions on Electron Devices, vol. ED-33, No. 3, Mar., 1986, pp. 317–321.

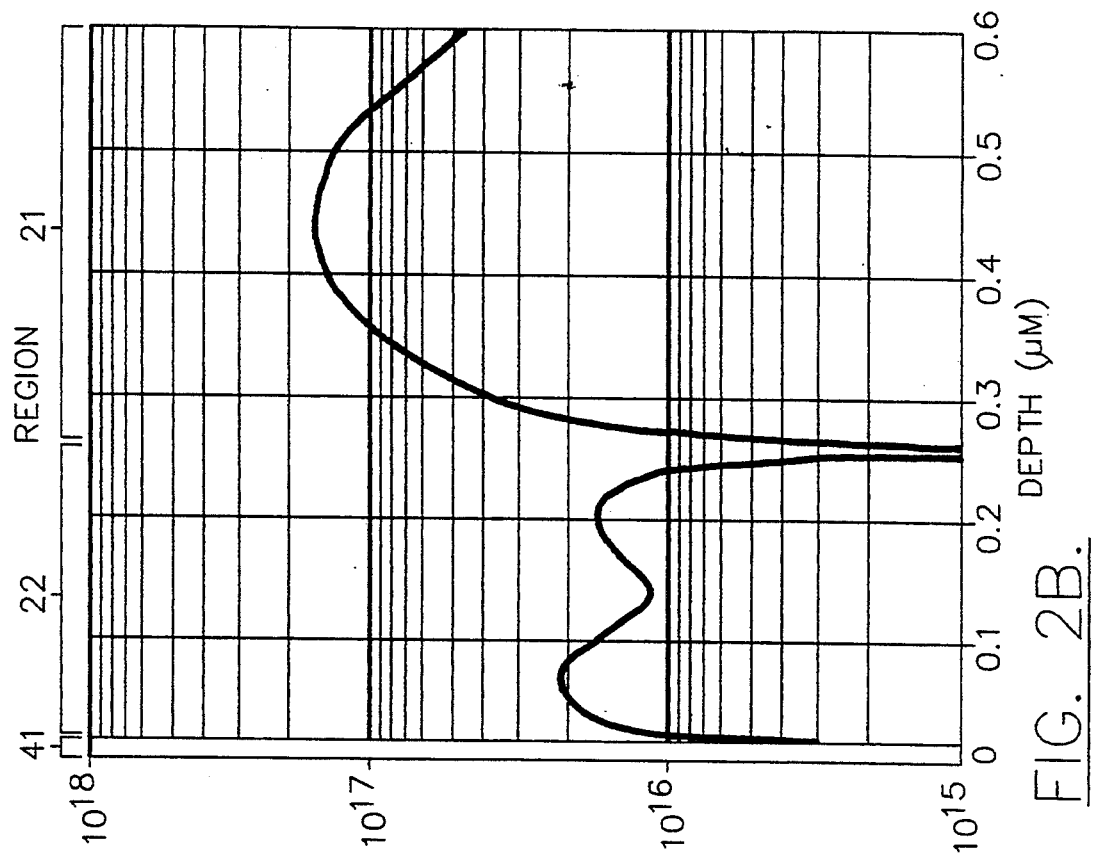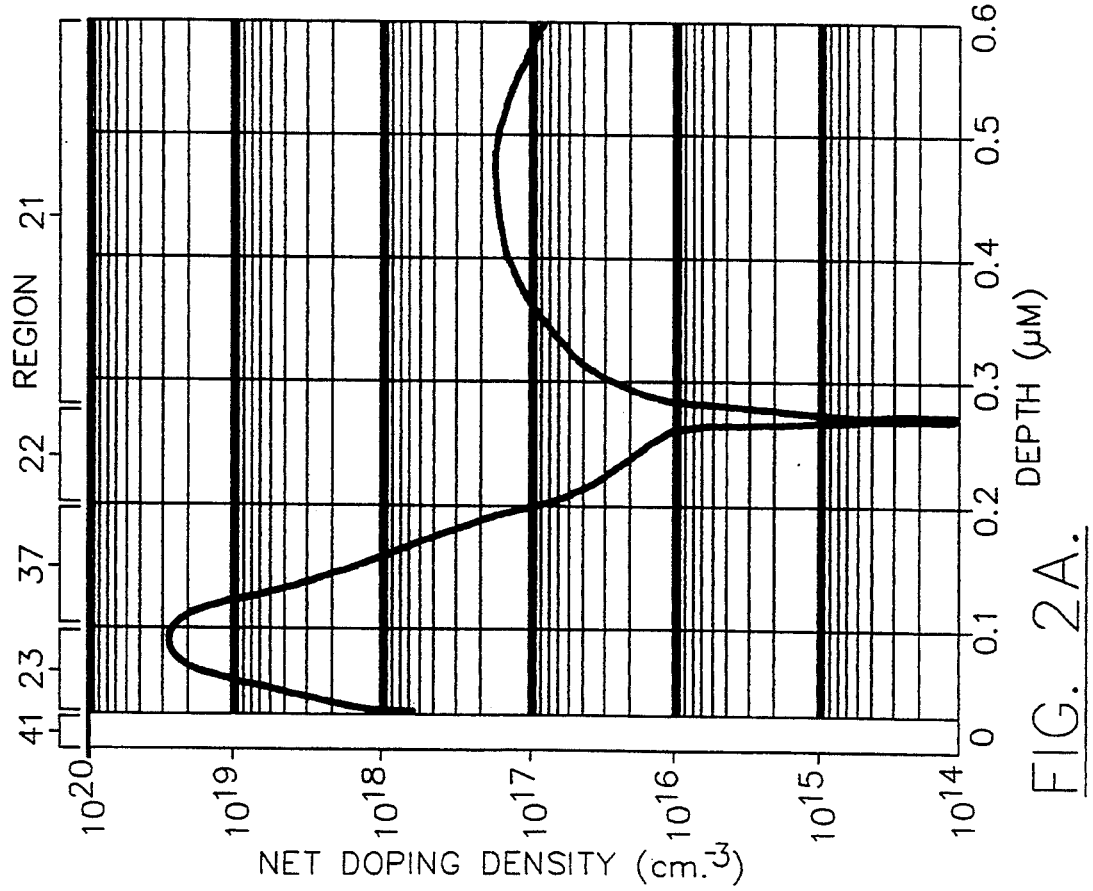

HIGH CURRENT FERMI THRESHOLD FIELD EFFECT TRANSISTOR

CROSS-REFERENCE TO RELATED APPLICATIONS

This application is a continuation-in-part of copending application Ser. No. 07/977,689, filed Nov. 18, 1992, which is itself a continuation of application Ser. No. 07/826,939, filed Jan. 28, 1992, now U.S. Pat. No. 5,194,923. The disclosures of both of these prior applications are hereby incorporated herein by reference.

FIELD OF THE INVENTION

This invention relates to field effect transistor devices and more particularly to integrated circuit field effect transistors which are capable of producing high currents.

BACKGROUND OF THE INVENTION

Field effect transistors (FET) have become the dominant active device for very large scale integration (VLSI) and ultra large scale integration (ULSI) applications, such as logic devices, memory devices and microprocessors, because the integrated circuit FET is by nature a high impedance, high density, low power device. Much research and development activity has focused on improving the speed and integration density of FETs, and on lowering the power consumption thereof.

A high speed, high performance field effect transistor is described in U.S. Pat. Nos. 4,984,043 and 4,990,974, both by coinventor Albert W. Vinal, both entitled *Fermi Threshold Field Effect Transistor* and both assigned to the assignee of the present invention. These patents describe a metal oxide semiconductor field effect transistor (MOSFET) which operates in the enhancement mode without requiring inversion, by setting the device's threshold voltage to twice the Fermi potential of the semiconductor material. As is well known to those having skill in the art, Fermi potential is defined as that potential for which an energy state in a semiconductor material has a probability of one-half of being occupied by an electron. As described in the above mentioned Vinal patents, when the threshold voltage is set to twice the Fermi potential, the dependence of the threshold voltage on oxide thickness, channel length, drain voltage and substrate doping is substantially eliminated. Moreover, when the threshold voltage is set to twice the Fermi potential, the vertical electric field at the substrate face between the oxide and channel is minimized, and is in fact substantially zero. Carrier mobility in the channel is thereby maximized, leading to a high speed device with greatly reduced hot electron effects. Device performance is substantially independent of device dimensions.

Notwithstanding the vast improvement of the Fermi threshold FET compared to known FET devices, there was a need to lower the capacitance of the Fermi-FET device. Accordingly, in U.S. patent application Ser. Nos. 07/826,939 and 07/977,689, both by coinventor Albert W. Vinal, and both entitled *Fermi Threshold Field Effect Transistor With Reduced Gate and Diffusion Capacitance*, a Fermi-FET device is described which allows conduction carriers to flow within the channel at a predetermined depth in the substrate below the gate, without requiring an inversion layer to be created at the surface of the semiconductor in order to support carrier conduction. Accordingly, the average depth of the channel charge requires inclusion of the permittivity of the substrate as part of the gate capacitance. Gate capacitance is thereby substantially reduced.

As described in the aforesaid patent applications, the low capacitance Fermi-FET is preferably implemented using a Fermi-tub region having a predetermined depth and a conductivity type opposite the substrate conductivity type and the same conductivity type as the drain and source. The Fermi-tub extends downward from the substrate surface by a predetermined depth, and the drain and source diffusions are formed in the Fermi-tub within the tub boundaries. The Fermi-tub forms a unijunction transistor, in which the source, drain, channel and Fermi-tub are all doped the same conductivity type, but at different doping concentrations. A low capacitance Fermi-FET is thereby provided. The low capacitance Fermi-FET including the Fermi-tub will be referred to herein as a "low capacitance Fermi-FET" or a "Tub-FET".

Notwithstanding the vast improvement of the Fermi-FET and the low capacitance Fermi-FET compared to known FET devices, there is a continuing need to increase the current per unit channel width, which is produced by the Fermi-FET device. Higher current Fermi-FET devices will allow even greater integration density, and/or much higher speeds for logic devices, memory devices, microprocessors and other integrated circuit devices.

SUMMARY OF THE INVENTION

It is therefore an object of the invention to provide an improved Fermi threshold field effect transistor (Fermi-FET).

It is another object of the invention to provide a Fermi-FET which is capable of producing very high current per unit channel width.

These and other objects are provided, according to the present invention, by a Fermi-FET which includes an injector region of the same conductivity type as the Fermi-tub region and the source region, adjacent the source region and facing the drain region. The injector region is preferably doped at a doping level which is intermediate to the relatively low doping concentration of the Fermi-tub and the relatively high doping concentration of the source. The injector region controls the depth of the carriers injected into the channel and enhances injection of carriers in the channel, at a predetermined depth below the gate.

Preferably, the source injector region is a source injector tub region which surrounds the source region. In other words, the source injector tub region is formed within the Fermi-tub region, and the source is preferably formed within the source injector tub region. Similarly, a drain injector tub region is also formed within the Fermi-tub region and the drain region is preferably formed within the drain injector tub. The source region and drain regions may also extend deeper into the substrate than the respective source injector tub region and drain injector tub region. The source injector tub region and drain injector tub region are of the same conductivity type as the source, drain and Fermi-tub, and are preferably doped at a concentration which is intermediate to that of the Fermi-tub and the source and drain regions.

According to another aspect of the invention, lower pinch-off voltage and increased saturation current are obtained by providing a gate sidewall spacer which extends from adjacent the source injector region to adjacent the gate electrode of the Fermi-FET. The gate sidewall spacer preferably comprises an insulator having permittivity which is greater than the permittivity of the gate insulating layer. For example, in typical field effect transistor devices, where the gate insulator is silicon dioxide, the gate sidewall spacer is preferably silicon nitride. The gate sidewall spacer also preferably extends from adjacent the drain injector region to adjacent the gate electrode. The gate sidewall spacer typically surrounds the gate electrode on the sidewall thereof.

The gate electrode of a Fermi-FET preferably includes a polycrystalline silicon (polysilicon) layer on the gate insulating layer, and a conductor layer such as metal on the polysilicon layer. The polysilicon layer is preferably of opposite conductivity type from the source, drain and tub regions of the Fermi-FET. The gate sidewall spacer extends from the sidewall of the polysilicon layer onto the source and drain injection tubs. The gate sidewall spacer lowers the pinch-off voltage of the device and increases the saturation current of the device.

The source and drain injector regions may be used in the Tub-FET structure to provide a high current Fermi-FET device. The source and drain injector regions are preferably used in combination with the gate sidewall spacer to provide a high current device with low pinch-off voltage.

When short channel FETs, for example FETs with channel length of about 0.5 μm or less, are fabricated, bottom leakage current increases as a result of the drain field terminating in the source depletion region, to cause drain induced injection. According to another aspect of the invention, bottom leakage current is reduced by extending the source and drain injector regions to the depth of the Fermi-tub. Alternatively, a bottom leakage control region of the same conductivity type as the substrate may be provided.

The bottom leakage control region is doped at a high concentration relative to the substrate and extends across the substrate from between an extension of the facing ends of the source and drain regions or source and drain injector regions, and extends to both sides of the Fermi-tub/substrate junction. High current, short channel devices with low pinch-off voltage and low leakage current are thereby provided.

It will be understood by those having skill in the art that the bottom leakage control region or extended injector regions may also be used in Tub-FETs having channel length which is greater than about 0.5 μm. The bottom leakage current control region can also be used in a Tub-FET which does not include injector regions.

BRIEF DESCRIPTION OF THE DRAWINGS

FIGS. 2A-2C graphically illustrate preferred doping profiles and geometries for the high current Fermi-FET of FIG. 1 having a 0.8 μm channel.

DETAILED DESCRIPTION OF PREFERRED EMBODIMENTS

Figure 1:
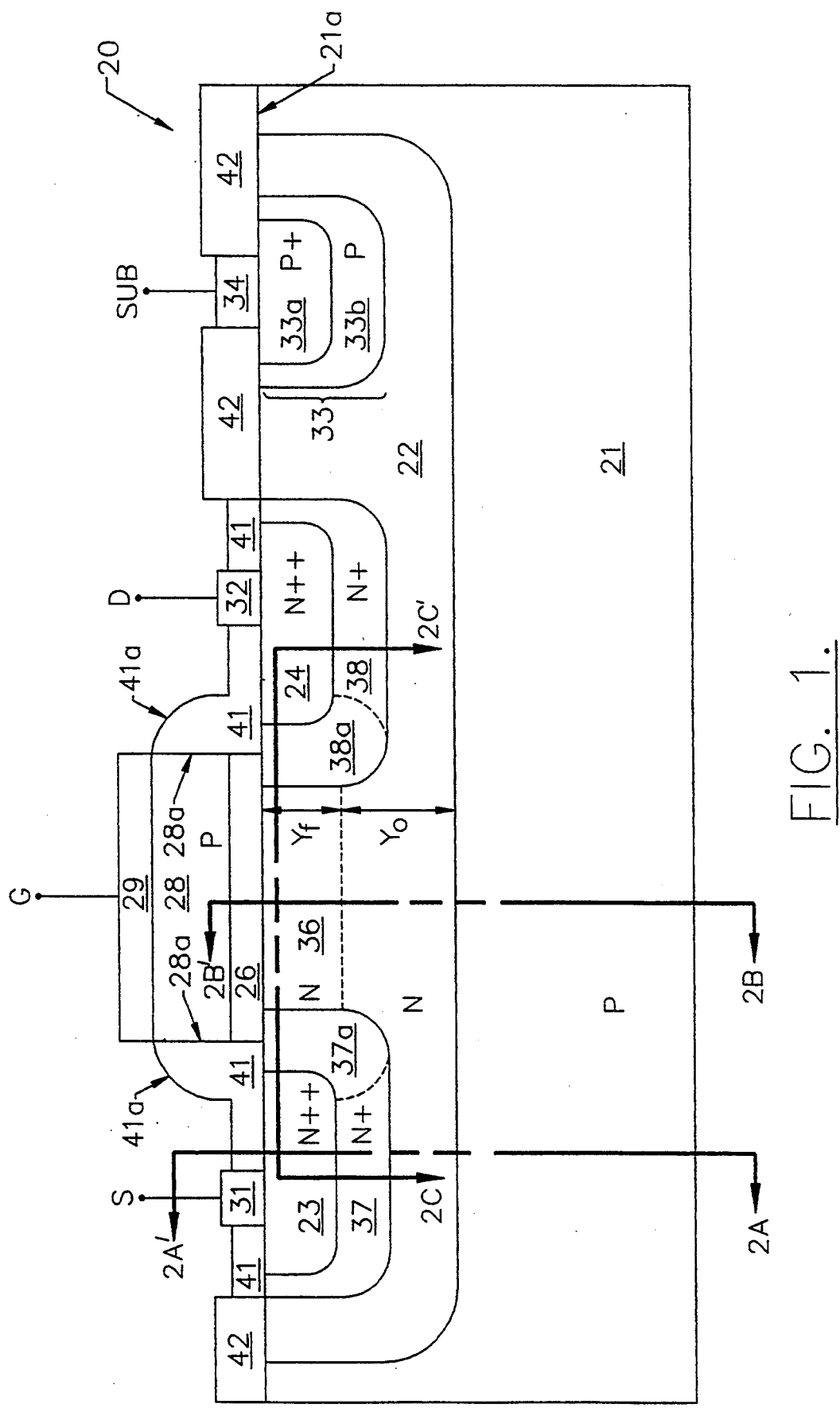
FIG. 1 illustrates a cross-sectional view of an N-channel high current Fermi-FET according to the invention.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

Before describing the high current Fermi threshold field effect transistor of the present invention, the Fermi threshold field effect transistor with reduced gate and diffusion capacitance of application Ser. Nos. 07/826,939 and 07/977,689 (also referenced as the "low capacitance Fermi-FET" or the "Tub-FET") will first be described. A more complete description may be found in these applications, the disclosures of which are hereby incorporated herein by reference. After describing the low capacitance Fermi-FET, the high current Fermi-FET of the present invention will be described as will the low leakage current short channel Fermi-FET.

Fermi-FET With Reduced Gate and Diffusion Capacitance

The following summarizes the low capacitance Fermi-FET including the Fermi-tub. Additional details may be found in application Ser. Nos. 07/826,939 and 07/977,689.

Conventional MOSFET devices require an inversion layer to be created at the surface of the semiconductor in order to support carrier conduction. The depth of the inversion layer is typically 100 Å or less. Under these circumstances gate capacitance is essentially the permittivity of the gate insulator layer divided by its thickness. In other words, the channel charge is so close to the surface that effects of the dielectric properties of the substrate are insignificant in determining gate capacitance.

Gate capacitance can be lowered if conduction carriers are confined within a channel region below the gate, where the average depth of the channel charge requires inclusion of the permittivity of the substrate to calculate gate capacitance. In general, the gate capacitance of the low capacitance Fermi-FET is described by the following equation:

$$C_g = \frac{1}{\frac{Y_f}{\beta e_s} + \frac{T_{ox}}{e_i}} \quad (1)$$

Where $Y_f$ is the depth of the conduction channel called the Fermi channel, $e_s$ is the permittivity of the substrate, and $\beta$ is the factor that determines the average depth of the charge flowing within the Fermi channel below the surface. $\beta$ depends on the depth dependant profile of carriers injected from the source into the channel. For the low capacitance Fermi-FET, $\beta \approx 2$. $T_{ox}$ is the thickness of the gate oxide layer and $e_i$ is its permittivity.

The low capacitance Fermi-FET includes a Fermi-tub region of predetermined depth, having conductivity type opposite the substrate conductivity type and the same conductivity type as the drain and source regions. The Fermi-tub extends downward from the substrate surface by a predetermined depth, and the drain and source diffusions are formed in the Fermi-tub region within the Fermi-tub boundaries. The preferred Fermi-tub depth is the sum of the Fermi channel depth $Y_f$ and depletion depth $Y_o$. A Fermi channel region with predetermined depth $Y_f$ and width Z, extends between the source and drain diffusions. The conductivity of the Fermi channel is controlled by the voltage applied to the gate electrode.

The gate capacitance is primarily determined by the depth of the Fermi channel and the carrier distribution in the Fermi channel, and is relatively independent of the thickness of the gate oxide layer. The diffusion capacitance is inversely dependant on the difference between [the sum of the depth of the Fermi-tub and the depletion depth $Y_o$ in the substrate] and the depth of the diffusions $X_d$. The diffusion depth is preferably the same depth as the Fermi channel. For deeper configurations, diffusion depth is less than the depth of the Fermi-tub, $Y_{Tub}$. The dopant concentration for the Fermi-tub region is preferably chosen to allow the depth of the Fermi channel to be greater than three times the depth of an inversion layer within a MOSFET.

Accordingly, the low capacitance Fermi-FET includes a semiconductor substrate of first conductivity type having a first surface, a Fermi-tub region of second conductivity type in the substrate at the first surface, spaced apart source and drain regions of the second conductivity type in the Fermi-tub region at the first surface, and a channel of the second conductivity type in the Fermi-tub region at the first surface between the spaced apart source and drain regions. The channel extends a first predetermined depth ($Y_f$) from the first surface and the tub extends a second predetermined depth ($Y_o$) from the channel. A gate insulating layer is provided on the substrate at the first surface between the spaced apart source and drain regions. Source, drain and gate electrodes are provided for electrically contacting the source and drain regions and the gate insulating layer respectively.

At least the first and second predetermined depths are selected to produce zero static electric field perpendicular to the first surface at the first depth, upon application of the threshold voltage of the field effect transistor to the gate electrode. The first and second predetermined depths are also selected to allow carriers of the second conductivity type to flow from the source to the drain in the channel, extending from the first predetermined depth toward the first surface upon application of the voltage to the gate electrode beyond the threshold voltage of the field effect transistor. The carriers flow from the source to the drain region beneath the first surface without creating an inversion layer in the Fermi-tub region. The first and second predetermined depths are also selected to produce a voltage at the substrate surface, adjacent the gate insulating layer, which is equal and opposite to the sum of the voltages between the substrate contact and the substrate and between the polysilicon gate electrode and the gate electrode.

When the substrate is doped at a doping density $N_s$, has an intrinsic carrier concentration $N_i$ at temperature T degrees Kelvin and a permittivity $e_s$, and the field effect transistor includes a substrate contact for electrically contacting the substrate, and the channel extends a first predetermined depth $Y_f$ from the surface of the substrate and the Fermi-tub region extends a second predetermined depth $Y_o$ from the channel, and the Fermi-tub region is doped at a doping density which is a factor $\alpha$ times $N_s$, and the gate electrode includes a polysilicon layer of the first conductivity type and which is doped at a doping density $N_p$, the first predetermined depth $(Y_f)$ is equal to:

$$Y_f = \sqrt{\frac{2e_s}{qN_s\alpha} \frac{KT}{q} \ln\left(\frac{N_p}{N_s}\right)}, \quad (2)$$

where q is $1.6 \times 10^{-19}$ coulombs and K is $1.38 \times 10^{-23}$ joules/°Kelvin. The second predetermined depth $(Y_o)$ is equal to:

$$Y_o = \sqrt{\frac{2e_s\phi_s}{qN_s\alpha(\alpha+1)}}, \quad (3)$$

where $\phi_s$ is equal to $2\phi_f + KT/q \ln\alpha$, and $\phi_f$ is the Fermi potential of the semiconductor substrate.

High Current Fermi-FET Structure

Referring now to FIG. 1, an N-channel high current Fermi-FET according to the invention is illustrated. It will be understood by those having skill in the art that a P-channel Fermi-FET may be obtained by reversing the conductivities of the N and P regions.

As illustrated in FIG. 1, high current Fermi-FET 20 is fabricated in a semiconductor substrate 21 having first conductivity type, here P-type, and including a substrate surface 21a. A Fermi-tub region 22 of second conductivity type, here N-type, is formed in the substrate 21 at the surface 21a. Spaced apart source and drain regions 23 and 24, respectively, of the second conductivity type, here N-type, are formed in the Fermi-tub region 22 at the surface 21a. It will be understood by those having skill in the art that the source and drain regions may also be formed in a trench in the surface 21a.

A gate insulating layer 26 is formed on the substrate 21 at the surface 21a between the spaced apart source and drain regions 23 and 24, respectively. As is well known to those having skill in the art, the gate insulating layer is typically silicon dioxide. However, silicon nitride and other insulators may be used.

A gate electrode is formed on gate insulating layer 26, opposite the substrate 21. The gate electrode preferably includes a polycrystalline silicon (polysilicon) gate electrode layer 28 of first conductivity type, here P-type. A conductor gate electrode layer, typically a metal gate electrode layer 29, is formed on polysilicon gate electrode 28 opposite gate insulating layer 26. Source electrode 31 and drain electrode 32, typically metal, are also formed on source region 23 and drain region 24, respectively.

A substrate contact 33 of first conductivity type, here P-type, is also formed in substrate 21, either inside Fermi-tub 22 as shown or outside tub 22. As shown, substrate contact 33 is doped first conductivity type, here P-type, and may include a relatively heavily doped region 33a and a relatively lightly doped region 33b. A substrate electrode 34 establishes electrical contact to the substrate.

The structure heretofore described with respect to FIG. 1 corresponds to the low capacitance Fermi-FET structure of application Ser. Nos. 07/977,689 and 07/826,939. As already described in these applications, a channel 36 is created between the source and drain regions 23 and 24. The depth of the channel from the surface 21a, designated at $Y_f$ in FIG. 1, and the depth from the bottom of the channel to the bottom of the Fermi-tub 22, designated as $Y_0$ in FIG. 1, along with the doping levels of the substrate 21, tub region 22, and polysilicon gate electrode 28 are selected to provide a high performance, low capacitance field effect transistor using the relationships of Equations (2) and (3) above.

Still referring to FIG. 1, according to the present invention, a source injector region 37a of second conductivity type, here N-type, is provided adjacent the source region 23 and facing the drain region. As will be described below, the source injector region provides a high current, Fermi-FET by controlling the depth at which carriers are injected into channel 36. The source injector region 37a may only extend between the source region 23 and the drain region 24. The source injector region preferably surrounds source region 23 to form a source injector tub region 37, as illustrated in FIG. 1. Source region 23 may be fully surrounded by the source injector tub region 37, on the side and bottom surface. Alternatively, source region 23 may be surrounded by the source injector tub region 37 on the side, but may protrude through the source injector tub region 37 at the bottom. Still alternatively, source injector region 37a may extend into substrate 21, to the junction between Fermi-tub 22 and substrate 21. A drain injector region 38a, preferably a drain injector tub region 38 surrounding drain region 24, is also preferably provided.

Source injector region 37a and drain injector region 38a or source injector tub region 37 and drain injector tub region 38, are preferably doped the second conductivity type, here N-type, at a doping level which is intermediate the relatively low doping level of Fermi-tub 22 and the relatively high doping level of source 23 and drain 24. Accordingly, as illustrated in FIG. 1, Fermi-tub 22 is designated as being N, source and drain injector tub regions 37, 38 are designated as N+ and source and drain regions 23, 24 are designated as N++. A unijunction transistor is thereby formed.

The high current Fermi-FET of the present invention provides drive currents that are about four times that of state of the art FETs. Gate capacitance is about half that of a conventional FET device. The doping concentration of the source injector tub region 37 controls the depth of carriers injected into the channel region 36, typically to about 1000 Å. The source injector tub region 37 doping concentration is typically 2E18, and preferably has a depth at least as great as the desired maximum depth of injected majority carriers. Alternatively, it may extend as deep as the Fermi-tub region 22 to minimize subthreshold leakage current, as will be described below. It will be shown that the carrier concentration injected into the channel 36 cannot exceed the doping concentration of the source injector region 37a facing the drain. The width of the portion of source injector region 37a facing the drain is typically in the range of 0.050–15 μm. The doping concentration of the source and drain regions 23 and 24 respectively, is typically 1E19 or greater. The depth ($Y_f+Y_0$) of the Fermi-tub 22 is approximately 2200 Å with a doping concentration of approximately 1.8E16.

As illustrated in FIG. 1, the high current Fermi-FET 20 also includes a gate sidewall spacer 41 on the substrate surface 21a, which extends from adjacent the source injector region 37a to adjacent the polysilicon gate electrode 28. Gate sidewall spacer 41 also preferably extends from adjacent the drain injector region 38a to adjacent the polysilicon gate electrode 28. In particular, as shown in FIG. 1, gate sidewall spacer 41 extends from the polysilicon gate electrode sidewall 28a and overlies the source and drain injector regions 37a and 38a respectively. Preferably the gate sidewall spacer 41 surrounds the polysilicon gate electrode 28. Also preferably, and as will be discussed in detail below, the gate insulating layer 26 extends onto the source injector region 37a and the drain injector region 38a at the substrate face 21a and the gate sidewall spacer 41 also extends onto the source injector region 37 and drain injector region 38.

The gate sidewall spacer 41 lowers the pinch-off voltage of the Fermi-FET 20 and increases its saturation current in a manner in which will be described in detail below. Preferably, the gate sidewall spacer is an insulator having a permittivity which is greater than the permittivity of the gate insulating layer 26. Thus, for example, if the gate insulating layer 26 is silicon dioxide, the gate sidewall spacer is preferably silicon nitride. If the gate insulating layer 26 is silicon nitride, the gate sidewall spacer is preferably an insulator which has permittivity greater than silicon nitride.

As shown in FIG. 1, the gate sidewall spacer 41 may also extend onto source and drain regions 23 and 24 respectively, and the source and drain electrodes 31 and 32 respectively may be formed in the extension of the gate sidewall spacer region. Conventional field oxide or other insulator 42 regions separate the source, drain and substrate contacts. It will also be understood by those having skill in the art that although the outer surface 41a of gate sidewall spacer 41 is illustrated as being curved in cross section, other shapes may be used, such as a linear outer surface to produce a triangular cross section or orthogonal outer surfaces to produce a rectangular cross section.

Design of 0.8 μm High Current Fermi-FET

Figure 2C:
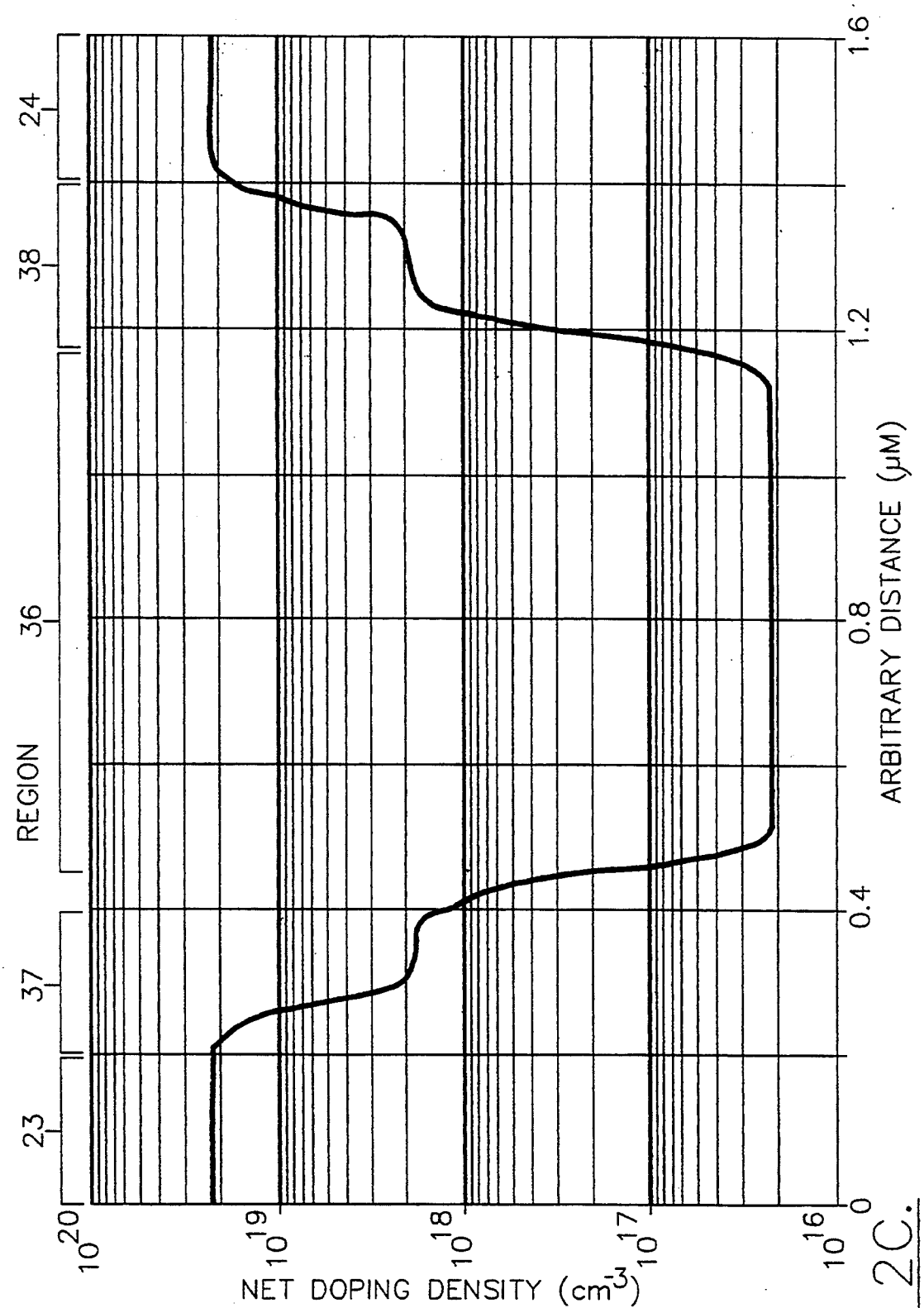

Referring now to FIGS. 2A–2C, preferred doping profiles and geometries for designing a 0.8 μm channel high current Fermi-FET as illustrated in FIG. 1 will now be described. It will be understood by those having skill in the art that both N and P channel FETs are fabricated in a similar fashion. FIGS. 2A–2C are simulation results which graphically illustrate N-channel high current Fermi-FET doping profiles to produce a 0.8 μm channel length device leading to the drain current properties illustrated in FIGS. 5B and 5C. It is well known to those having skill in the art how to achieve these doping profiles, using many well known techniques.

In the examples of FIGS. 2A–2C, the P-type doping concentration of the polysilicon gate electrode 28 is 2E19 for either P- or N-channel FETs. The SiO$_2$ gate insulating layer 26 is 140 Å thick. The thickness of the polysilicon gate electrode 28 is 3000 Å. The height of the gate sidewall spacer 41 is also 3000 Å, and the gate sidewall spacer 41 is fabricated of silicon nitride. The width of the source injector tub region portion 37a facing the drain is about 0.1 μm and the gate insulating layer 26 overlaps this region by about 0.05 μm.

Referring now to FIG. 2A, a vertical doping profile along the line 2A—2A' of FIG. 1, perpendicular to the face 21a and centered about the source 23 is described. The region to which the profile applies is also labeled at the top of the horizontal axis of FIG. 2A. As shown, the gate sidewall spacer region 41 has a thickness of about 140 Å and the source region 23 has a depth of about 2000 Å from the face 21a. Source injector tub region 37 has a depth of about 2000 Å from face 21a and Fermi-tub 22 has a depth ($Y_f+Y_0$) of 2200 Å from the face 21a. The thickness of substrate 21 is about 1 μm. The source injector tub 37 doping concentration is about 2E18 and the source region 23 doping is about 2.5E19.

FIG. 2B is a doping profile taken along line 2B—2B' in FIG. 1. As shown in FIG. 2B, the Fermi-tub 22 has been implanted using a double implantation process which produces a double hump. However, it will be understood by those having skill in the art that multiple implants or other techniques may be used to produce a more uniform doping profile for the Fermi-tub if desired. The Fermi-tub 22 depth is shown to be about 2200 Å with an average concentration in the flat region of 1.8E16. The effective humpback substrate doping concentration is about 1E17.

FIG. 2C illustrates a doping profile along lines 2C—2C' of FIG. 1. In other words, it is a doping profile from the middle of source region 23 through source injector region 37a through channel 36 and through drain injector region 38a and to the middle of drain 24. These regions are denoted in the FIG. 2C as well.

Operation of the Injector and Gate Sidewall Spacer Regions

Figure 3:
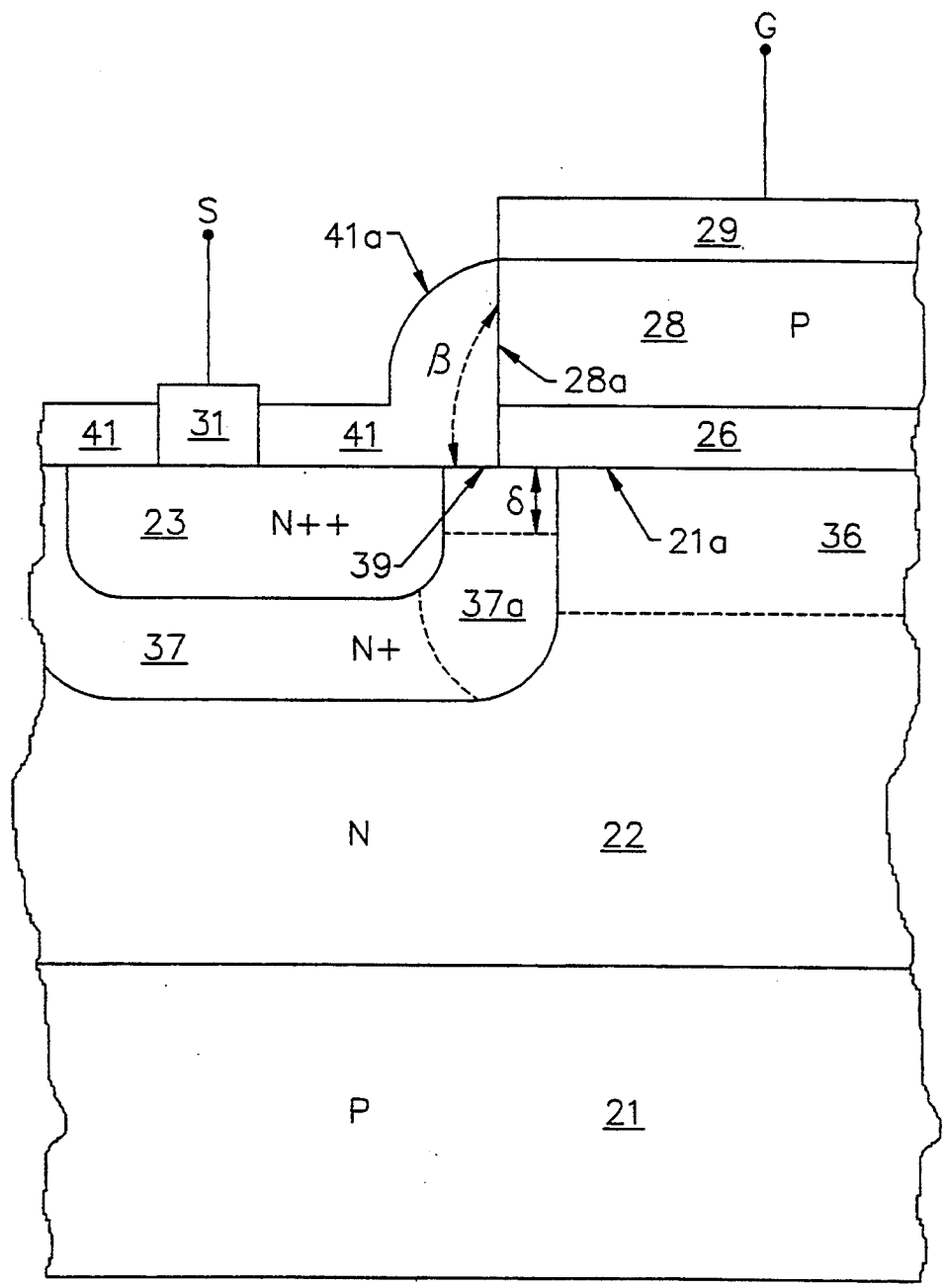
FIG. 3 illustrates an enlarged cross-sectional view of a portion of the high current Fermi-FET of FIG. 1.

Referring now to FIG. 3, an enlarged cross section of the area between source 23 and polysilicon gate electrode 28 is illustrated, in order to explain the operation of source injector region 37a and gate sidewall spacer region 41. When gate voltage exceeds source voltage, an electric field $E_{ii}$ terminates at interface 39 between the injector region 37a and the spacer 41. This field $E_{ii}$ is produced by the potential difference between the polysilicon gate electrode 28 and the surface of the injector region 37a at interface 39. This electric field creates charge accumulation within depth δ at the surface of the injector 37a, as illustrated in FIG. 3. From boundary conditions at the injector-insulator interface 39 and use of the divergence theorem, the following conditions prevail:

$$e_s E_s = e_{ii} E_{iin} \qquad (4)$$

where $e_s$ is the permittivity of the substrate 21, $E_s$ is the electric field in injector 37a at interface 39, $e_{ii}$ is the permittivity of the spacer region 41 and $E_{iin}$ is the electric field in spacer region 41 at the interface 39.

Therefore, the electric field at the surface of the silicon $E_s$ is expressed in terms of the different permittivities at the interface and the electric field in the injector insulator, $E_{iin}$:

$$E_s = \frac{e_{ii}}{e_s} E_{iin} \qquad (5)$$

When the source 23 is at ground potential and the polysilicon gate electrode 28 is at gate voltage $V_g$ above ground (N-channel), the injector insulator field $E_{iin}$ is expressed as the difference between gate and injector surface potential $\phi_s$ divided by the effective spacer region insulator thickness $\beta T_{in}$, where $V_t$ is the threshold voltage:

$$E_{iin} = \frac{(V_g - V_t) - \phi_s}{\beta T_{iin}} \tag{6}$$

Fringe field factor $\beta$ is generally greater than one and is due to the length of the fringe field path from the sidewall 28a of the polysilicon gate electrode 28 and the interface 39, as illustrated in FIG. 3. For long channel devices B approaches 1.0. For short channel devices $\beta > 1.0$. The difference is due to the depth of the charge accumulation layer in the polysilicon gate electrode layer 28 above the insulator interface. For short channel devices this depth increases tending to increase fringe factor $\beta$.

The gate sidewall spacer 41 may be the same material as the gate insulating layer 26. However in general the permittivity $e_{ii}$ of the sidewall spacer 41 should be higher than the permittivity $e_{gi}$ of the gate insulating layer 26. Preferably the ratio $e_{ii}/e_{gi}$ should be at least equal to fringe factor $\beta$. If $\beta=1$, the increased permittivity acts to lower subthreshold leakage current. A good choice of materials is silicon dioxide (SiO$_2$) for the gate insulator 26 and silicon nitride (Si$_3$N$_4$) for the gate sidewall spacer 41.

Based on Equations (5) and (6) the surface electric field $E_s$ is:

$$E_s = \frac{e_{ii}}{e_s} \left( \frac{(V_g - V_t) - \phi_s}{\beta T_{in}} \right) = \frac{q}{e_s} \int_0^\delta N_{ac}(y)dy \tag{7}$$

where $\delta$ is the depth of the accumulation region, q is the electron charge, and $N_{ac}(y)$ is the depth dependent concentration of the accumulation charge at the surface of the injector.

Since Fermi-FET conduction depends on accumulation rather than inversion, a similar expression can be written for the equivalent total accumulation of majority carriers under the gate electrode with low drain voltage. The actual flow depth $\delta$ of this charge is controlled by the injection profile. The expression is:

$$E_{si} = \frac{e_{ii}}{e_s} \left( \frac{(V_g - V_t) - \phi_s}{T_{gin}} \right) = \frac{q}{e_s} \int_0^\delta N_{gac}(y)dy \tag{8}$$

A fundamental relationship between surface potential $\phi_s$ and surface field $E_s$ will now be derived. The total charge in the channel region 36 when drain voltage is close to zero, is:

$$Q = ZL_o q \int_0^\delta N_{ch}(y)dy \tag{9}$$

Where $N_{ch}(y)$ is the volume density of channel charge measured in the vertical direction, and $\delta$ is the depth of flow charge at the source end of the channel. Using the divergence theorem, the vertical electrical field intensity $E_s$ in silicon at the insulator-silicon interface 39 at the source end of the channel is:

$$E_s = \frac{q}{e_s} \int_0^\delta N_{ch}(y)dy \tag{10}$$

Comparing Equations (9) and (10), surface field $E_s$ is independent of charge distribution within the depth direction of the channel and only depends on total charge per unit gate area Q*. Thus:

$$E_s = \frac{Q}{ZL_o e_s} = \frac{Q^*}{e_s} \tag{11}$$

The surface potential at the source end of the channel due to this same channel charge distribution is now determined. Using Poisson's equation, surface potential $\phi_s$ under the injector insulator at the source end of the channel is:

$$\phi_s = \frac{q}{e_s} \int_0^\delta \int_0^y N_{ch}(y)dydy \tag{12}$$

It will be shown subsequently that gate induced injection of excess charge into a Fermi channel region at the source—channel interface is quite uniform in flow depth depending on the character of the source injector region 37a. This is discussed in detail in Appendix B. Under these circumstances it is reasonable to assume $N_{ch}(y) = N_{do}$ within flow depth $\delta$. For this condition Equation (12) reduces to:

$$\phi_s = \frac{\delta(q\delta N_{do})}{2e_s} \tag{13}$$

Therefore, from Equation (9), the condition, $N_{ch}(y) = N_{do}$, leads to the following fundamental relationship between surface potential $\phi_s$ and surface field $E_s$:

$$\phi_s = \frac{\delta}{2} E_s \tag{14}$$

Stated in words, surface potential near the source end of the channel is the product of half the flow channel depth $\delta$ and surface field $E_s$.

Equation (14) is substituted into Equation (8) and solved for surface field $E_s$ to obtain:

$$\frac{V_g - V_t}{e_s \left( \frac{T_{gin}}{e_{gin}} + \frac{\delta}{2e_s} \right)} = \frac{q}{e_s} \int_0^\delta N_{ac}(y)dy \tag{15}$$

Factor $\delta$ in (15) corresponds to effective flow depth of carriers in the Tub-FET channel, as shown in FIG. 3. Since effective gate capacitance $C^*_g$, F/cm$^2$ is given by:

$$C_g^* = \frac{1}{\left( \frac{T_{gin}}{e_{gin}} + \frac{\delta}{2e_s} \right)} \tag{16}$$

Equation (15) can be used to predict drain saturation current and its dependence on structure:

$$I_{sat} = ZVq \int_0^\delta N_{gac}(y)dy = C_g^* ZV(V_g - V_t) \quad (17)$$

Stated in words, saturation current depends on the product of effective gate capacitance $C_g^*$, channel width Z, carrier velocity V, and gate drive voltage $V_g - V_t$. Channel length $L_0$ does not appear directly in Equation (17). To reveal the role of channel length, an expression for carrier velocity V in Equation (17) is developed. Equation (17) is rewritten in terms of the product of carrier mobility $\mu$ and lateral field $E_1$:

$$I_{satn} = C_g^* ZV(V_g - V_t) = C_g^* Z\mu_n E_1(V_g - V_t) \quad (18)$$

For electrons:

$$\mu_n = \frac{\mu_{no}}{\sqrt{1 + \left(\frac{E_1}{E_c}\right)^2}} \quad (19a)$$

$$E_1 = \frac{V_p}{L} = \frac{V_g - V_t}{2L_o} \quad (19b)$$

$$E_c = \frac{V_{sat}}{\mu_{no}} \quad (19c)$$

$$\frac{E_1}{E_c} = \frac{(V_g - V_t)\mu_{no}}{2L_o V_{sat}} \quad (19d)$$

Substituting Equations (19a)–(19d) into Equation (17) a fundamental solution for drain saturation current is obtained:

$$I_{satn} = \frac{C_g^* Z(V_g - V_t)^2 \mu_{no}}{2L_o \sqrt{1 + \left(\frac{(V_g - V_t)\mu_{no}}{2L_o V_{sat}}\right)^2}} \quad (20)$$

where $C_g^*$ is given by Equation (16).

A similar expression for a P-Channel device is given by:

$$I_{satp} = \frac{C_g^* Z(V_g - V_t)^2 \mu_{no}}{2L_o \left[1 + \frac{(V_g - V_t)\mu_{no}}{2L_o V_{sat}}\right]} \quad (21)$$

For short N-channel devices and large gate drive, saturation current reduces to a simple equation independent of channel length and carrier mobility:

$$I_{sat} = C_g^* Z V_{sat}(V_g - V_T) \quad (22)$$

Accordingly, channel length $L_0$ below about one micron, plays only a minor role in determining drain saturation current of the Fermi-FET. The most fundamental control of saturation current is injector and insulator thickness, their relative permittivities, and effective flow depth $\delta$. The injector tub doping concentration and depth are chosen such that flow depth $\delta$ is adjusted to be greater than 200 Å, as described in Appendix B.

Figure 4A:
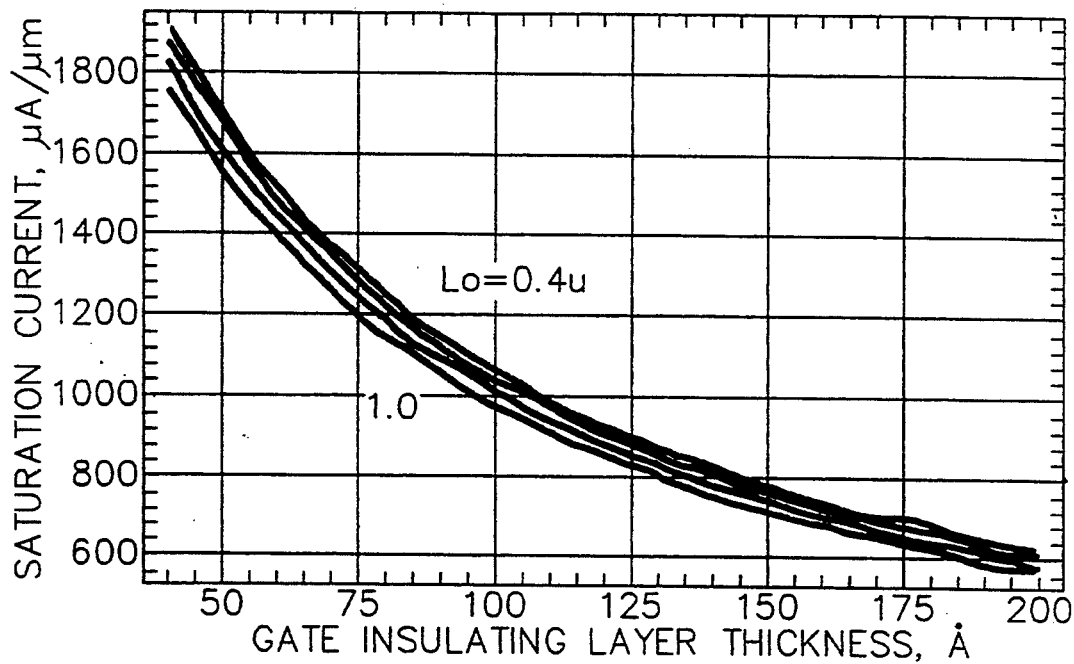
FIGS. 4A and 4B graphically illustrate simulated drain saturation current for N-channel and P-channel Fermi-FETs respectively, as a function of channel length and gate insulating layer thickness.
Figure 4B:
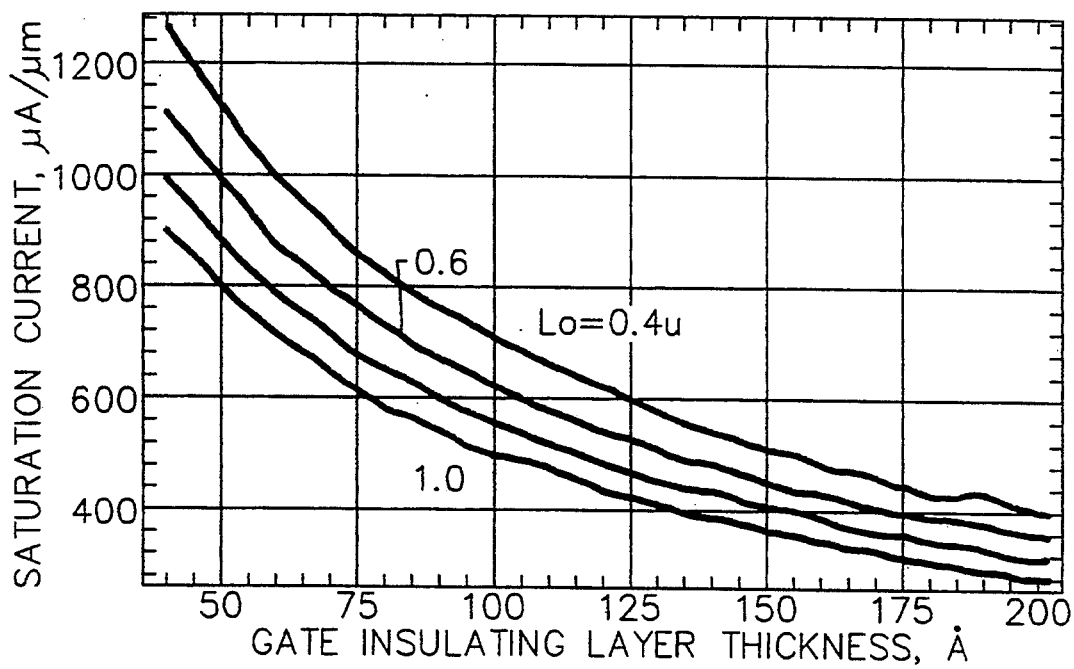
Figure 4C:
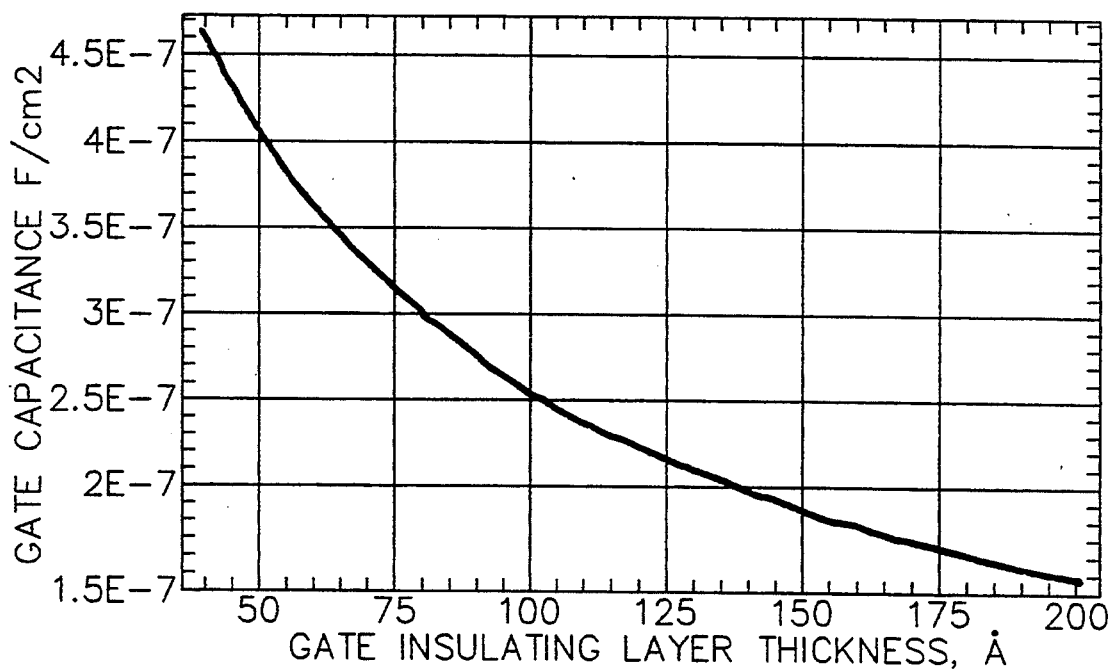
FIG. 4C graphically illustrates simulated gate capacitance versus gate insulating layer thickness for a Fermi-FET.

FIGS. 4A and 4B are plots of simulated drain saturation current for N and P-channel Tub-FET's as a function of channel length $L_0$ and gate insulating layer thickness $T_{gin}$. Note the relative insensitivity to N-channel length compared to insulator thickness. P-channel devices are more sensitive to channel length due to lateral field effects on hole velocity. FIG. 4C is a plot of simulated gate capacitance versus gate insulating layer thickness for $\delta = 200$ Å.

When the following equation is satisfied in the design of a Tub-FET, the lowest pinch-off voltage with maximum saturation current and the least subthreshold bottom current are obtained for a given injector tub depth. This equation relates the permittivity of the injector 37, spacer 41 and gate insulator 26:

$$\frac{e_{ii}}{e_s}\left(\frac{(V_g - V_t)}{\beta T_{iin}}\right) \geq \frac{e_{gi}}{e_s}\left(\frac{(V_g - V_t)}{T_{gin}}\right) \quad (23)$$

From Equation (18) the following is also one of the Tub-FET design considerations:

$$\frac{e_{ii}}{e_{gi}} \geq \frac{\beta T_{iin}}{T_{gin}} \quad (24)$$

If $T_{iin} = T_{gin}$ then $$\frac{e_{ii}}{e_{gi}} \geq \beta \quad (25)$$

For practical high current Fermi-FET designs, one can use silicon nitride ($Si_3N_4$) for the gate sidewall spacer 41 and silicon dioxide ($SiO_2$) for the gate insulator 26. The permittivity of silicon nitride is 7E-13 F/cm, and silicon dioxide is 3.45E-13 F/cm. The ratio is greater than $\beta = 1.5$. It will be shown subsequently that very high drive current Fermi-FET's, 1.6 ma/micron N-channel and 0.8 ma/micron P-channel devices, preferably use a 100 Å silicon nitride gate insulator. Unlike silicon dioxide insulators, silicon nitride insulators have high field strength, 1E7 V/cm, and therefore can be thin while maintaining high gate breakdown voltage while improving insulation integrity with time. For Fermi-FET devices that use a nitride gate insulator, the spacer and injector insulator can be nitride, but an injector and side-wall insulator material with twice the permittivity is preferred. It will also be understood by those having skill in the art that gate sidewall spacer 41 need not extend directly onto face 21a, but that a thin insulating layer, of a material other than that of the sidewall spacer 41, may be formed at interface 39 between injector 37 and sidewall spacer 41.

Figure 5A:
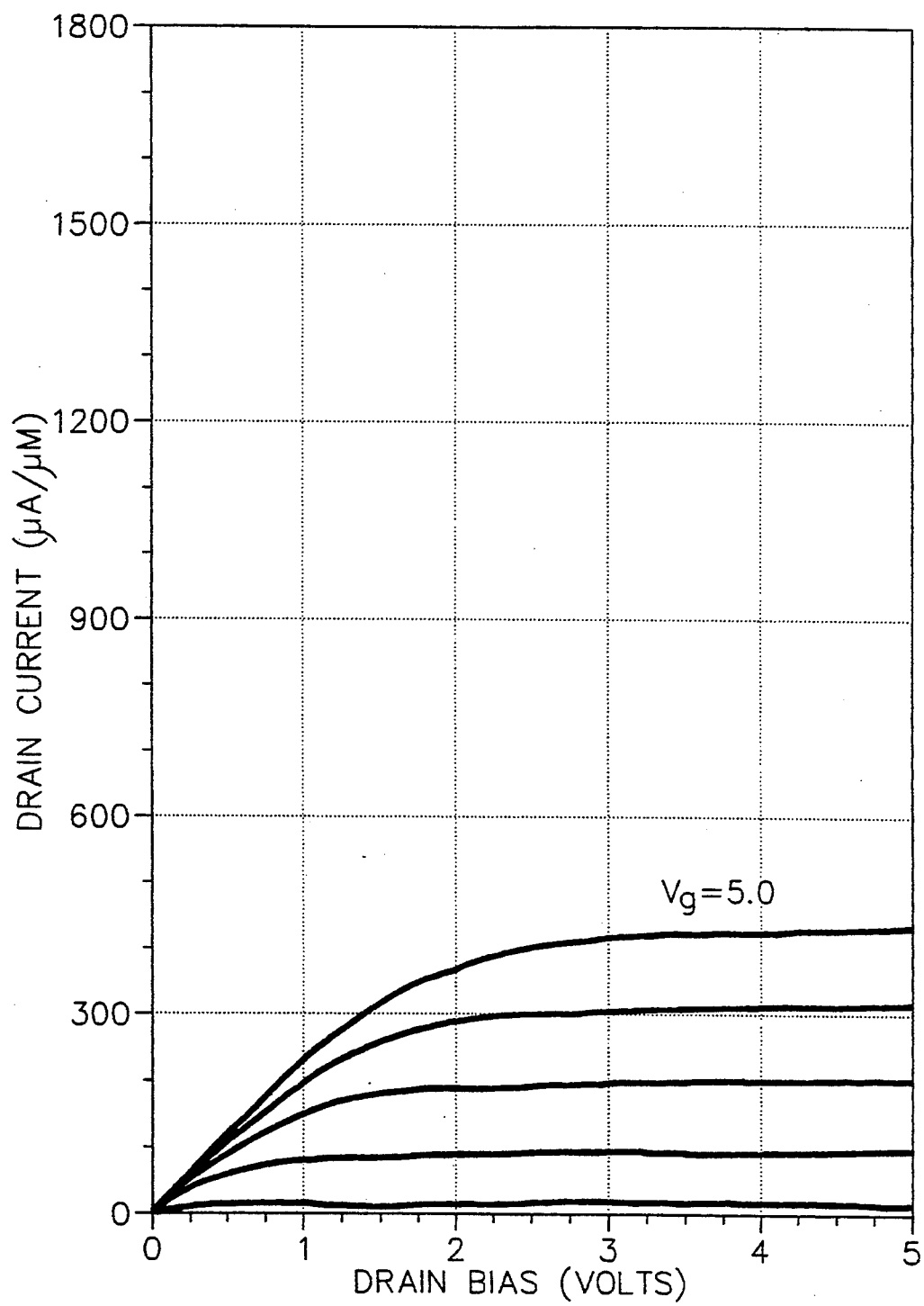
FIG. 5A graphically illustrates simulated transistor drain current characteristics of a conventional 0.8 μm N-channel MOSFET.
Figure 5B:
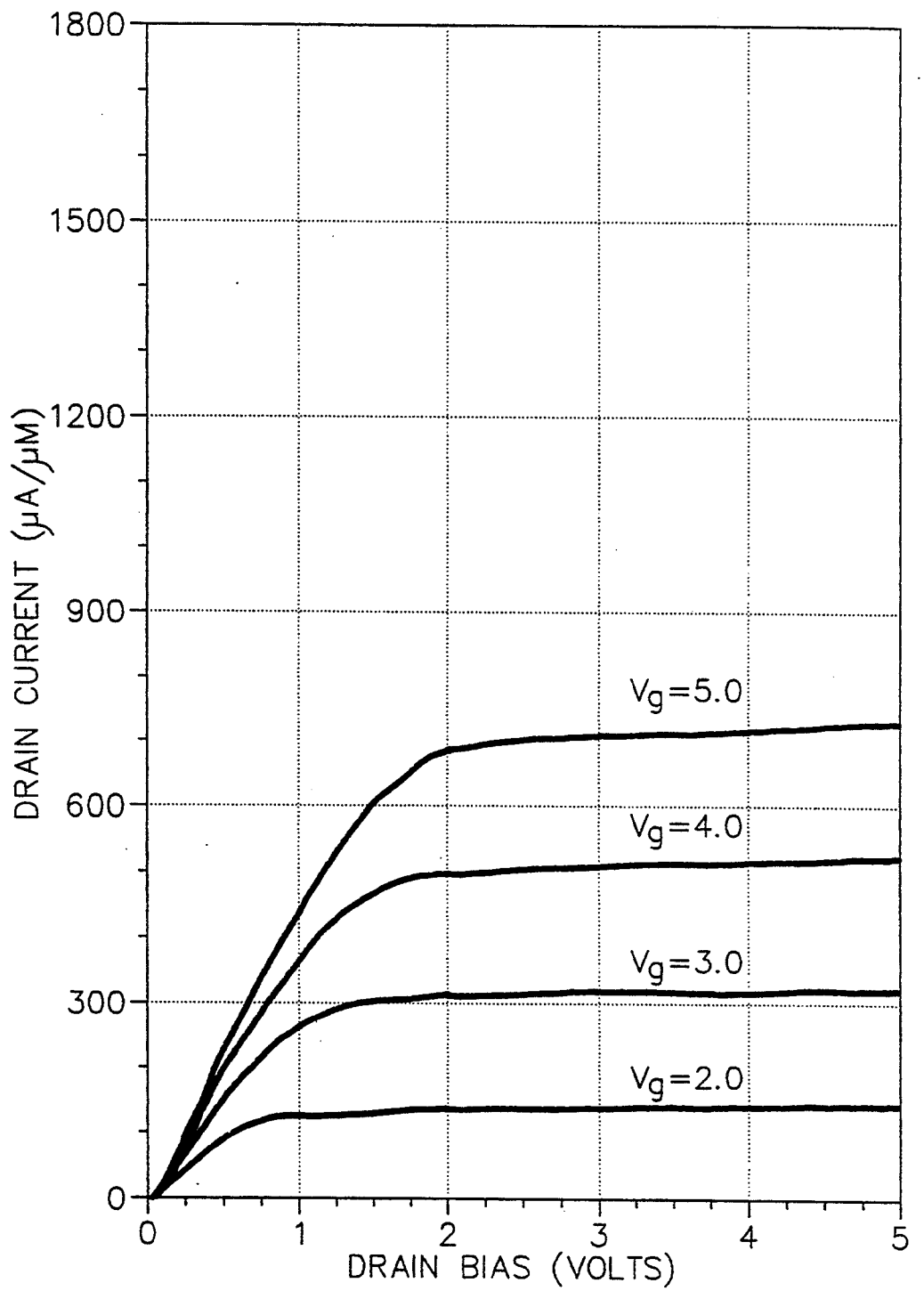
FIGS. 5B and 5C graphically illustrate simulated transistor drain current characteristics of a 0.8 μm N-channel high current Fermi-FET according to the present invention.
Figure 5C:
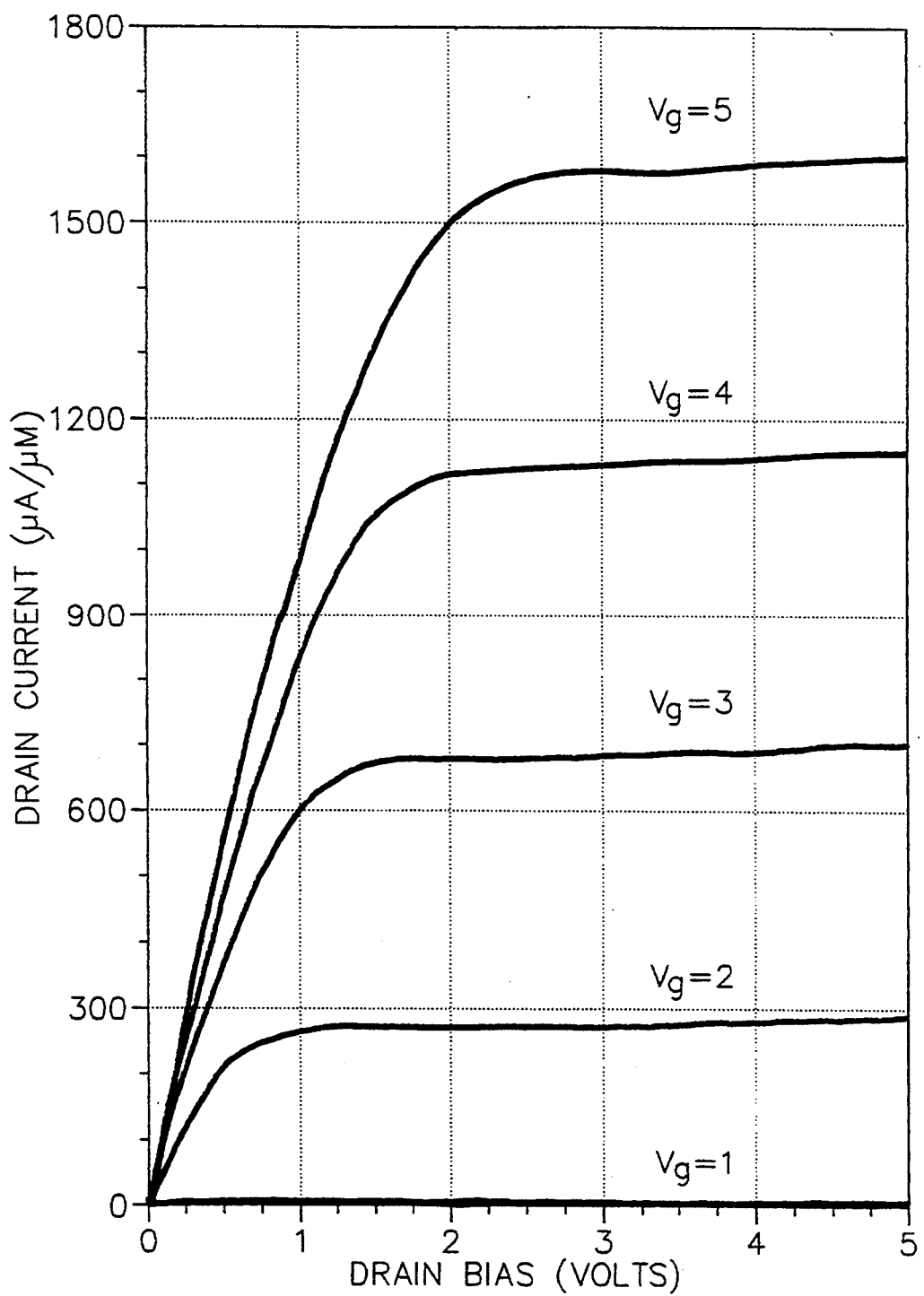

FIGS. 5B and FIG. 5C are simulations of the drain current performance of 0.8 micron N-Channel high current Fermi-FET devices. FIG. 5A is a similar simulation for a state of the art 0.8 micron MOS N-Channel device. FIG. 5A depicts 5 Volt MOS technology with a 150 Å $SiO_2$ gate insulator. FIG. 5B is a simulation of high current Fermi-FET performance with a 140 Å $SiO_2$ gate insulator. FIG. 5C is a simulation of high current Fermi-FET performed with a 100 Å silicon nitride gate insulator. In both cases, the drain current and pinch-off properties of high current Fermi-FET devices are far superior to MOS or buried channel technology. Similar dramatic improvement occurs for P-channel high current Fermi-FET devices compared to MOS or buried channel technology. P-channel saturation current is typically half N-channel saturation current, and pinch-off voltage is about twice the N-channel value.

Figure 6A:
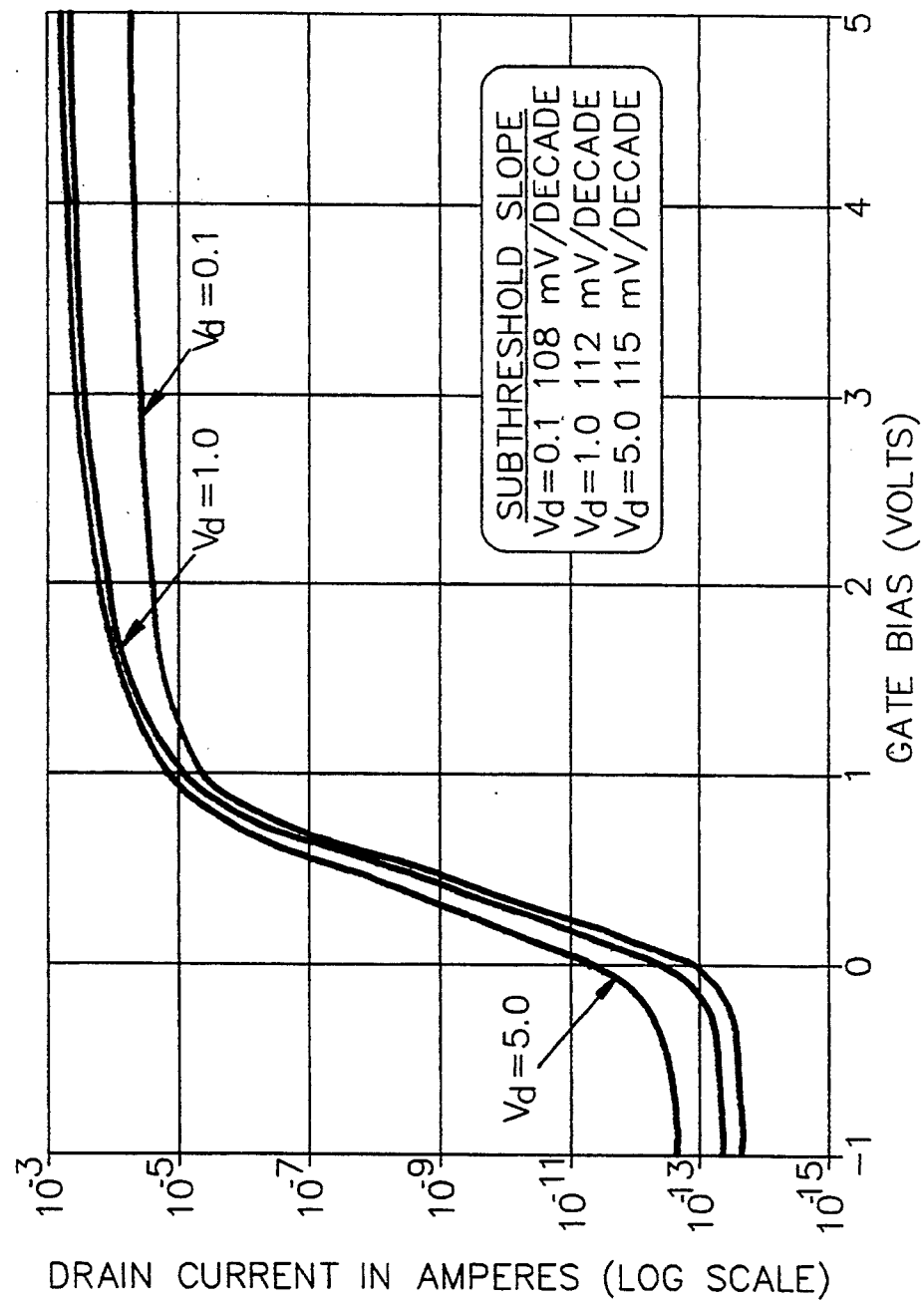
FIGS. 6A and 6B graphically illustrate simulated bottom current and subthreshold leakage behavior for N-channel and P-channel high current Fermi-FETs respectively.
Figure 6B:
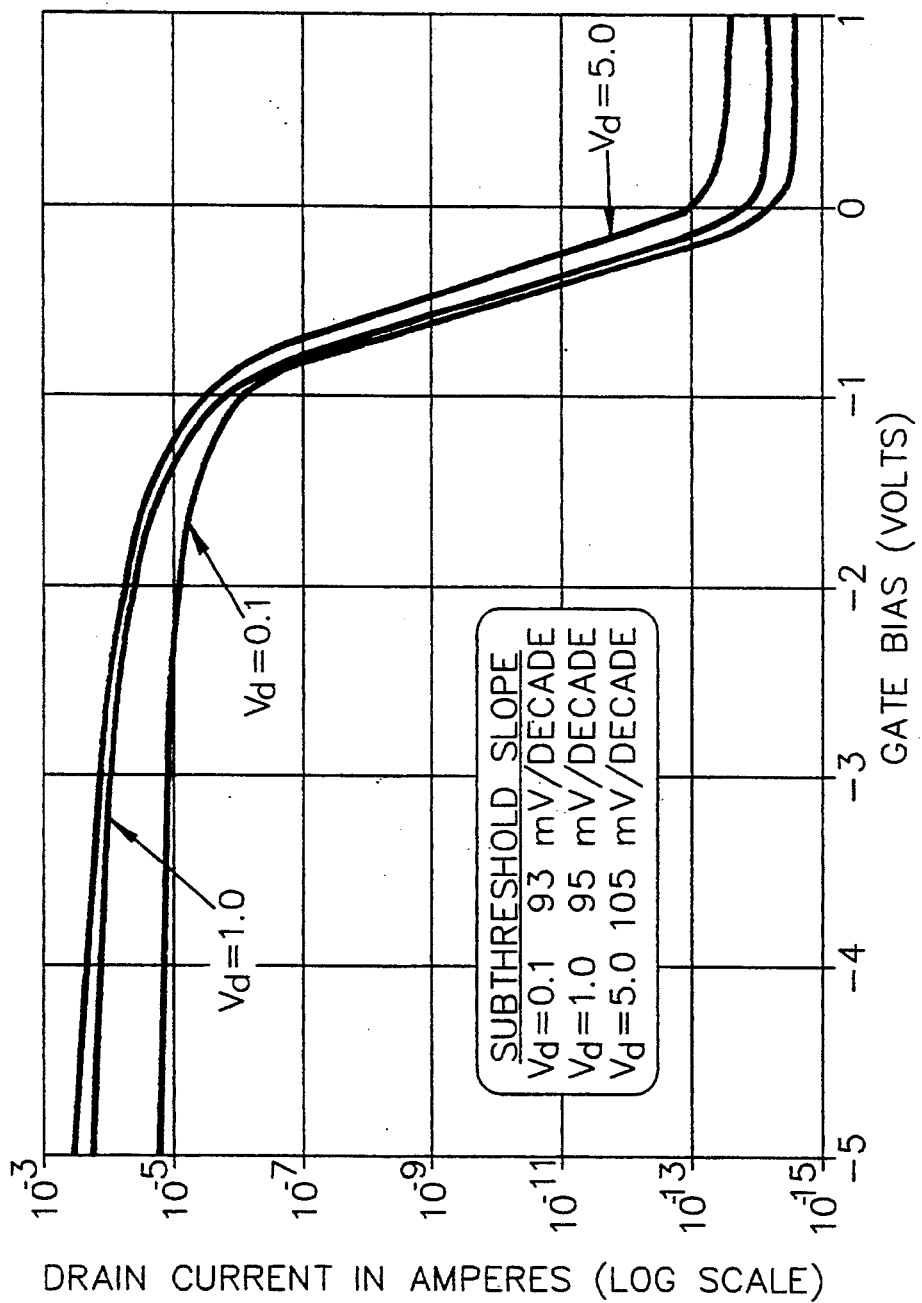

Typical bottom current and sub-threshold leakage behavior for the high current Fermi-FET devices of FIGS. 5B and 4C, are illustrated in FIGS. 6A and 6B. N-Channel high current Fermi-FET behavior is shown in FIG. 6A, and P-channel behavior in FIG. 6B. These figures illustrate N-channel current for an 0.8 μm transistor per μm width, and P-channel current for an 0.8 μm transistor per μm width, respectively. Bottom current is typically 2E-13 A/μm at 5 Volt drain bias at room temperature. This can be lowered to 2E-15 A/μm using the short channel techniques described below.

Figure 7:
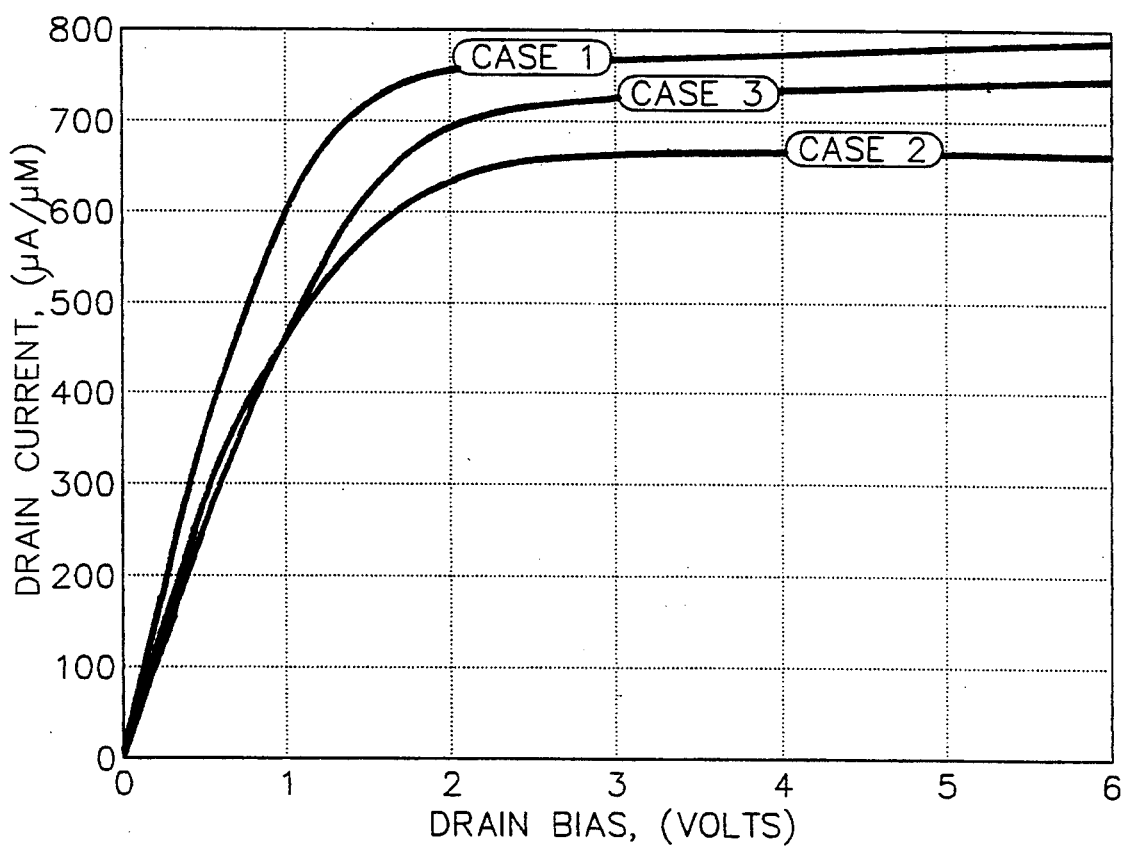
FIG. 7 graphically illustrates simulated worst case comparisons of drain current versus drain bias for different sidewall spacer structures in a high current Fermi-FET.

FIG. 7 illustrates a worst case simulated comparison plot of 5 Volt N-channel high current Fermi-FET drain current with different side-wall spacer structures 41 (FIG. 1). In all plots, the SiO₂ gate insulator 28 thickness is 132 Å. The different structures are illustrated in FIGS. 8A-8C.

Figure 8A:
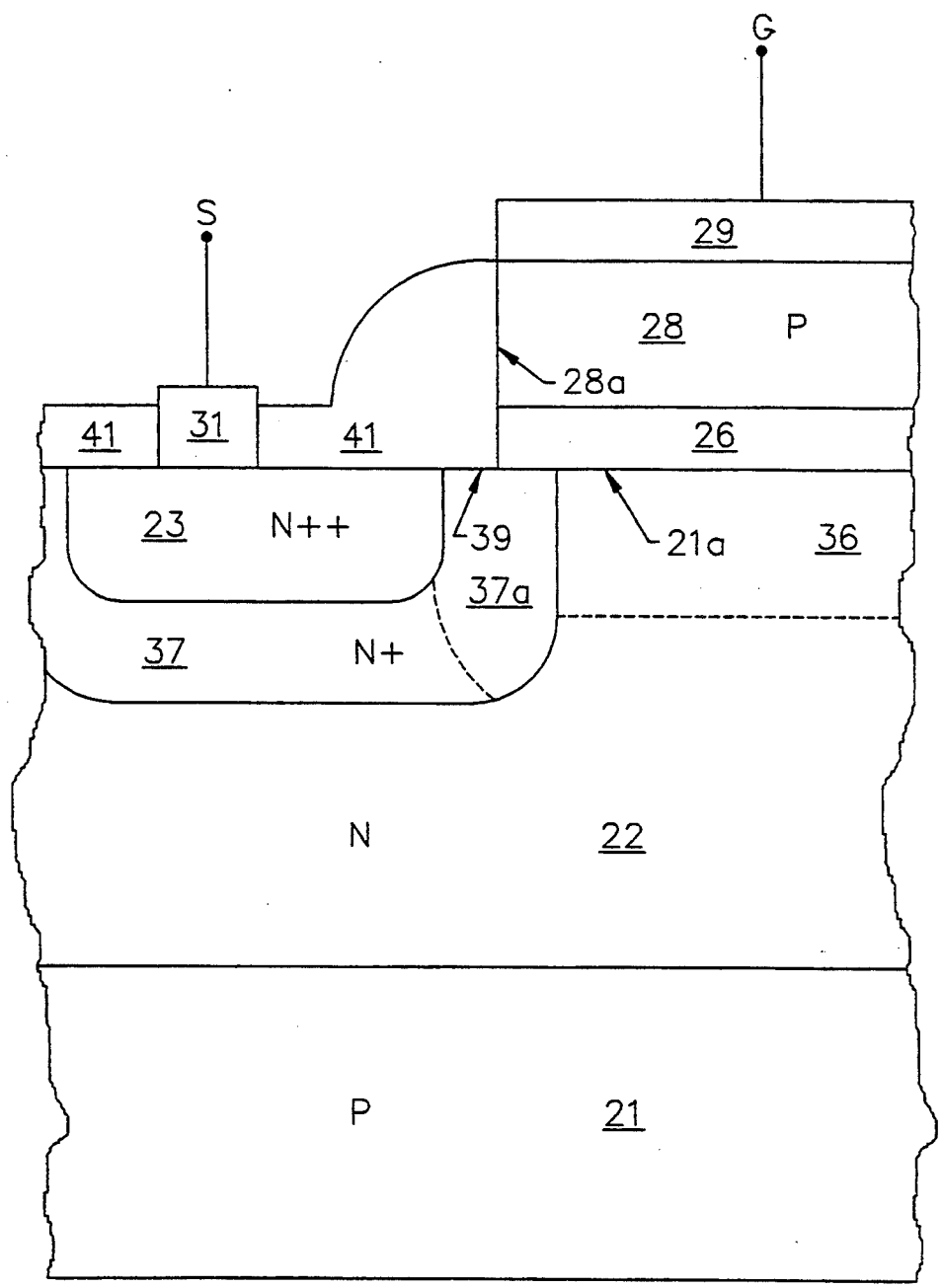
FIGS. 8A-8C illustrate enlarged cross-sections of the sidewall spacer structures which are graphically illustrated in FIG. 7.
Figure 8B:
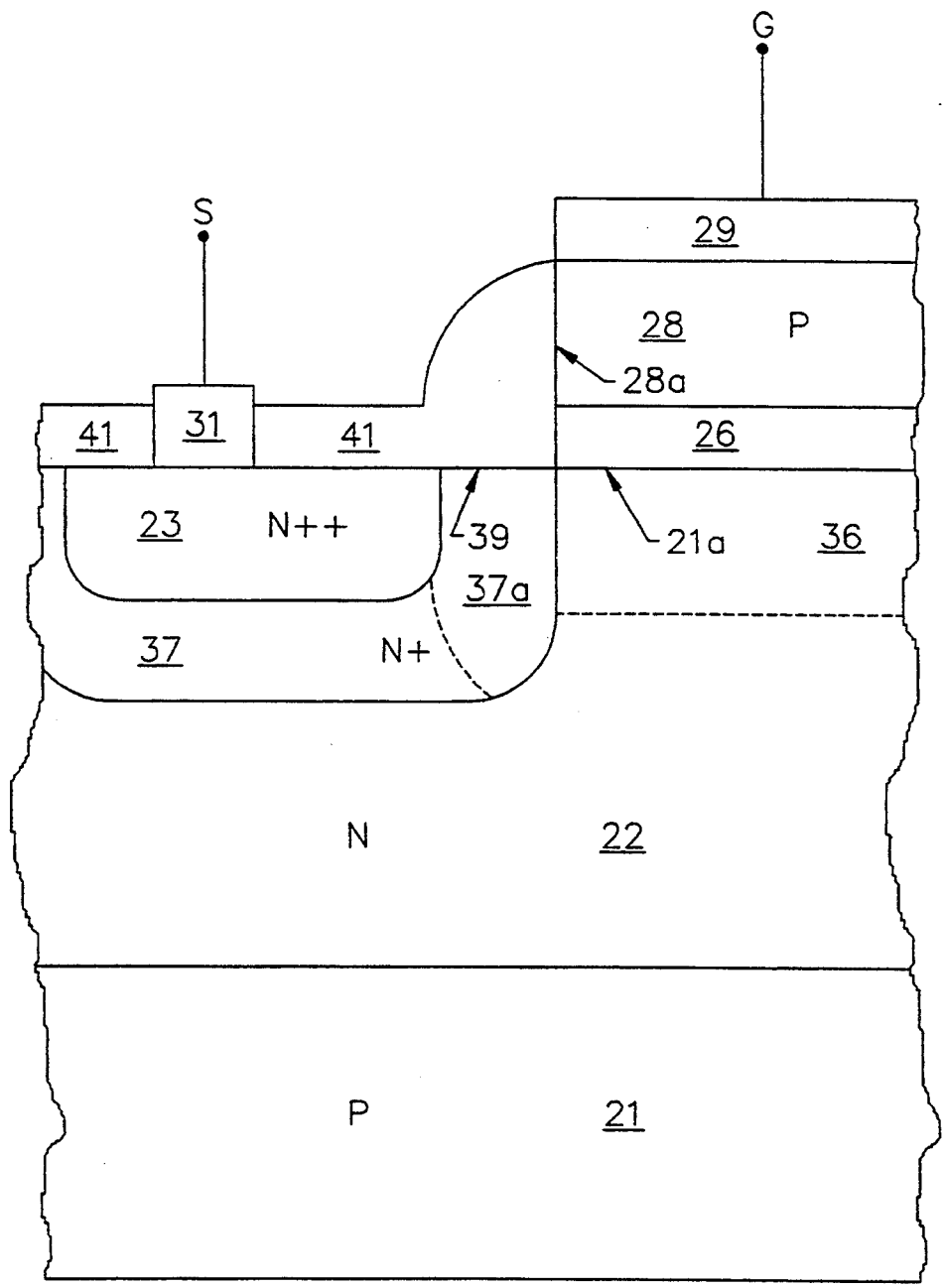
Figure 8C:
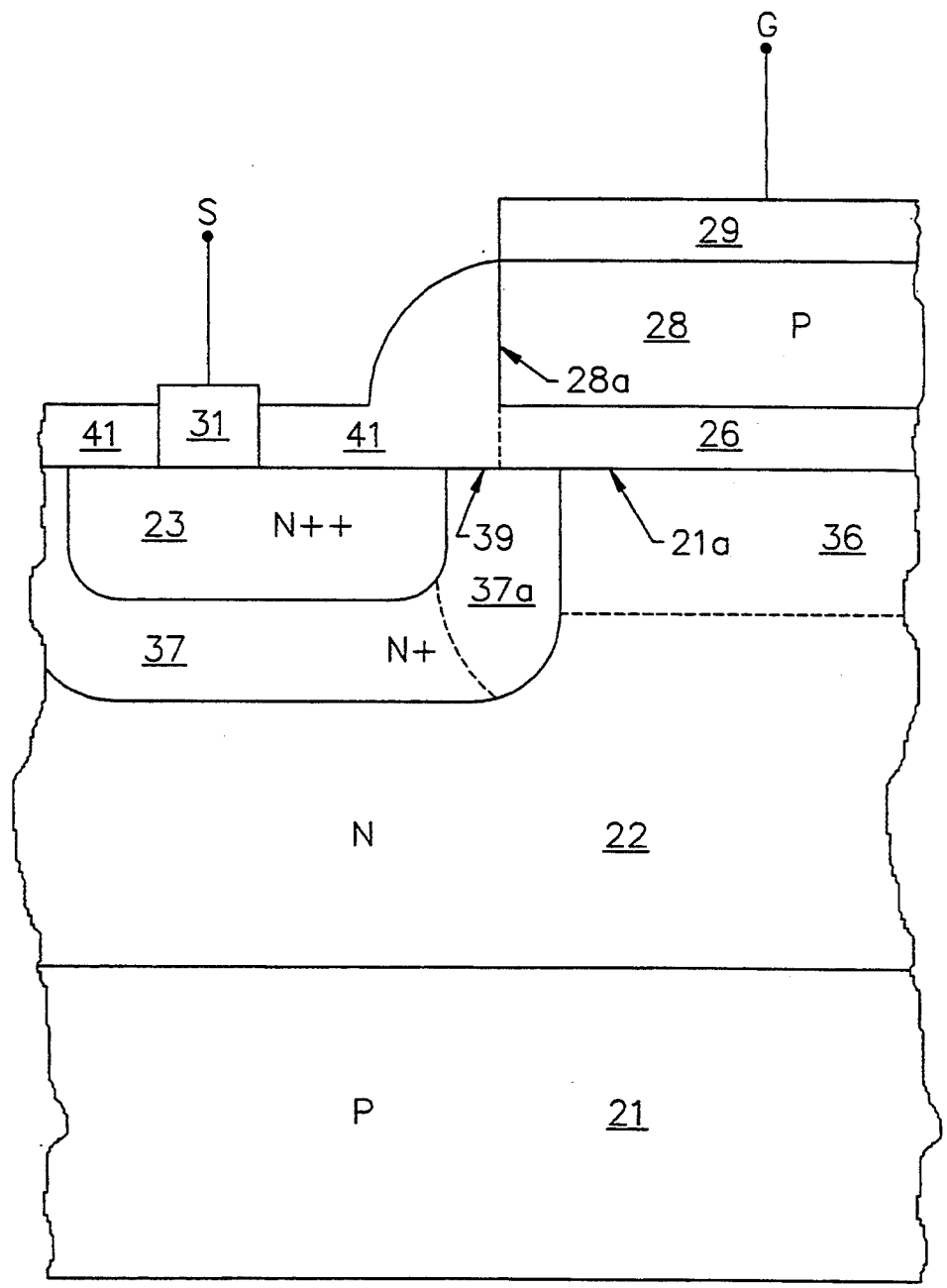

FIG. 8A illustrates Case 1 where the gate sidewall spacer 41 is silicon nitride, while the gate insulator 26 is silicon dioxide. The gate insulator 26 is also shown to slightly overlap the tip of the injector 37a at interface 39. Case 2, FIG. 8B, illustrates the gate sidewall spacer 43 as silicon nitride and the gate insulator 26 as silicon dioxide. In this case, the gate insulator 26 does not overlap the source injector region 37a at interface 39, but is contiguous with its edge. Case 3, FIG. 8C, illustrates both gate sidewall spacer 41a and gate insulator 43, of silicon dioxide. This structure is also constructed such that the edge of the polysilicon gate 28 slightly overlaps the source injector region 37a at interface 39. In all cases, the effective channel length was 0.71 μm.

As shown in FIG. 7, Case 1 produces the greatest drain saturation current with the least pinch-off voltage. It has also been found that Case 1 yields the lowest sub-threshold bottom current for any drain voltage. Case 1 also satisfies the conditions specified by Equations (24) and (25). Accordingly, Case 1 is preferred, so that the gate insulating region 26 extends partially over source injector region 37a at interface 39, and the gate sidewall spacer region 41 has greater permittivity than gate insulating region 26.

Low Leakage Current Fermi Threshold Field Effect Transistor

Figure 9A:
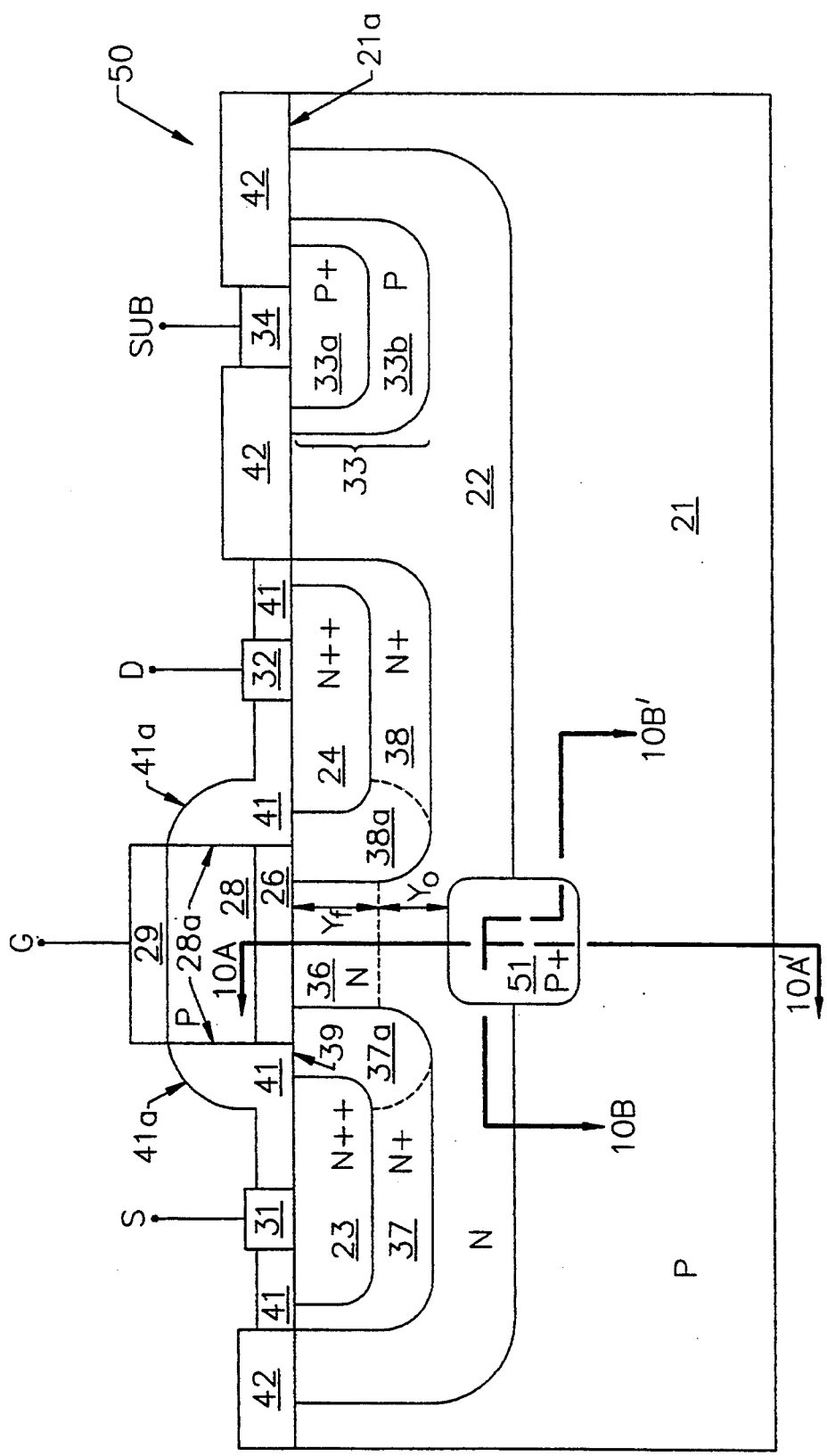
FIG. 9A illustrates a cross-sectional view of a first embodiment of a short channel low leakage current Fermi-FET according to the present invention.
Figure 9B:
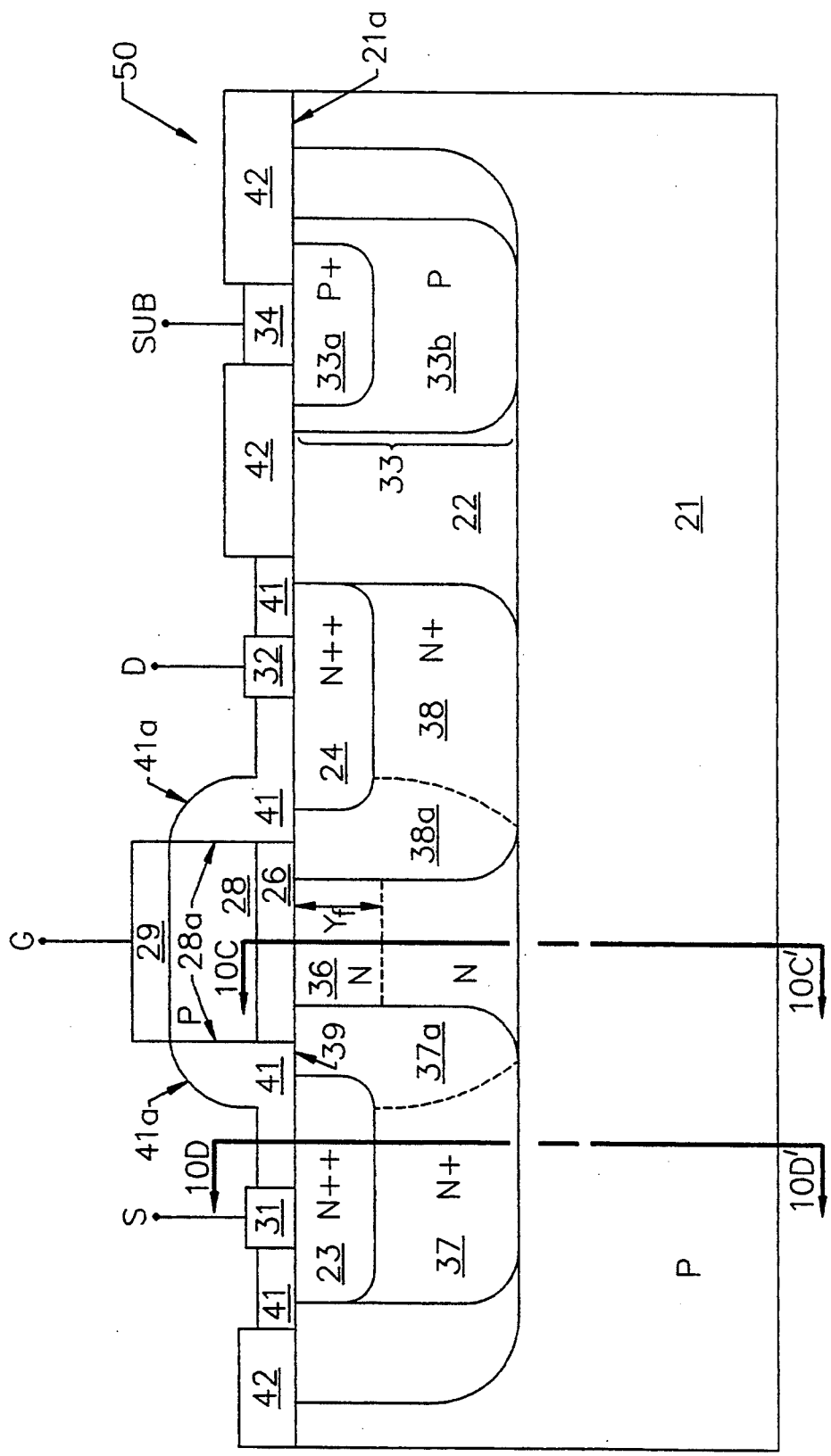
FIG. 9B illustrates a cross-sectional view of a second embodiment of a short channel low leakage current Fermi-FET according to the present invention.

Referring now to FIGS. 9A and 9B, Fermi-FETs which have short, channels yet produce low leakage current according to the present invention, will now be described. These devices will hereinafter be referred to as "low leakage current Fermi-FETs". The low leakage current Fermi-FET 50 of FIG. 9A includes a bottom leakage current control region 51 of first conductivity type, here P conductivity type, and doped at a high concentration relative to the substrate 21. Accordingly, it is designated as P+ in FIG. 9A. The low leakage current Fermi-FET 60 of FIG. 9B includes extended source and drain injector regions 37a, 38a, which preferably extend to the depth of the Fermi-tub 22.

Referring now to FIG. 9A, bottom leakage current control region 51 extends across the substrate 21 from between an extension of the facing ends of the source and drain regions 23 and 24, and extends into the substrate from above the depth of the Fermi-tub 22 to below the depth of the Fermi-tub. Preferably, it is located below, and in alignment with the Fermi-channel 36. For consistency with the equations previously described, the depth from the Fermi-channel 36 to the top of the bottom current leakage current control region 51 has been labeled $Y_0$. The remainder of the Fermi-FET transistor of FIG. 9A is identical with that described in FIG. 1, except that a shorter channel is illustrated. It will be understood by those having skill in the art that injector regions 37a and 38a and/or injector tubs 37 and 38 may be omitted, as may the gate sidewall spacer region 41, to provide a low leakage current low capacitance, short channel Fermi-FET without the high current properties of the device of FIG. 9A.

The bottom leakage current control region 51 minimizes drain induced injection in short channel Fermi field effect transistors, i.e. those field effect transistors having a channel length of approximately 0.5 μm or less, while maintaining low diffusion depletion capacitance. For example, at 5 volts, leakage current of 3E-13A or less may be maintained.

The bottom leakage current control region may be designed using Equation (2) where $Y_0$ is the depth from the channel to the top of the bottom leakage control region as shown in FIG. 9. Factor $\alpha$ is the ratio between the P+ doping of the bottom leakage current control region 51 and the N doping of the Fermi-tub 22. Preferably $\alpha$ is set to about 0.15 within the bottom leakage control region, i.e. below the gate 28. Below the source and drain regions 23 and 24, $\alpha$ is set to about 1.0 to minimize diffusion depletion capacitance. In other words, the doping concentrations of substrate 21 and Fermi-tub 22 are about equal in the regions below the source and drain. Accordingly, for the design parameters described above, and for a channel width of 0.5 micron, the doping concentration in the bottom leakage control region 51 is approximately 5E17 and is deep enough to support partial depletion at the tub-junction region given 5 volt drain or source diffusion potential.

Referring now to FIG. 9B, an alternate design for bottom leakage control extends the depth of source injector region 37a and drain injector region 38a, preferably to the depth of the Fermi-tub $(Y_f + Y_o)$. As shown in FIG. 9B, the depth of the entire source injector tub 37 and drain injector tub 38 may be extended, preferably to the depth of the Fermi-tub. The separation distance between the bottom of the injector tubs 37 and 38 and the bottom of the Fermi-tub 22 is preferably less than half the channel length and preferably approaches zero. Under these conditions, injector tubs 37 and 38 have doping concentration of about 1.5E18/cm³. The depth of substrate contact region 33b also preferably is extended to approach the Fermi-tub depth. The remainder of the Fermi-FET transistor 60 of FIG. 9B is identical with that described in FIG. 1, except that a shorter channel is illustrated.

Design of 0.5 μm Low Leakage Current Fermi-FET

Figure 10B:
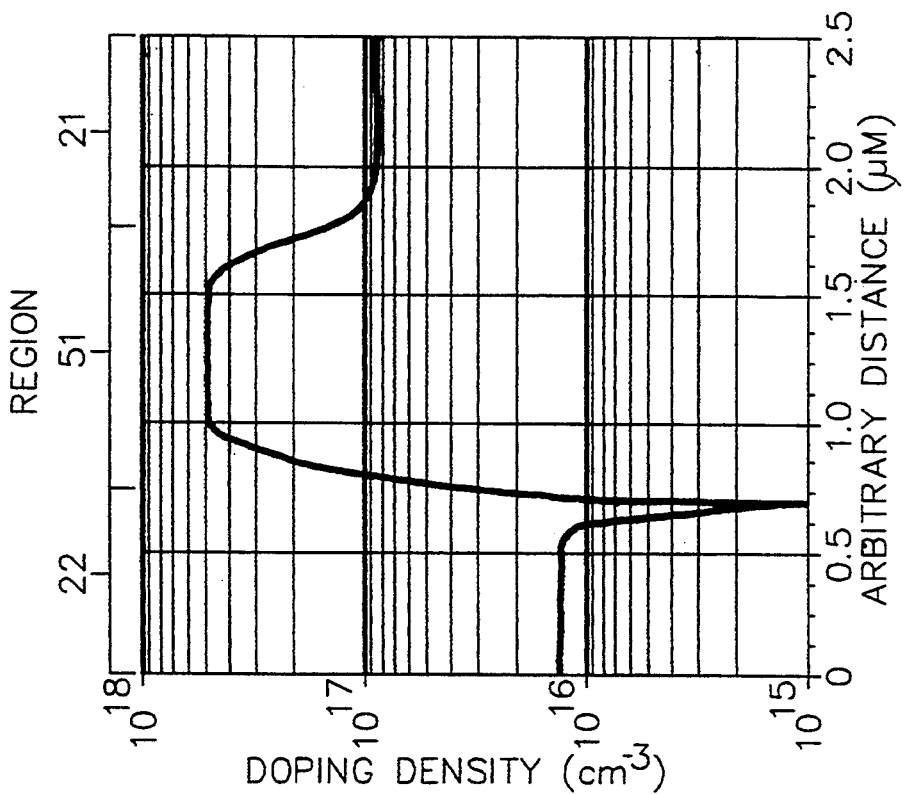
FIGS. 10A and 10B graphically illustrate preferred doping profiles and geometries for designing a 0.5 μm channel low leakage current Fermi-FET of FIG. 9A.
Figure 10A:
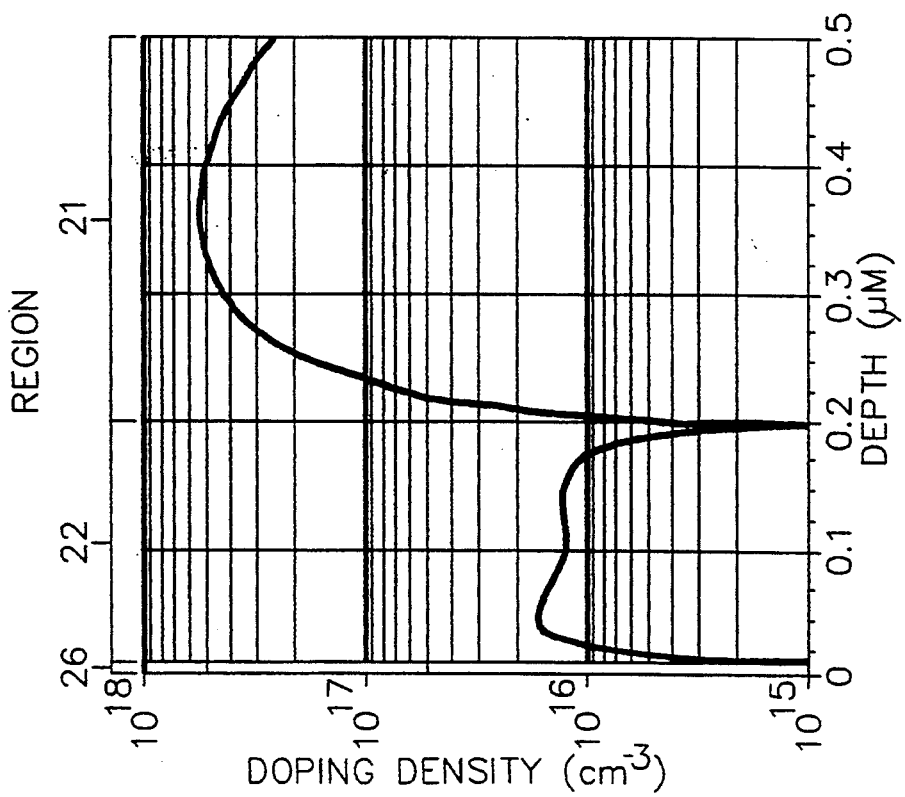

Referring now to FIGS. 10A-10B, preferred doping profiles and geometries for designing a 0.5 μm channel low leakage current Fermi-FET as illustrated in FIG. 9A will now be described. It will be understood by those having skill in the art that both N and P channel FETs are fabricated in a similar fashion. All geometries and doping profiles are identical to those described in FIGS. 2A-2C, except that the length of channel region 36, between facing surfaces of injector regions 37a and 38a, is 0.5 μm rather than 0.8 μm, and the bottom leakage control current control region 51 is added as already described. It is well known to those having skill in the art how to achieve these doping profiles, using many well known techniques.

FIG. 10A illustrates a vertical doping profile along line 10A—10A' of FIG. 9A and centered about the channel 36. The region to which the profile applies is also labelled at the top of the horizontal axis of FIG. 10A. As shown, bottom current leakage current control region 51 extends from 1950 Å to 4000 Å in depth from the top face 21a of substrate 21. Accordingly, it is centered about the interface between Fermi-Tub 22 and substrate 21. Doping concentration is 5E17. In contrast with FIGS. 2A–2C, the substrate 21 is doped at 1E17.

FIG. 10B illustrates a doping profile along line 10B—10B' of FIG. 9A. As shown, bottom leakage current control region 51 extends horizontally between source injector region 37a and drain injection region 38a for about the same length as the channel length, i.e. about 0.5 μm.

Figure 10D:
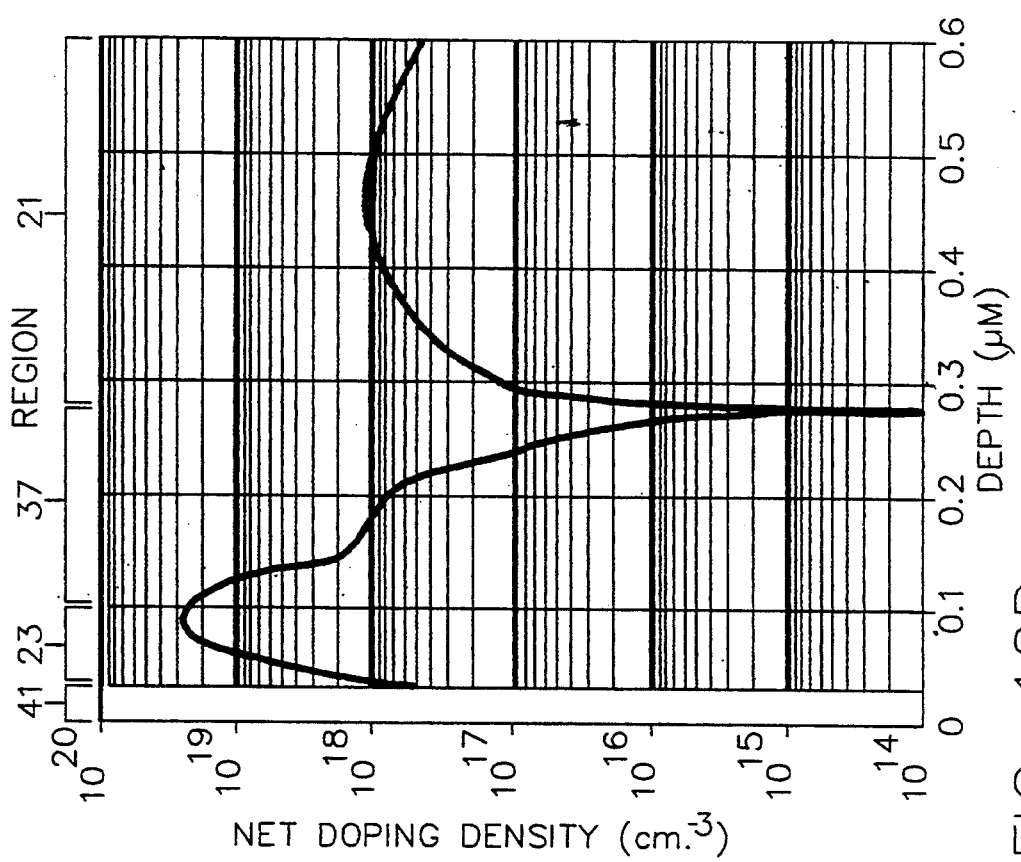
FIGS. 10C and 10D graphically illustrate preferred doping profiles and geometries for designing a 0.5 μm channel low leakage current Fermi-FET of FIG. 9B.
Figure 10C:
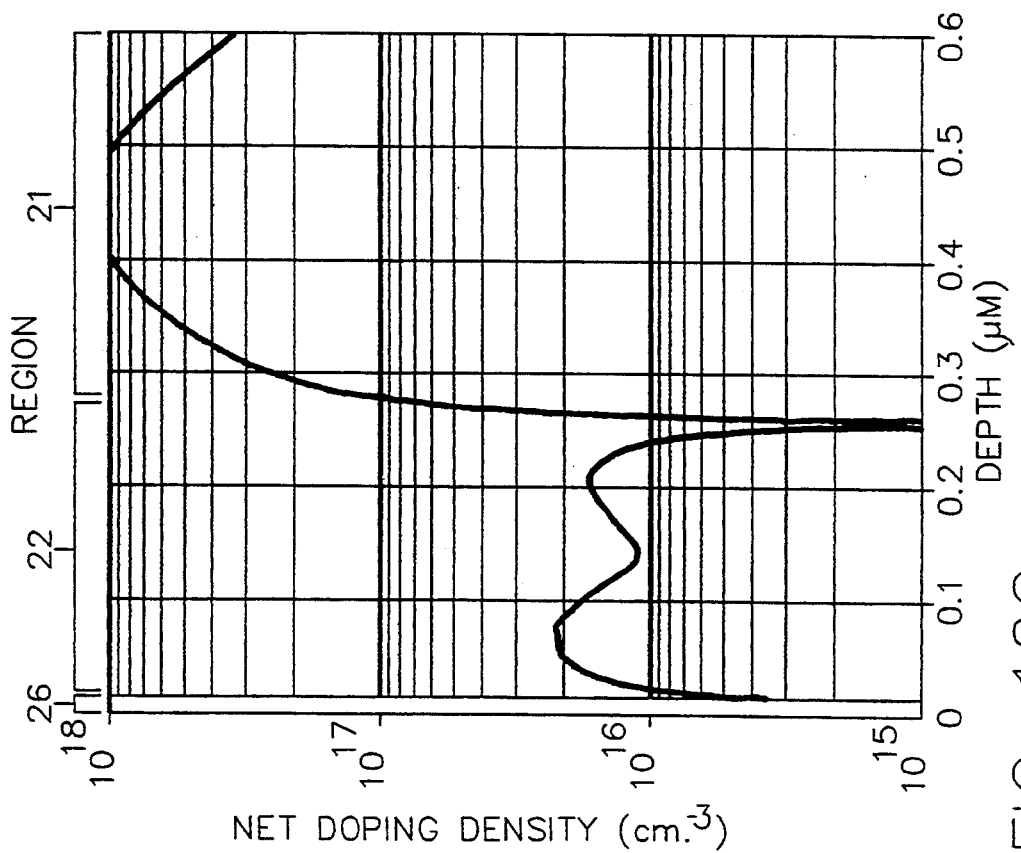

Referring now to FIGS. 10C–10D, preferred doping profiles and geometries for designing a 0.5 μm channel low leakage current Fermi-FET as illustrated in FIG. 9B will now be described. It will be understood by those having skill in the art that both N and P channel FETs are fabricated in a similar fashion. All geometries and doping profiles are identical to those described in FIGS. 2A–2C except that the depths of source injector region 37, drain injector region 38 and substrate contact 33b have been extended to the tub depth of about 2000 Å, and the length of channel region 36, between facing surfaces of injector regions 37a and 38a, is 0.5 μm rather than 0.8 μm.

FIG. 10C illustrates a vertical doping profile along line 10C—10C' of FIG. 9B and centered about the channel 36. As shown, substrate concentration is about 1E18. FIG. 10D illustrates a doping profile along line 10D—10D' of FIG. 9B. As shown, the source injector tub 37 extends to the depth of the Fermi-tub.

Operation of the Bottom Leakage Current Control Region

The operational theory of the bottom leakage current control region 51 of FIG. 9A, and the deep injection regions of FIG. 9B, to lower leakage current in short channel devices, will now be described. Subthreshold considerations will first be described to define the terms which apply to bottom leakage current. A discussion of how injector tub depth influences bottom leakage current will then be provided as well as a discussion of drain induced injection and drain field threshold lowering.

Figure 11:
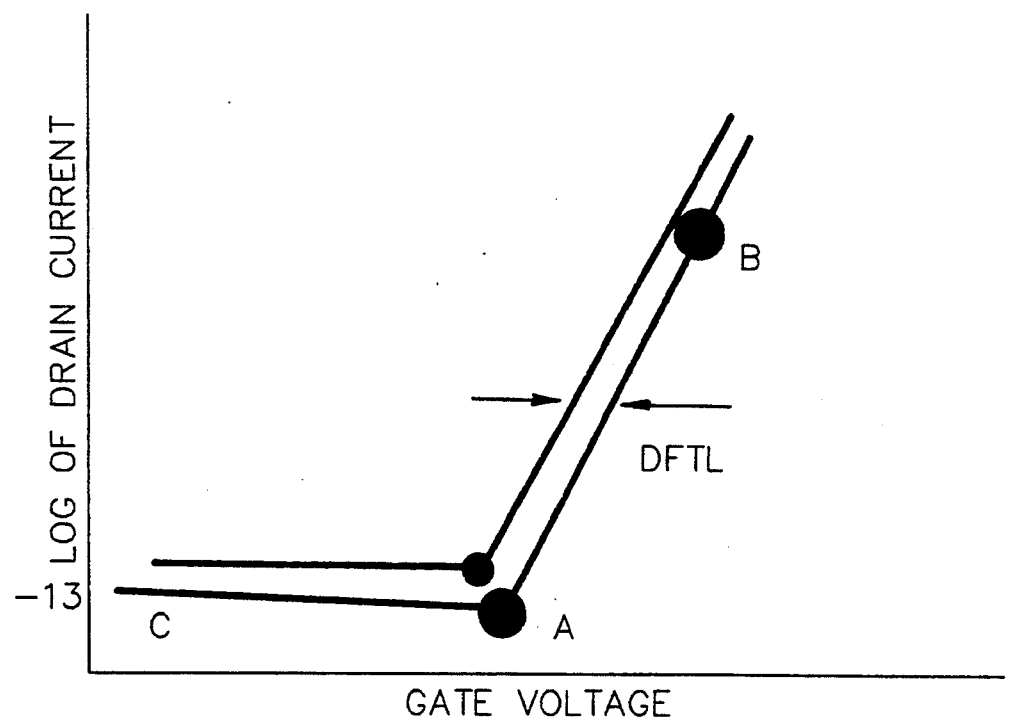
FIG. 11 graphically illustrates basic subthreshold voltage-current behavior of a field effect transistor.

In solving the equations that describe the sub-threshold behavior of the Fermi-FET, some new definitions are needed. FIG. 11 graphically illustrates basic behavior. There are four primary features of sub-threshold current behavior. These behavior regions are labeled A, B, and C and $D_{FTL}$ in FIG. 11. Point A defines "sub-threshold threshold, $V_{stt}$. Point B defines normal conduction threshold. Point C defines "bottom leakage current" as influenced by drain voltage. Finally, the arrows for $D_{FTL}$ defines "drain field threshold lowering". Sub-threshold threshold occurs when the injecting gate field is zero.

Referring again to FIGS. 9A and 9B, bottom leakage current dependence on drain voltage is a result of a drain field component that terminates on the source injector diffusion 37a facing the channel 36. This source terminated drain field causes carrier injection into the channel 36. This sub-threshold effect is called "drain induced injection", DII.

DII is a characteristic property of majority carrier Fermi-FET and buried channel field effect devices. Below threshold, the majority carrier channel 36 and Fermi-tub region 22 do not contain charge sites that prevent the drain field from extending across the channel region. As a consequence, the drain field can terminate in the source depletion region facing the channel and cause injection.

In contrast, minority carrier MOS devices require the substrate region to intercede between the source and drain. Drain field is therefore terminated by ionizing the substrate region adjacent the drain diffusion facing the channel. If the substrate region is completely depleted between the source and drain diffusions, the well known punch-through phenomenon occurs leading to abrupt and high injection current.

In summary, MOS device design is troubled by punch-through and threshold problems. Buried channel devices are troubled by both punch-through and DII. However, Fermi-FET devices are troubled only by DII conditions, which can be substantially reduced by the bottom leakage current control region or by increasing the depth of the injector regions 37 and 38. The significant current and speed advantages of the Fermi-FET compared to MOS and buried channel devices far outweigh the design constraints needed to control DII in the former as opposed to eliminating punch-through and threshold troubles in the latter. Both problems become more significant as channel length is shortened.

The following analysis describes the impact of injector depth $Y_d$ on diverting drain field contour lines in majority carrier Fermi-FET devices. The bottom leakage current control region 51 of FIG. 9A or the deep injector tubs of FIG. 9B virtually eliminate DII.

Figure 12A:
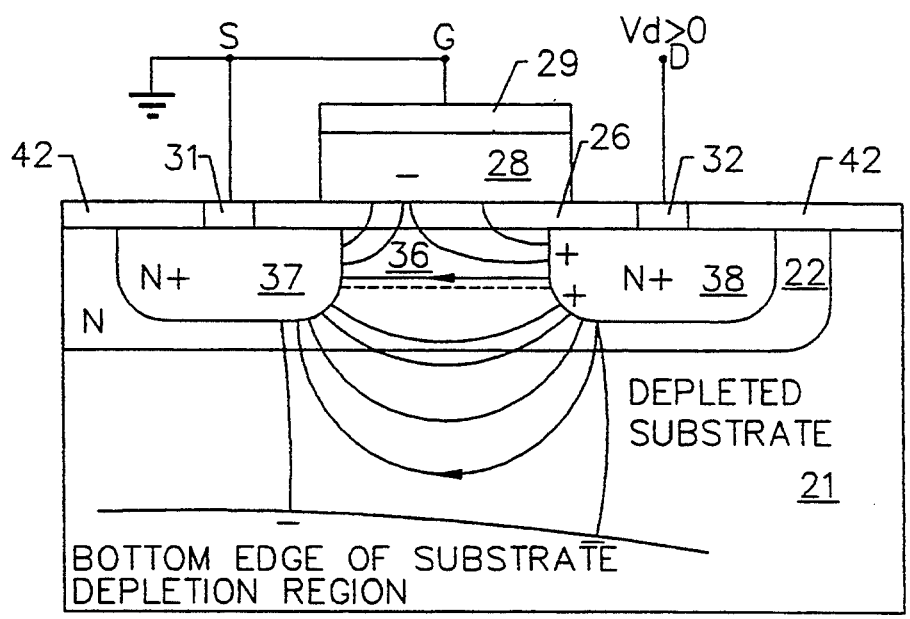
FIGS. 12A and 12B are enlarged cross-sectional views of a field effect transistor illustrating drain induced injection.
Figure 12B:
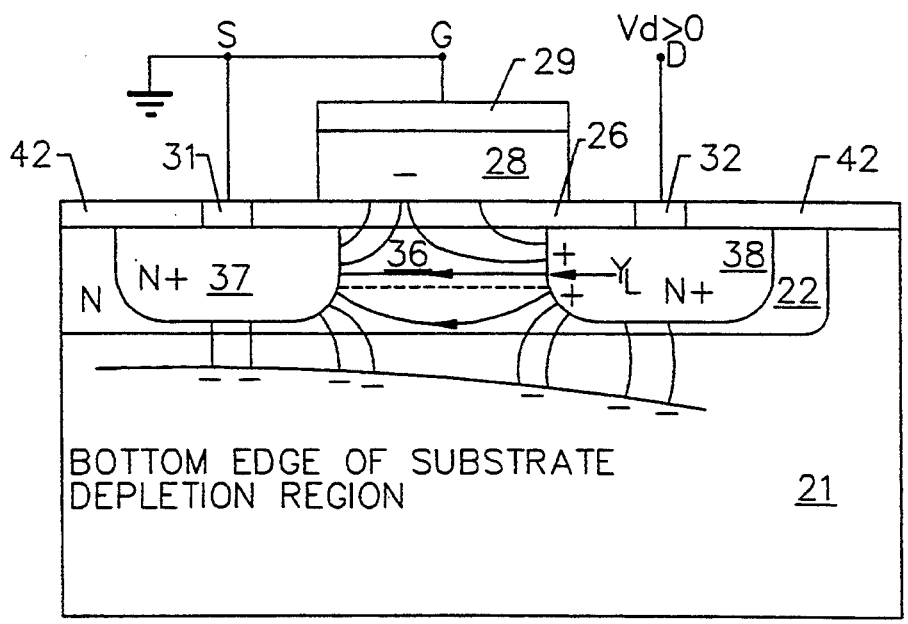

FIG. 12A illustrates field contour lines that occur when Drain Induced Injection becomes a problem in a low capacitance Fermi-FET, including a Fermi-tub 22 and injectors 37, 38 and no sidewall spacer 41. Specifically, the bottom corner region of the injector tubs contribute to excessive DII due to field crowding there. FIG. 12B illustrates proper corrective measures that minimize the effect, by moving the bottom edge of the substrate depletion region 21 closer to the bottom of the source and drain injector tubs 37, 38. The bottom current leakage control region 51 of FIG. 9A also accomplishes this result.

There exists some depth $Y_L$ at the drain injector 38 facing the channel 36 at which the contour integral of the drain electric field terminating on poly gate surface 28 equals the contour integral of the drain field terminating in the substrate region 21. At that point, drain field can terminate at the source 23, facing the channel region. There is an injector tub depth that minimizes the number of field lines that can terminate on the source injector 38. This requirement suggests that $\alpha$ be less than 1. Typically, $\alpha < L_o/2$. When designing Fermi-FET devices, Equation (31) derived below, should be considered. Predicted depth $Y_L$ should not exceed the depth of the injector, otherwise considerable bottom leakage current will flow from the bottom and corners of the diffusions in the subthreshold regime. Equation (32) derived below, produces minimum bottom current.

Equation (32) also predicts the basic design criteria for the original Fermi-FET as defined by U.S. Pat. Nos. 4,990,974 and 4,984,043. Specifically, when $Y_{tub} = Y_o$ and $Y_o = Y_p$, then $\alpha = 1$ and $Y_L = Y_o$. In other words, for that case, the diffusion depth $Y_d$ should be the same as the Fermi channel depth $Y_o$. $Y_p$ is the depletion depth in the substrate region.

Equation (32) will now be derived. Let $R_1$ be an effective radius for the field lines that terminate on the polysilicon gate electrode 28. Let $R_2$ be an effective radius for the field lines that terminate in the substrate region 21. Let $E_d$ be the drain field along these field lines. The electric field between diffusions is nearly uniform in the sub threshold region as compared to the electric field that terminates in the substrate region below the diffusions.

$$\frac{\pi}{2} R_1 E_{sd} + T_{ox} E_{sd} \frac{e_s}{e_i} = V_d + V_{pj} \quad (26)$$

$$\frac{\pi}{2} R_2 E_{sd} = V_d + V_w \quad (27)$$

$$R_2 = Y_{tub} + Y_p - Y_L \quad (28)$$
$$R_1 = Y_L \quad (29)$$

Using Equations (26)–(29) the following expression is obtained:

$$E_d \left[ \frac{\pi}{2} (R_1 - R_2) + \frac{e_s}{e_i} T_{ox} \right] + V_w - V_{pj} = 0 \quad (30)$$

where $V_w$=well potential KT/q ln(N/Ns), and $V_{pj}$=polysilicon gate electrode junction potential KT/q ln(N/N$_{poly}$)
If $V_w = V_{pj}$, then:

$$Y_L \geq \frac{Y_{tub} + Y_p - \frac{2e_s}{\pi e_i} T_{ox}}{2} \quad (31)$$

Equation (31) is independent of field strength $E_d$. Substrate depletion depth $Y_p$ should be small by design.

Punch-through is a serious problem for short channel MOS and buried channel devices. High substrate doping is required to minimize the effect. In all FET structures, a second drain induced phenomenon occurs: "drain field threshold lowering", DFTL. Simply explained, DFTL is the result of insulator potential developed near the source end of the channel as a result of the electric field produced by drain voltage that is terminated by the gate when gate voltage is below drain voltage. This drain induced insulator potential is always in a direction to reduce threshold voltage. Punch-through is eliminated by the low capacitance Fermi-FET, however DFTL remains. An expression for the change in threshold voltage $\Delta V_t$ due to DFTL is given below and only applies when drain voltage is greater than gate voltage:

$$\Delta V_t = \frac{V_d - (V_g - V_{fb})}{1 + \frac{e_i(L_o + X_d)}{e_s T_{ox}}} \quad (32)$$

where $L_o$ is channel length and $X_d$ is diffusion depth.

The effects of DFTL increase by the amount drain voltage exceeds gate voltage and is more pronounced at low gate voltage as channel length is shortened. Thinning down gate insulator thickness proportionately reduces the effect.

A method of experimentally measuring the effects of DFTL is to plot sub-threshold behavior of the device. See FIGS. 6A and 6B. DFTL accounts for the left voltage translation of the rising curve, $Log_{10}I_{ch}$, with increasing drain voltage $V_d$.

APPENDICES

The design and operation of the high current Fermi threshold field effect transistor have now been described, as well as the theoretical considerations underlying the design and operation. A preferred design for an 0.8 μm channel device has also been described. The following Appendices provide greater theoretical detail related to various factors that govern high current Fermi-FET design and performance. Although these appendices are not necessary to specify the design and operation of the present invention, they provide greater theoretical depth for those who wish a deeper understanding.

APPENDIX A: Slew Rate and Ring Oscillator Performance

Slew rate is a measure of the switching speed of digital circuits. Slew rate is defined as the ratio of N-channel saturation current to the total capacitance loading the transistor. Capacitive loading consists of gate capacitance, drain area and perimeter capacitance, injector probe capacitance, and interconnect wiring capacitance. The basic capacitive loading factors are summarized below.

Gate Capacitance:

$$C_g^* = \frac{1}{\frac{T_{gin}}{\epsilon_{gin}} + \frac{\delta}{2e_s}}, F/cm^2 \quad (A1)$$

Diffusion Capacitance:

$$C_d = C_d^*(ZL_d + X_d(2Z + L_d)), F \quad (A2)$$

Injector Probe Capacitance:

$$C_{inj} = C_{gin}^* ZL_p, F \quad (A3)$$

Where;

$$C_{inj}^* = \frac{1}{\frac{\beta T_{gin}}{\epsilon_{gin}} + \frac{\delta}{2e_s}}, F/cm2 \quad (A4)$$

and Wiring Capacitance=$C_w$ in Farads.

Using Equation (20) for saturation current and Equations (A1)–(A4) slew rate has the formulation Isatn/$\Sigma$C, assuming that the length of the diffusion $L_d$ can be specified as $2.5L_o$:

$$S_r = \frac{(V_g - V_t)^2 \mu_{no}}{2L_o^2 \left[1 + \frac{L_p}{L_o} + \frac{C_d^*}{C_g^*}\left(2.5 + \frac{X_d}{L_o}\left(2 + \frac{L_d}{Z}\right)\right) + \frac{C_w}{C_g^* L_o Z}\right] \sqrt{1 + \left(\frac{(V_g - V_t)\mu_{no}}{2L_o V_{sat}}\right)^2}} \quad (A5)$$

Figure 13:
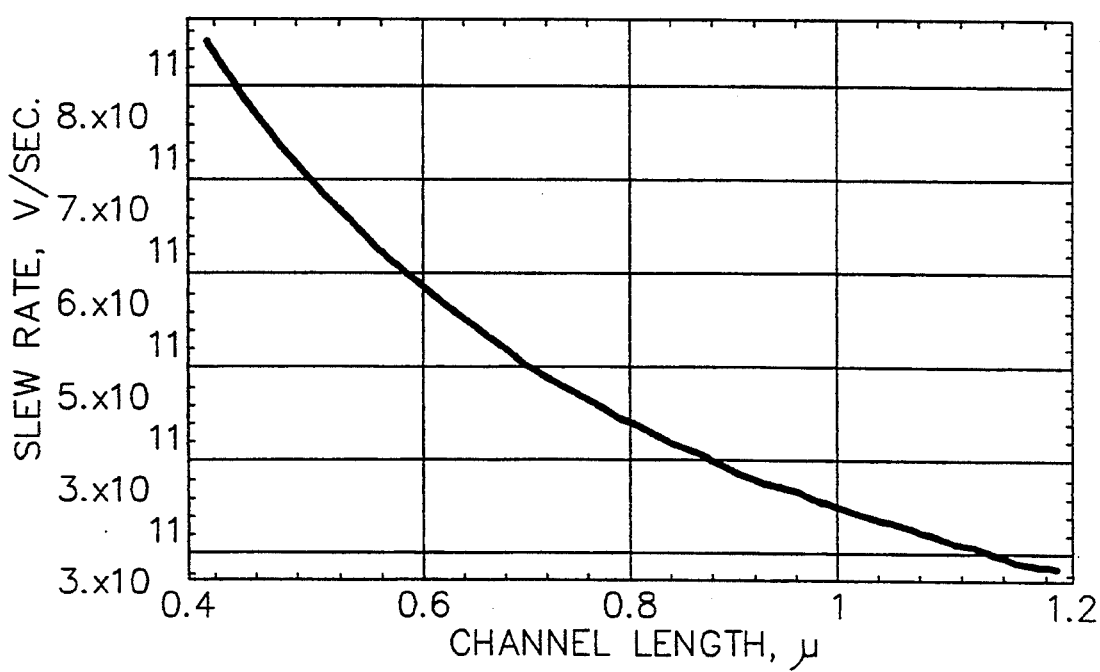
FIG. 13 graphically illustrates simulated theoretical limits for gate slew rate of a field effect transistor.

Equation (A5) indicates that if diffusion and wiring capacitance are zero for example, slew rate is independent of gate capacitance $C_g^*$ and only depends on gate drive ($V_g - V_t$), bulk mobility, injector length, channel length, and saturation velocity. In other words, gate slew rate has a theoretical limit value and is plotted in FIG. 13 as a function of channel length. Equation (A5) also suggests that the effects of diffusion and wiring capacitance on reducing slew rate are greatly minimized by decreasing gate insulator thickness i.e. increase drive current.

A threshold voltage which is independent of gate insulator thickness is one of the unique aspects of the Fermi-FET. This feature allows adjusting saturation current with insulator thickness without modifying other structure parameters. FIGS. 4A and 4B illustrate saturation current versus gate insulator 26 thickness and channel length for N and P-Channel Tub-FET's given flow depth $\delta = 200 \text{Å}$. The gate insulator 26 for the plot is silicon dioxide. If silicon nitride insulators are used, multiply abscissa values by 2.0. For this flow depth $\delta$, Fermi-FET gate capacitance is plotted in FIG. 4C for a range of insulator ($SiO_2$) thickness. Latchup is virtually nonexistent in Tub-FETs due to extremely low substrate current.

The equations that describe the frequency of oscillation of a 199 stage ring oscillator will now be developed. The delay time of an inverter with a symmetric transfer function is:

$$T_d = \frac{1.05 \, V_{dd}(1 + \eta)}{S_r} \quad \text{(A6)}$$

Where
Vdd = P-channel drain supply voltage
$\eta$ = the ratio of N to P-channel saturation current; 2.0 for Fermi-FETs
Sr = Slew Rate (Equation A5)

An N stage ring oscillator frequency is described by the following equation. Frequency is determined by use of Equations (A5) and (A6):

$$F_{ring} = \frac{1}{2NT_d} \quad \text{(A7)}$$

Figure 14A:
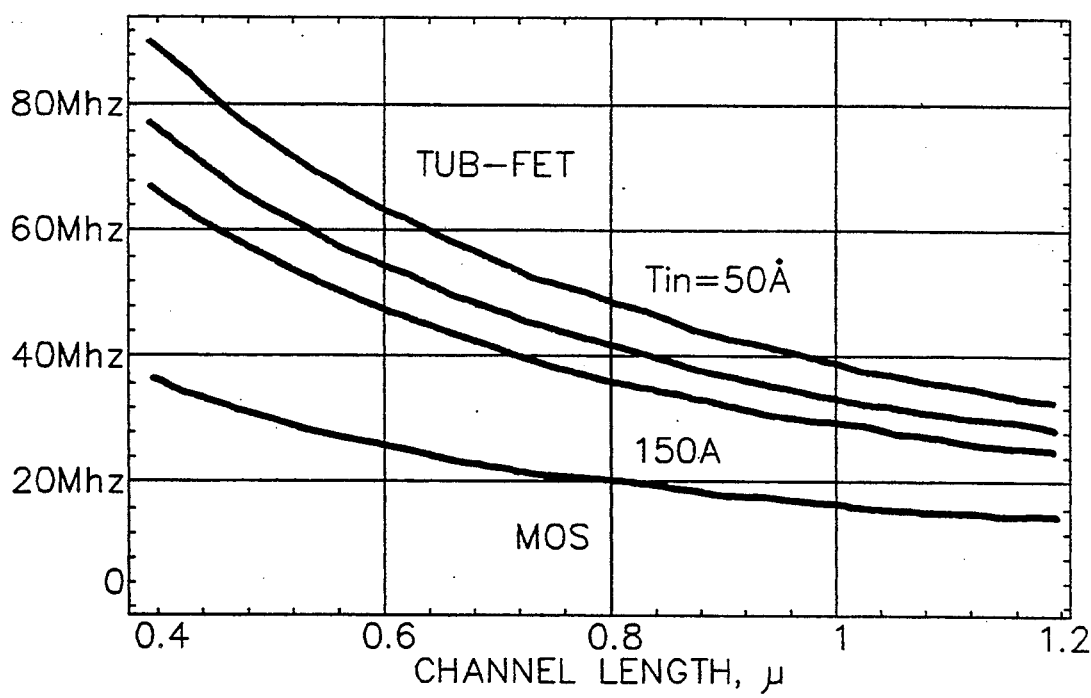
FIGS. 14A and 14B graphically illustrate simulated frequency response of ring oscillators constructed using Fermi-FET designs with different diffusion capacitance values.
Figure 14B:
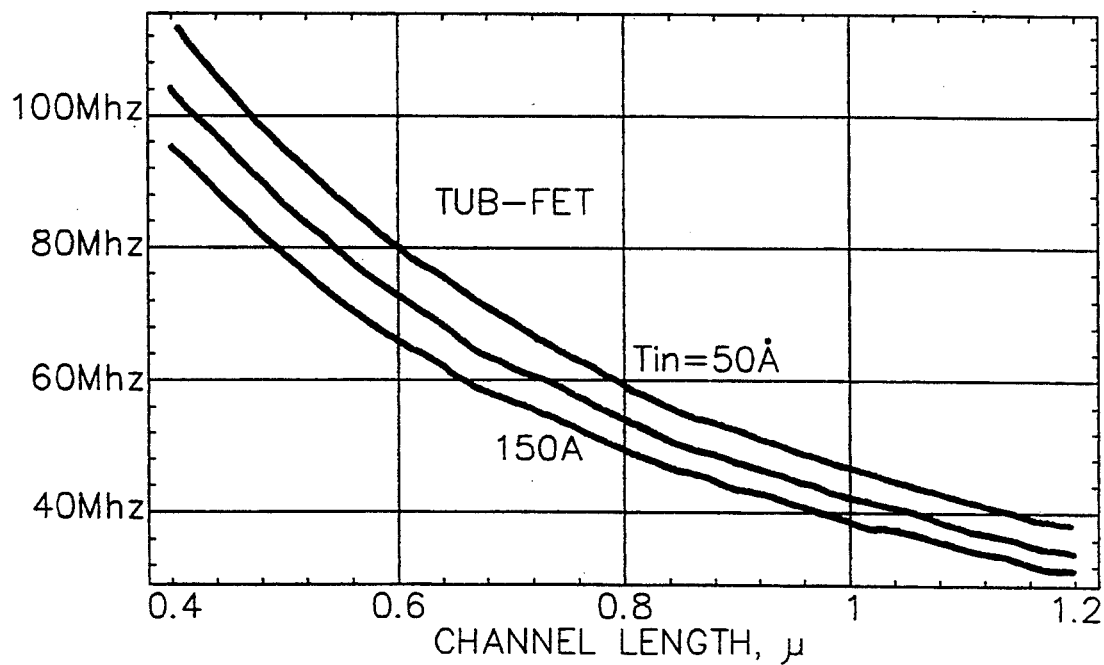

FIGS. 14A and 14B are frequency plots of 199 stage ring oscillators constructed using Tub-FET device designs with different diffusion capacitance values. In both cases, N-channel Tub-FET's are 10 $\mu$m wide and P-channel Tub-FET's are 20 $\mu$m wide. The abscissa is channel length in $\mu$m. The running parameter is gate insulator thickness and the ordinate is given in MHz. The bottom curve in FIG. 14A corresponds to MOS N-channel and buried P-channel architecture applied to the same ring oscillator design. Diffusion capacitance, Cd* = 0.6E-7 F/cm² was used to produce FIG. 14A and 0.3E-7 for FIG. 14B. In both cases the length of the diffusion was defined as 2.5 times channel length $L_o$. It is evident from the FIGS. 14A and 14B that Tub-FET oscillator frequency is far greater than that derivable from MOS and buried channel technology at any channel length.

Figure 15:
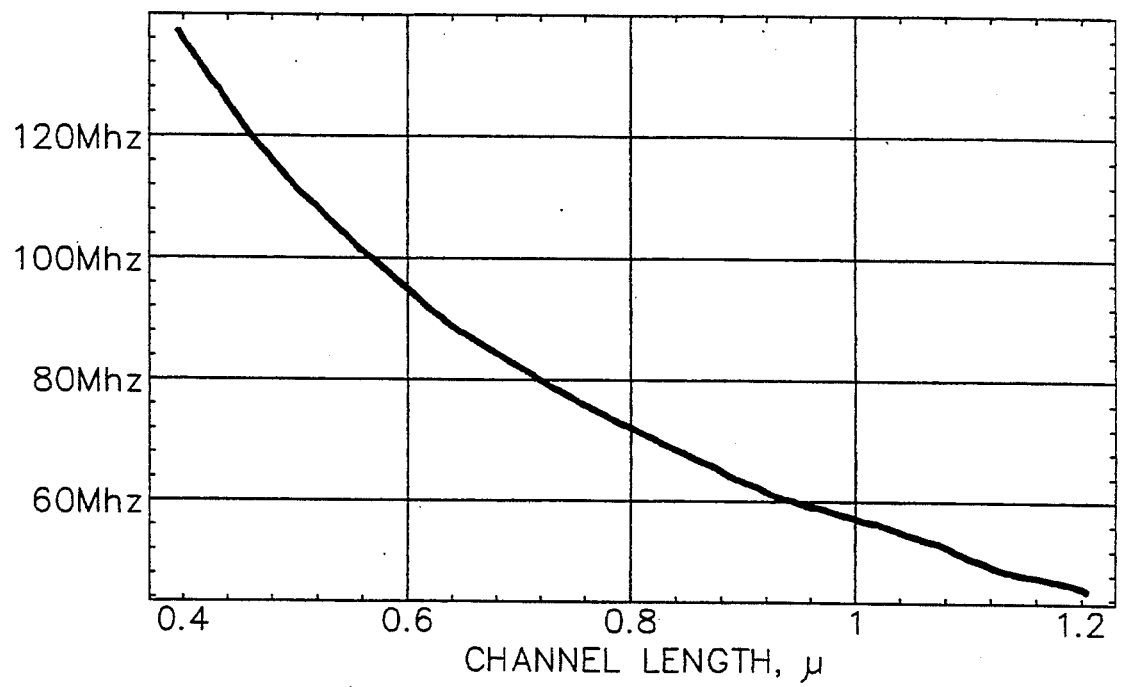
FIG. 15 graphically illustrates simulated theoretical frequency limits for a ring oscillator using Fermi-FET technology.

FIG. 15 is a plot of the theoretical frequency limit for a 199 stage ring oscillator using Tub-FET technology. Diffusion and wiring capacitance values are zero for this plot. Note that frequency for this unloaded case is independent of gate capacitance (insulator thickness) given the correct saturation current for that value of Fermi-FET gate capacitance. This theoretical observation allows one to calibrate SPICE type circuit simulators.

Figure 16:
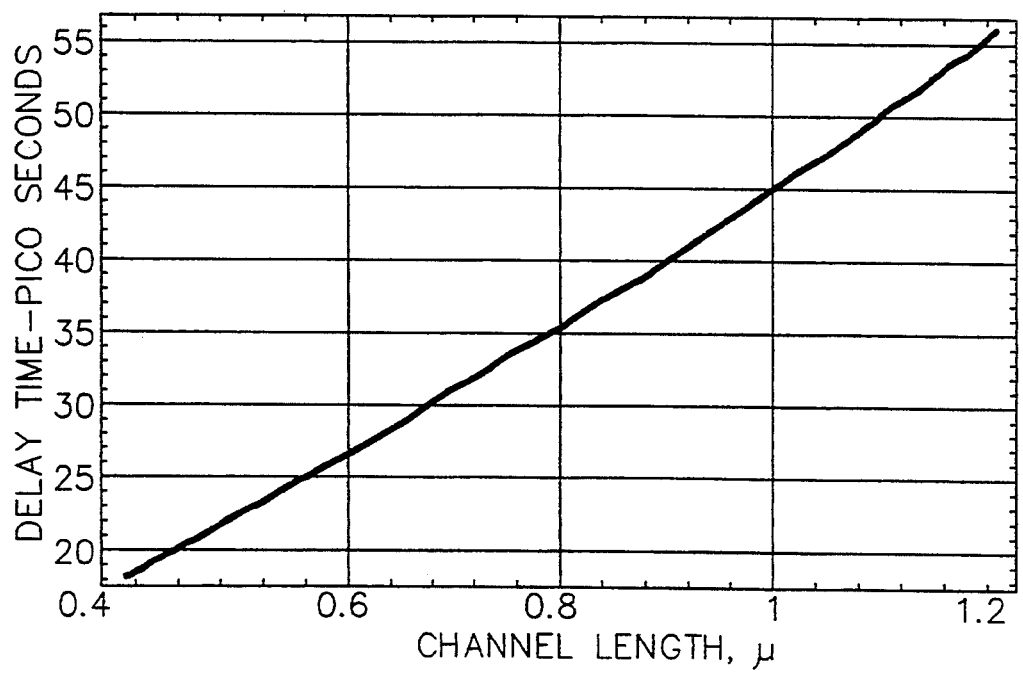
FIG. 16 graphically illustrates simulated inverter delay time with only gate capacitive loading.

FIG. 16 is a plot of inverter delay time with only gate capacitive loading. Delay time approaches carrier transit time at channel lengths of 0.4 $\mu$m. Consequently, little is to be gained by fabricating transistors with shorter channel length.

APPENDIX B: Gate Capacitance

Based on moment depth concepts, gate capacitance is expressed as:

$$C_g^* = \frac{1}{\frac{Y^\Lambda}{e_s} + \frac{T_{ox}}{e_i}} \quad \text{(B1)}$$

Figure 17:
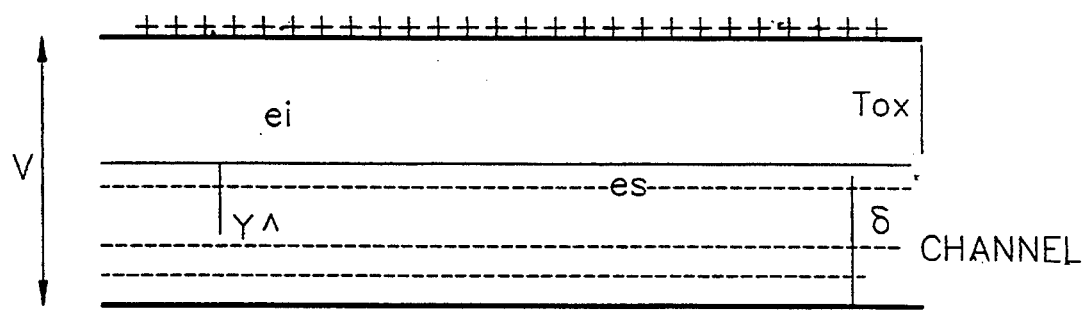
FIG. 17 illustrates an enlarged cross-sectional view of a distributed channel charge capacitor.

Equation (B1) is not a first principle derivation for gate capacitance. FIG. 17 depicts the distributed channel charge capacitor requiring solution. Based on first principles, the distributed charge capacitor has the following solution. The total voltage across the capacitor has the following expression:

$$V = \frac{q}{e_s} \int_0^\delta \int_0^y N_{ch}(y) dy dy + E_i T_{ox} \quad \text{(B2)}$$

since $$E_i = e_s / e_i E_s \quad \text{(B3)}$$

and surface field $E_s$ is $$E_s = \frac{q}{e_s} \int_0^\delta N_{ch}(y) dy, \quad \text{(B4)}$$

Therefore:

$$V = \frac{q}{e_s} \int_0^\delta \int_0^y N_{ch}(y) dy dy + \frac{q}{e_i} T_{ox} \int_0^\delta N_{ch}(y) dy \quad \text{(B5)}$$

Since Q=CV one can solve for capacitance Cg:

$$C_g = \frac{qA \int_0^\delta N_{ch}(y) dy}{q \left[ \frac{1}{e_s} \int_0^\delta \int_0^y N_{ch} dy dy + \frac{T_{ox}}{e_i} \int_0^\delta N_{ch}(y) dy \right]} \quad \text{(B6)}$$

Solving Equation (B6) for capacitance per unit area:

$$C_g^* = \frac{1}{\frac{\int_0^\delta \int_0^y N_{ch}(y) dy dy}{e_s \int_0^\delta N_{ch}(y) dy} + \frac{T_{ox}}{e_i}} \quad \text{(B7)}$$

Comparing Equations (B7) and (B1), an exact expression for moment depth $Y^\Lambda$ is:

$$Y = \frac{\int_0^\delta \int_0^y N_{ch}(y) dy dy}{\int_0^\delta N_{ch}(y) dy} \quad \text{(B8)}$$

For example, assume that $N_{ch}(y)=N_{do}$, a constant in the interval $\delta$. Then for this special case, Equation (B8) shows that moment depth $\hat{Y}=\delta 2$.

APPENDIX C: How Gate and Drain Field Induce Injection

It has been established that gate and diffusion capacitance are two transistor parameters that can be lowered by design to improve the high speed capabilities of the Fermi-FET. This Appendix derives all of the fundamental principles that are necessary to understand how to lower Fermi-FET gate capacitance. Lowering diffusion capacitance has already been discussed.

Gate capacitance intimately depends on the depth profile of excess carriers that are injected into the channel below the gate insulator layer. It was shown that gate capacitance/cm² can be expressed as follows:

$$C_g = \frac{1}{\frac{\hat{Y}}{\epsilon_s} + \frac{T_{ox}}{\epsilon_i}} \quad \text{(C1)}$$

Where;
$T_{ox}$ = Thickness of the gate insulator layer
$\epsilon_i$ = Permittivity of the gate insulator layer
$\hat{Y}$ = Moment depth of injected excess carriers
$\epsilon_s$ = Permittivity of silicon For MOS devices, moment depth $\hat{Y}$ is on the order of 50 Å or less due to the channel inversion mechanism and relatively high (8E18) diffusion (LDD) concentration. Consequently, MOS gate capacitance is only slightly less than $\epsilon_i/T_{ox}$ (Farads per square cm.). Fermi-FET gate capacitance is half the MOS value when moment depth is typically about 400 Å. Since Fermi-FET devices do not involve inversion, moment depth $\hat{Y}$ is not constrained by the depth of the majority carrier inversion region. The Fermi-FET provides for a deep majority type channel region that can be depleted or un-depleted by voltage applied to the gate electrode.

Figure 18:
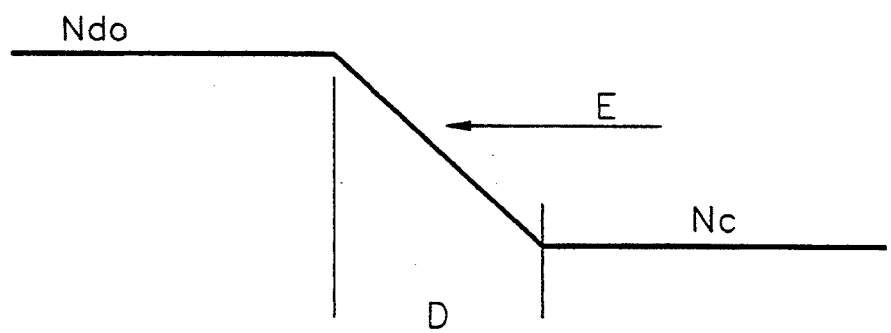
FIG. 18 schematically illustrates the transition of N-type doping concentration decreasing from a higher to a lower concentration.

Before the injection analysis can be presented, some facts about N+—N— junctions must be understood. FIG. 18 illustrates the transition of N type doping concentration decreasing from $N_d$ on the high side to a lower value $N_c$ on the other side. The length of the transition region is labeled D in the Figure. An abrupt junction is not implied by the Figure. The potential across this junction will be determined. Then, the effective depth of the depletion region in the heavily doped side of the junction will be determined. Starting with the transport equation for electrons across the junction, the following fundamental relationship is obtained:

$$J_n = N(x)q\mu_n(x)E(x) + qD_n(x)\frac{dN(x)}{dX} \quad \text{(C2)}$$

In steady state, $J_n=0$ therefore $$N(x)q\mu_n(x)E(x) = -qD_n(x)\frac{dN(x)}{dX} \quad \text{(C3)}$$

Solving for E (x):

$$E(x) = -\frac{qD_n(x)}{N(x)q\mu_n(x)}\frac{dN(x)}{dX} \quad \text{(C4)}$$

Using Einstein's equation $D = \mu KT/q$, Equation (C4) reduces to the following expression:

$$E(x) = \frac{KT}{q}\frac{1}{N(x)}\frac{dN(x)}{dX} \quad \text{(C5)}$$

Separating variables and integrating one obtains:

$$V(x) = \int_0^x E(x)dx = -\frac{KT}{q}\int_{N_{do}}^{N(x)}\frac{dN(x)}{N(x)} \quad \text{(C6)}$$

Integrating over the entire transition region D, an expression for the junction potential $V_j$ is:

$$V_j = \frac{KT}{q}\ln\left(\frac{N_{do}}{N_c}\right) \quad \text{(C7)}$$

Figure 19:
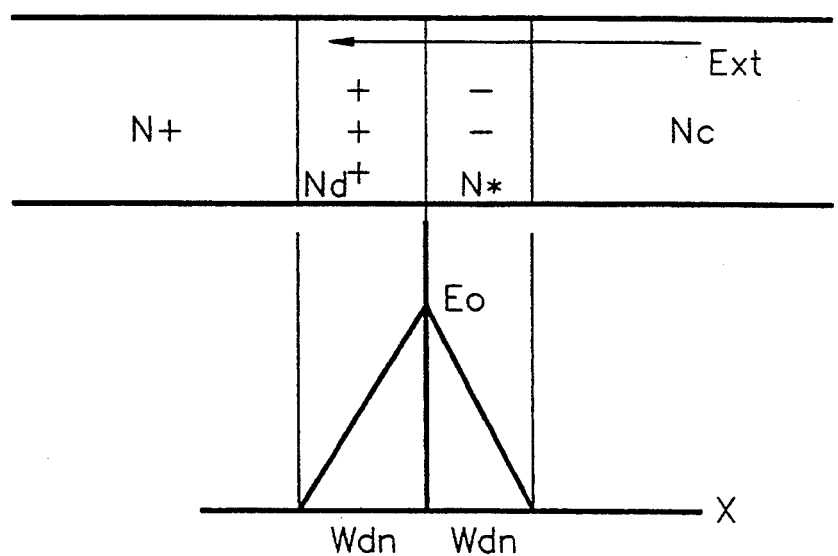
FIG. 19 schematically illustrates two differently doped N-type semiconductor regions forming an abrupt junction, and the electric field diagram therefor.

An expression for the width of the depletion region in the source diffusion facing the channel, will now be deprived. FIG. 19 illustrates two differently doped N type semiconductor regions forming an abrupt junction. A shallow depletion region occurs on the N+ side of the junction and a shallow accumulation region forms on the $N_c$ side of the junction. Although the accumulation charge density N* decreases exponentially from the junction into the lightly doped side of the junction, it will be assumed that the distribution of the accumulated charge is a mirror image of the ionized region on the N+ side of the junction. Width $W_{dn}$ defines depletion width in the highly doped region, $W_{da}$ is the width of the accumulation region on the lightly doped side of the junction. Considering charge neutrality the following expression is obtained:

$$W_{dn}qN_dZ_t = W_{da}qN^*Z_t \quad \text{(C8)}$$

Therefore $$W_{dn} = W_{da}N^*/N_d \quad \text{(C9)}$$

FIG. 19 also shows the electric field diagram for the junction conditions. The potential $\phi$ across the abrupt junction is expressed as follows:

$$\phi = \frac{KT}{q}\ln\left(\frac{N_{do}}{N_c}\right) = \frac{1}{2}(W_{dn} + W_{da})E_o \quad \text{(C10)}$$

$E_o$, the electric field at the junction, has the following definition:

$$E_o = \frac{qN_d}{\epsilon_s}\int_0^{W_{dn}}dy = \frac{qN_d}{\epsilon_s}W_{dn} \quad \text{(C11)}$$

Substituting Equation (C9) into Equation (C10) and using Equation (C11):

$$\frac{KT}{q}\ln\left(\frac{N_d}{N_c}\right) = \frac{W_{dn}^2qN_d}{2\epsilon_s}\left(1 + \frac{N_d}{N^*}\right) \quad \text{(C12)}$$

Solving for $W_{dn}$:

$$W_{dn} = \sqrt{\frac{2\epsilon_s \frac{KT}{q} \ln\left(\frac{N_d}{N_c}\right)}{qN_d\left(1 + \frac{N_d}{N^*}\right)}} \quad \text{(C13)}$$

For the special case when $N^* \gg N_d$:

$$W_{dn} = \sqrt{\frac{2\epsilon_s \frac{KT}{q} \ln\left(\frac{N_d}{N_c}\right)}{qN_d}} \quad \text{(C14)}$$

Next, the conditions for injection across the $N+-N_c$ junction given an external electric field in the direction shown in FIG. 18 are examined. If the junction is forward biased by this field, excess carrier concentration is increased exponentially on the lightly doped side of the junction. This excess carrier concentration has a maximum value of $N_d-N_c$. For maximum injection conditions, the total electron concentration is equal on both sides of the junction; i.e., $N_{excess}+N_c=N_{do}$.

Flow carriers in the channel region of any FET are injected there from the source when gate voltage is applied, and from the drain if the drain is at ground potential. Flow carrier distribution within the depth profile of the channel is prescribed by the injection mechanism adjacent the source. Majority carrier injection (or suppression) is a result of the electric field between the gate electrode and the surface of the source diffusion facing the channel. Carriers injected into the end of the channel from the source must not be restricted to the surface region of the channel. Instead, injection should be uniformly distributed in the depth direction of the Fermi channel.

The doping concentration of the source "injecting" diffusion facing the channel should not be excessively high, but rather the impurity concentration should be about 2E18, for N-channel devices, and 4E18 for P-channel devices, and decay rapidly in the lateral direction. This doping concentration and abrupt gradient achieves a useful distribution of excess carrier injection throughout the depth of the Fermi channel thus allowing for high drive current capabilities. Preferably, the center of mass of the injected excess carrier charge (the "moment depth"), lies at a depth about 3 times the thickness of the insulator layer. When the moment depth lies at 3 times the insulator depth Tox, Tub-FET gate capacitance approaches:

$$C_g^* = \frac{e_i}{2T_{ox}} \quad \text{(C15)}$$

Figure 20:
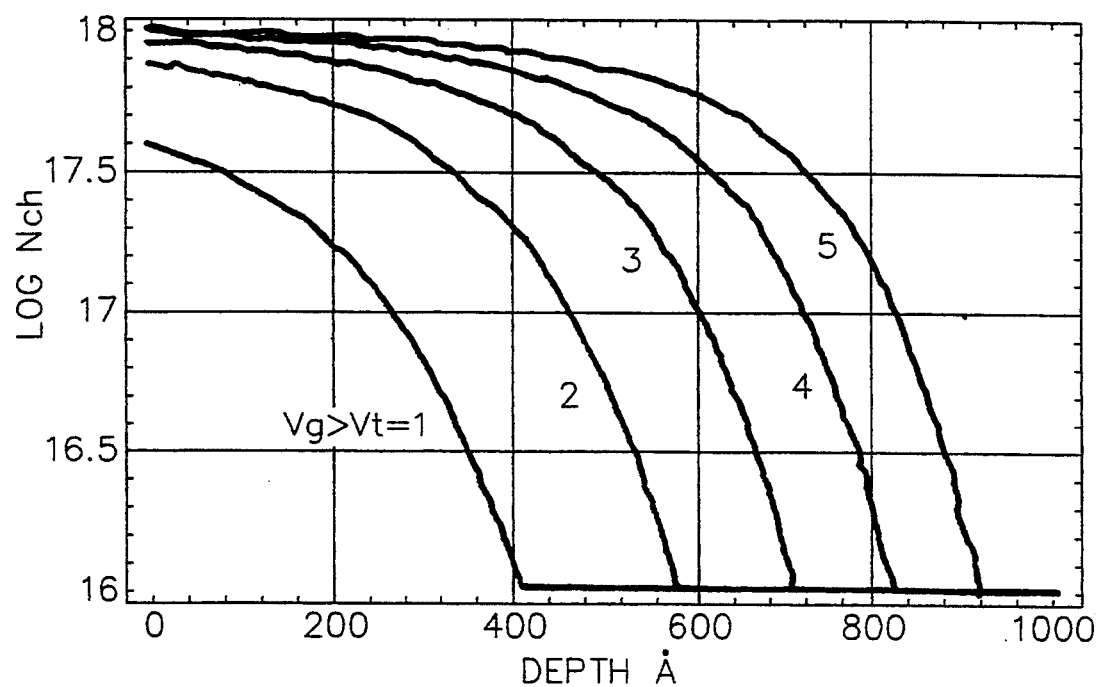
FIG. 20 graphically illustrates simulated profiles of carrier injection as a function of depth for a Fermi-FET.

FIG. 20 illustrates a typical profile of excess carrier injection as a function of depth for the Tub-FET. Gate voltage is illustrated as the running parameter. Diffusion doping concentration near the diffusion contact is 2E19 and about 2E18 facing an N-channel and 4E18 facing a P-channel. The moment depth is about 450 Å at 5 Volts on the gate.

The difference between injector concentration $N_{di}$ and flow concentration $N_{do}$ is a result of the resistive nature of the injector due to its length. The resistivity of P-type material is higher than N-type due to the difference in hole and electron mobility.

Figure 21:
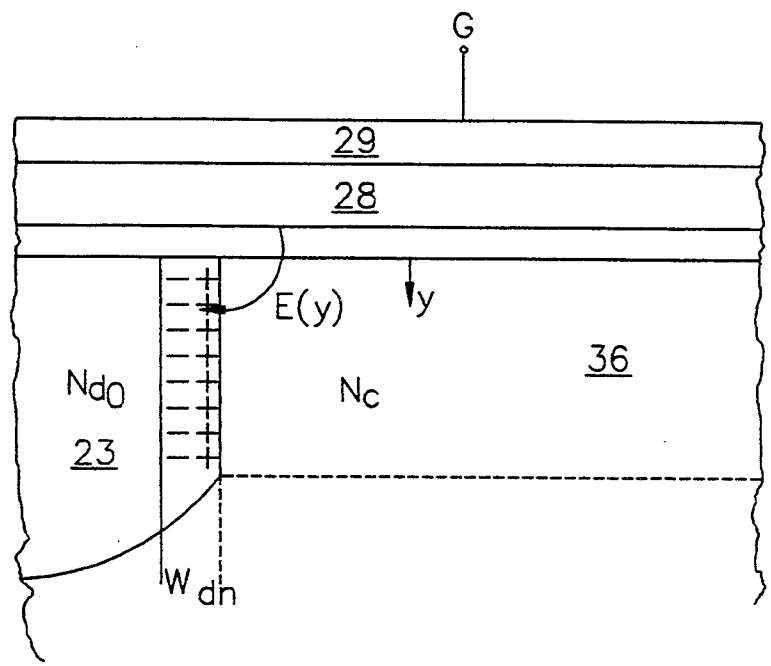
FIG. 21 illustrates an enlarged cross-sectional view of the electric field produced by the gate electrode in a Fermi-FET transistor.

An important aspect of any field effect device is the gate and drain field induced mechanism responsible for carrier injection into the channel region. In the Fermi-FET structure, the electric field produced by the gate electrode attempts to collapse the depleted region on the N+ side of the junction. This situation is illustrated in FIG. 21. The gate electric field that terminates on the diffusion 23 surface facing the channel 36, initiates carrier injection into the channel. The intensity of the gate electric field at depth y below the insulator layer 26 diminishes with distance y and by the screening effects of injected channel carriers located between the insulator surface and field point y. The nature of this screening charge has great bearing on carrier injection at depth y below the insulator-silicon interface. The resistive nature of the injector is ignored in the following analysis.

The following analysis determines the proper structure design criteria that allow significant carrier injection into the Fermi Channel at substantial depth below the gate insulator layer. In order to determine the injection conditions at the source-channel junction, the intensity of the electric field crossing the diffusion-channel junction as a function of depth y below the thin insulator layer is determined. This analysis includes the field screening effects of the excess carriers injected between the field point y and the insulator-silicon interface. Referring to FIG. 20, gate voltage can be represented as follows.

$$V_g = V_{ox} + \int_0^y \int_0^y \frac{qN(y)}{\epsilon_s} \, dy\,dy + E(y)W_{do} + yE(y) + D_jE(y) \quad \text{(C16)}$$

where $W_{do}$ is the depletion depth in the diffusion surface facing the channel. $D_j$ is the diffusion gradient distance that is encountered by graded junctions. Solving Equation (C16) for E(y):

$$E(y) = \frac{V_g - \int_0^y \int_0^y \frac{qN(y)}{\epsilon_s} \, dy\,dy}{\frac{e_s}{e_i} T_{ox} + w_{do} + y + D_j} \quad \text{(C17)}$$

Since the exact distribution of N(y) is not known, Equation (C17) is simplified by observing the fact that N(y) has a maximum value $N_{do}$ at any depth y given high level injection conditions:

$$E(y) = \frac{V_g - \frac{qN_{do}}{\Psi e_s} y^2}{\frac{e_s}{e_i} T_{ox} + W_{do} + y + D_j} \quad \text{(C18)}$$

where $\Psi \geq 2$.

Thus Equations (C17) and (C18) define the intensity of the injecting electric field at the diffusion-channel junction as a function of depth y.

Next, it will be determined how an electric field E(y) causes injection of carriers into the Fermi Channel. The same solution procedures reveals source injection as a result of drain to source voltage. The negative charge developed in the depletion region, $W_{dn}$, that terminates the gate electric field, shrinks the effective width of the depletion region $W_{dn}$ as though a forward bias potential has been applied to the junction. Using the limit form of the divergence theorem to determine surface charge in the N+ region needed to terminate the gate field Ey, the following is obtained:

$$\overline{U} \cdot [D_1 - D_2] = Q_s q N_s^{\frac{2}{3}} \quad \text{(C19)}$$

N is the equivalent volume charge of donor ions that satisfies the surface charge formulation. For our example, the electric displacement vector D2 in region 2 is zero, i.e., $D_2 = 0$. Therefore:

$$\frac{V_g - \frac{qN_{do}}{\psi e_s} y^2}{\frac{e_s}{e_i} T_{ox} + W_{do} + y + D_j} = \frac{qN(y)^{2/3}}{e_s} \quad \text{(C20)}$$

Using Equation (C20) the equivalent volume density of excess charge induced by the gate field within the depletion region of the diffusion can be determined. The result is given below:

Approximate Solution -

$$N(y) = \left[ \frac{e_s}{q} \left( \frac{V_g + \frac{qN_{do}}{\psi e_s} y^2}{y_s + y} \right) \right]^{3/2} \quad \text{(C21)}$$

Exact Solution -

$$N(y) = \left[ \frac{E_s}{q} \left( \frac{V_g - \frac{q}{e_s} \int_0^y \int_0^y N(y) dy dy}{y_s + y} \right) \right]^{3/2} \quad \text{(C22)}$$

Where,
$$Y_s = e_s/e_i T_{ox} + W_{do} + D_i \quad \text{(C23)}$$

Equation (C22) cannot be solved nonrecursively, since the exact form of N(y) is not known. Equation (C21) is an approximate solution that does not require recursive solution procedures and only applies for high level injection conditions. Notice in Equation (C21) that $N_{do}$ appears. This is the maximum injection density of excess carriers and corresponds to the source injection diffusion concentration $N_{do}$, facing the channel on the back side of the diffusion depletion region.

A charge balance equation is now formulated. The net charge in the injection depletion region is reduced by a positive gate field and is expressed by the following:

$$q(N_d - N(y))W_{dn} = qN_d W_{dn}^*(y) \quad \text{(C24)}$$

Therefore the gate field dependent depletion width $W_d^*(y)$ is expressed as follows:

$$W_d^*(y) = W_{do}(1 - N(y)/N_{do}) \quad \text{(C25)}$$

N(y) is given by (C21). Diffusion depletion width $W_{do}$ has already been derived and found to have the following formulation for high level injection and for low level injection:

Subthreshold conditions - high level injection:

$$W_{do} = \sqrt{\frac{2e_s \frac{KT}{q} \ln\left(\frac{N_d N_c}{N_i^2}\right)}{qN_{do}^*}} \quad \text{(C26)}$$

High level injection conditions - low level injection:

$$W_{do} = \sqrt{\frac{2e_s \frac{KT}{q} \ln\left(\frac{N_d}{N_c}\right)}{qN_{do}^*}} \quad \text{(C27)}$$

$W_d^*(y)$ is a function of an effective forward bias potential $V_{fb}$. For the high level injection case $W_d^*$ becomes:

$$W_d^* = f(V_{fb}) = \sqrt{\frac{2e_s \frac{KT}{q} \ln\left(\frac{N_d}{N_c e^{qV_{fb}/KT}}\right)}{qN_{do}^*}} \quad \text{(C28)}$$

For the low level injection case (sub-threshold region) the voltage dependent depletion width is expressed as:

$$W_d^* = f(V_{fb}) = \sqrt{\frac{2e_s \frac{KT}{q} \ln\left(\frac{N_d}{N_c e^{qV_{fb}/KT}}\right)}{qN_{do}^*}} \quad \text{(C28)}$$

Both Equations (C28) and (C29) can be simplified and are given below in terms of the effective forward bias voltage $V_{fb}$:

Low level injection $$W_{dlli}^* = f(V_{fb}) = \sqrt{\frac{2e_s \left[\frac{KT}{q} \ln\left(\frac{N_d N_c}{N_i^2}\right) - V_{fb}\right]}{qN_{do}}} \quad \text{(C30)}$$

High level injection $$W_{dhli}^* = f(V_{fb}) = \sqrt{\frac{2e_s \left[\frac{KT}{q} \ln\left(\frac{N_{do}}{N_c}\right) - V_{fb}\right]}{qN_{do}}} \quad \text{(C31)}$$

Equating (C30) and (C31) and (C25), an expression for the effective forward bias voltage $V_{fb}$ as induced by the gate field is found:

Sub-threshold region or low level injection $$\sqrt{\frac{2e_s \left[\frac{KT}{q} \ln\left(\frac{N_{do} N_c}{N_i^2}\right)\right]}{qN_{do}}} \left(1 - \frac{N(y)}{N_{do}}\right) = \quad \text{(C32)}$$

$$\sqrt{\frac{2e_s \left[\frac{KT}{q} \ln\left(\frac{N_{do} N_c}{N_i^2}\right) - V_{fb}\right]}{qN_{do}}}$$

Which simplifies to:

$$\left(1 - \frac{N(y)}{N_{do}}\right) = \sqrt{1 - \frac{V_{fb}}{\frac{KT}{q} \ln\left(\frac{N_{do} N_c}{N_i^2}\right)}} \quad \text{(C33)}$$

Squaring both sides of Equation (C33) and solving for effective forward bias voltage $V_{fb}$:

Sub-threshold region $$V_{fb} = \frac{KT}{q} \ln\left(\frac{N_{do}N_c}{N_i^2}\right)\left[1 - \left(1 - \frac{N(y)}{N_{do}^*}\right)^2\right] \quad \text{(C34)}$$

High level injection $$V_{fb} = \frac{KT}{q} \ln\left(\frac{N_{do}}{N_c}\right)\left[1 - \left(1 - \frac{N(y)}{N_{do}^*}\right)^2\right] \quad \text{(C35)}$$

Equations (C34) and (C35) can be used to determine channel carrier concentration and current for both sub-threshold and high level injection conditions. To determine excess carrier concentration injected into the channel region, the following equation form is used:

High level injection
$$N_{ch}(y) = N_c e^{qV_{fb}/KT} \quad \text{(C36)}$$

Sub-threshold
$$N_{ch}(y) = \frac{N_i^2}{N_c} e^{qV_{fb}/KT} \quad \text{(C37)}$$

Substituting Equations (C34) and (C35):

Low level injection
$$N_{ch}(y) = \frac{N_i^2}{N_c}\left(\frac{N_{do}N_c}{N_i^2}\right)^{\left[1-\left(1-\frac{N(y)}{N_{do}^*}\right)^2\right]} \quad \text{(C38)}$$

High level injection
$$N_{ch}(y) = N_c\left(\frac{N_{do}}{N_c}\right)^{\left[1-\left(1-\frac{N(y)}{N_{do}^*}\right)^2\right]} \quad \text{(C39)}$$

For the high level injection regime N(y) is specified as follows:

$$N(y) = \left[\frac{e_s}{q}\left(\frac{V_g - \frac{qN_{do}}{\psi e_s}}{y_s + y}\right)\right]^{3/2} \quad \text{(C40)}$$

If this form of N(y) is not used then recursive solution techniques must be used.

For low level injection, i.e., the sub threshold region, N(y) is:

$$N(y) = \left[\frac{e_s}{q}\left(\frac{V_b}{y_s + y}\right)\right]^{3/2} \quad \text{(C41)}$$

When plotting Equation (C40) the following condition is observed:

$$\left[\frac{e_s}{q}\left(\frac{V_g - \frac{qN_{do}}{\psi e_s}y^2}{y_s + y}\right)\right]^{3/2} \leq N_{do} \quad \text{(C42)}$$

where $Y_s = e_s/e_i T_{ox} + W_{do} + D_j$ (C43)

One can approximate channel current as a result of the above solutions for the channel concentration factor $N_{ch}$. The current capabilities of Fermi-FET devices with high moment depth are much greater than MOS or buried channel devices with low moment depth.

$$I_{sat} = qV_{sat}Z \int_0^\delta N_{ch}(y)dy \quad \text{(C44)}$$

The simplest formulation for gate field induced injection of channel carriers is summarized below:

High Level Injection $$N_{ch} = N_c\left(\frac{N_{do}}{N_c}\right)^{P_1} \quad \text{(C45)}$$

$$Y_s = e_s/e_i T_{ox} + W_{do} + D_j \quad \text{(C46)}$$

$$W_{do} = \sqrt{\frac{2e_s \frac{KT}{q} \ln\left(\frac{N_d}{N_c}\right)}{qN_{do}}} \quad \text{(C47)}$$

$$P_1 = 1 - \left(1 - \frac{\left(\frac{e_s}{q}\left(\frac{V_g - \frac{qN_{do}}{\psi e_s}y^2}{y_s + y}\right)\right)^{3/2}}{N_{do}^*}\right)^2 \quad \text{(C48)}$$

Low Level Gate Controlled Injection $$N_{ch} = \frac{N_i^2}{N_c}\left(\frac{N_{do}N_c}{N_i^2}\right)^{P_2} \quad \text{(C49)}$$

$$W_{do} = \sqrt{\frac{2e_s \frac{KT}{q} \ln\left(\frac{N_d N_c}{N_i^2}\right)}{qN_{do}}} \quad \text{(C50)}$$

$$P_2 = 1 - \left(1 - \frac{\left(\frac{e_s}{q}\left(\frac{V_g}{Y_s}\right)\right)^{3/2}}{N_{do}^*}\right)^2 \quad \text{(C51)}$$

For drain induced injection $$N_{ch} = \frac{N_i^2}{N_c}\left(\frac{N_{do}N_c}{N_i^2}\right)^{P_3} \quad \text{(C52)}$$

$$W_{do} = \sqrt{\frac{2e_s \frac{KT}{q} \ln\left(\frac{N_d N_c}{N_i^2}\right)}{qN_{do}}} \quad \text{(C53)}$$

$$P_3 = 1 - \left(1 - \frac{\left(\frac{e_s}{q}\left(\frac{V_d}{L_o + W_{do}}\right)\right)^{3/2}}{N_{do}^*}\right)^2 \quad \text{(C54)}$$

Figure 22A:
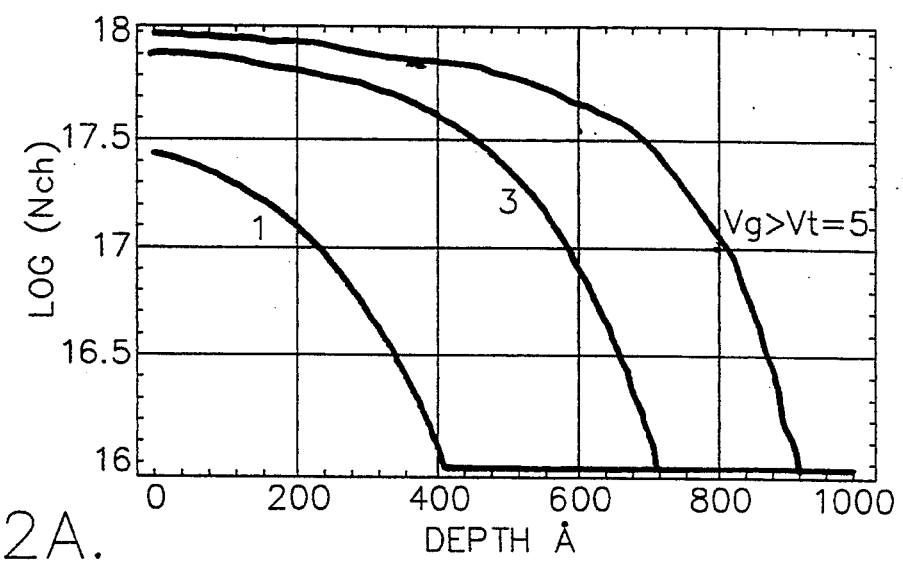
FIG. 22A graphically illustrates simulated carrier concentration as a function of depth for a typical Fermi-FET.
Figure 22B:
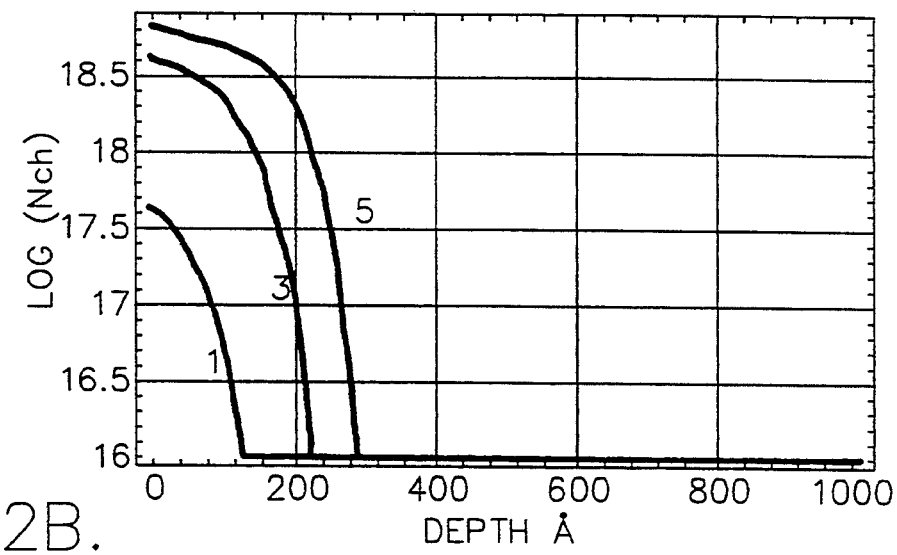
FIGS. 22B and 22C graphically illustrate simulated carrier concentration as a function of depth in the channel of a conventional MOSFET.
Figure 22C:
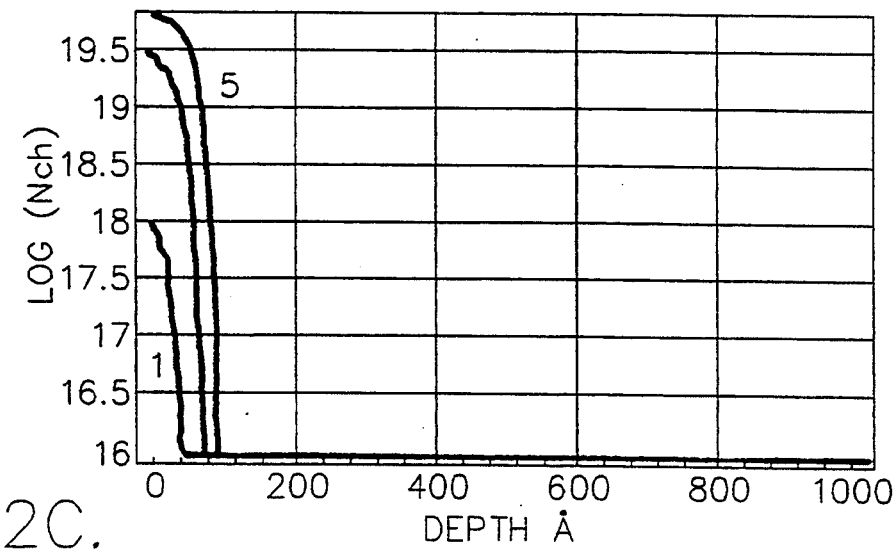

FIGS. 22A and 22C are plots of channel carrier concentration as a function of depth y below face 21a for the high level injection regime. In FIG. 22A, $N_d=1E18$; in FIG. 22B, $N_d=1E19$; and in FIG. 22C, $N_d=1E20$. These figures reveal that deep channel injection requires moderate impurity concentration in the injecting diffusions facing the channel. The nominal impurity concentration for the Tub-FET is about 2E18 cm$^{-3}$, if gate capacitance is to be half the nominal MOS value. Good non rectifying contact to diffusions in back of the injector may require silicide techniques and possibly implantation through the diffusion contact via holes. This technique raises the impurity concentration at the contact to the high 1E19 range.

FIGS. 22B and 22C typify MOS and buried channel technology as far as flow depth is concerned. Moment depth of the charge in the inversion layer is less than 60 Å given 5 Volts on the gate. FIG. 22A reflects Fermi-FET technology where the moment depth of injected charge is about 650 Å.

Figure 23:
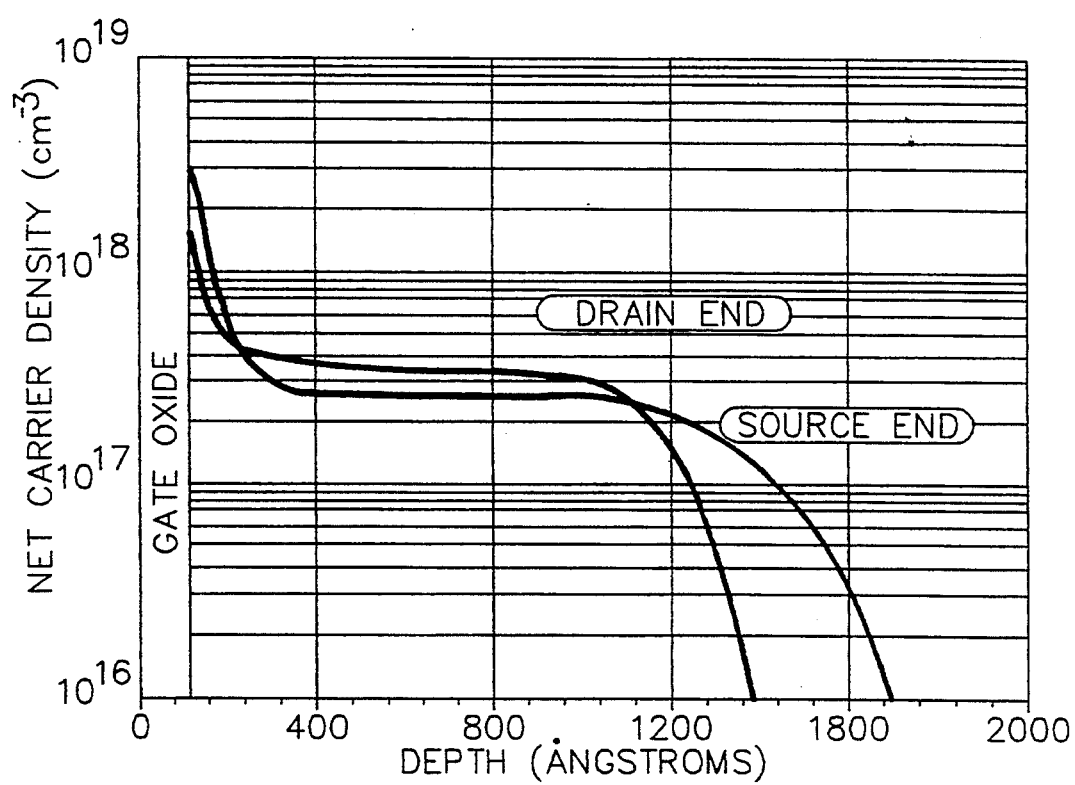
FIG. 23 graphically illustrates simulated excess carrier distribution injected into the source end of the channel and acquired at the drain end of a Fermi-FET.

FIG. 23 is a simulated plot of excess carrier distribution injected into the source end of the channel region of an N-channel Fermi-FET, when Nc=1.5E16, $N_{do}$=1E18, $N_{do2}$=2E19, $L_o$=0.8μ, $T_{ox}$=140 Å SiO2, or 250 Å Si3N4, Vg=5V, and $V_d$=6V. FIG. 23 also illustrates a simulated plot of the flow charge distribution at the drain end of the channel resulting from the injected charge distribution. Notice the similarity of the plot with FIG. 22A that predicts the theoretical injected charge distribution for the conditions stated. The moment depth of this charge distribution is about 550 Å. Under these circumstances, gate capacitance Cg* has the value of about 1.54E-7 Farads/cm² as opposed to $e_i/T_{ox}$=2.46E-7 Farads/cm². Clearly gate capacitance can be reduced by the Tub-FET structure design.

There is another analysis technique to discover the details of gate and drain induced injection. This analysis technique equates forward bias potential $V_{fb}$ to the product of electric field E(y) and the effective diffusion depletion width $W_{do}$. This analysis technique is presented below for high level injection.

The injecting electric field has already been developed and is given by Equations (C17) and (C18). The carrier concentration injected into the channel region as a function of depth is $N_{ch}(y)$.

$$N_{ch}(y) = N_c e^{\frac{qV_{fb}}{KT}} \tag{C55}$$

The equivalent forward bias potential $V_{fb}$ driving the high level injection process is:

$$V_{fb} = E(y)\sqrt{\frac{2e_s}{qN_d(y)} \frac{KT}{q} \ln\left(\frac{N_d(y)}{N_c e^{qV_{fb}/KT}}\right)} \tag{C56}$$

Equation (C56) can be rearranged into simpler form:

$$V_{fb} = E(y)\sqrt{\frac{2e_s}{qN_d(y)}\left(\frac{KT}{q}\ln\left(\frac{N_d(y)}{N_c}\right) - V_{fb}\right)} \tag{C57}$$

Equation (C57) leads to a quadratic in $V_{fb}$.

$$V_{fb} = \frac{A}{2}\left[\sqrt{1 + \frac{4V_o}{A}} - 1\right] \tag{C58}$$

Where;

$$A = E(y)^2 \frac{2e_s}{qN_d(y)} \tag{C59}$$

$$E(y) = \frac{V_g - \int_0^y \int_0^y \frac{qN(y)}{e_s} dy dy}{\frac{e_s}{e_i} T_{ox} + W_{do} + y + D_j} \tag{C60}$$

$$V_o = \frac{KT}{q} \ln\left(\frac{N_d(y)}{N_c}\right) \tag{C61}$$

Substitution into Equation (C55) yields $$N_{ch}(y) = N_c e^{\frac{q}{KT} \frac{A}{2}\left[\sqrt{1 + \frac{4V_o}{A}} - 1\right]} \tag{C62}$$

Again, recursive solution techniques are required unless Equation (C60) is simplified to the following:

$$E(y) = \frac{(V_g - V_t) - \frac{qN_{do}}{\psi e_s} y^2}{\frac{e_s}{e_i} T_{ox} + W_{do} + y + d_j} \tag{C63}$$

FIGS. 22A–22C illustrate the carrier concentration injected into the Fermi N-channel as a function of depth y for a diffusion injector concentration of 1E18 per cubic cm. The moment depth for channel charge is about 550 Å, deep enough to lower Fermi-FET gate capacitance below the MOS value by at least a factor of 2. In FIGS. 22A–22C, gate voltage above threshold is shown in the range of 1 to 5 volts. A SiO2 insulator gate thickness of 140 Å, or a Si3N4 gate is 250 Å. FIGS. 22B and 22C illustrate injection depth when the diffusion concentration facing the channel is greater than 1E19 per cubic cm. These graphs depict conditions quite similar to MOS behavior. The moment depth for channel charge is less than 100 Å for these diffusion concentrations. Notice in FIG. 22C that injection efficiency is poor and excess charge is confined to shallow depths. This is characteristic of FET devices constructed with diffusion concentrations in the high 10E19 range. Lowering gate capacitance and increasing saturation current of MOS devices by using these teachings is troubled by shallow inversion depth.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:
1. A field effect transistor comprising:
a semiconductor substrate of first conductivity type;
a tub region of second conductivity type in said substrate at a surface thereof;
spaced apart source and drain regions of said second conductivity type in said tub region at said substrate surface;
a source injector region of said second conductivity type, adjacent said source region and facing said drain region;
a gate insulating layer on said substrate at said substrate surface, between said spaced apart source and drain regions;
source, drain and gate electrodes contacting said source and drain regions and said gate insulating layer, respectively; and
a substrate contact region of said first conductivity type in said tub region at said substrate surface.

2. The field effect transistor of claim 1 wherein said tub region is doped said second conductivity type at a relatively low doping concentration, wherein said source region is doped said second conductivity type at a relatively high doping concentration, and wherein said source injector region is doped said second conductivity type at an intermediate doping concentration between that of said tub region and said source region.

3. The field effect transistor of claim 1 further comprising a gate sidewall spacer on said substrate surface, extending from adjacent said source injector region to adjacent said gate electrode.

4. The field effect transistor of claim 3 wherein said gate sidewall spacer comprises an insulator having permittivity which is greater than the permittivity of said gate insulating layer.

5. The field effect transistor of claim 4 wherein said gate insulating layer comprises silicon dioxide and wherein said gate sidewall spacer comprises silicon nitride.

6. The field effect transistor of claim 3 wherein said gate electrode includes a polysilicon gate electrode layer of said first conductivity type on said gate insulating layer opposite said substrate surface, said polysilicon gate electrode layer including a polysilicon sidewall, and wherein said gate sidewall spacer extends from adjacent said source injector region to adjacent said polysilicon sidewall.

7. The field effect transistor of claim 6 wherein said gate sidewall spacer comprises an insulator having permittivity which is greater than the permittivity of said gate insulating layer.

8. The field effect transistor of claim 7 wherein said gate insulating layer comprises silicon dioxide and wherein said gate sidewall spacer comprises silicon nitride.

9. The field effect transistor of claim 3 wherein said source injector region extends to said substrate surface, wherein said gate insulating layer extends onto said source injector region at said substrate surface, and wherein said gate sidewall spacer also extends onto said source injector region at said substrate surface.

10. The field effect transistor of claim 9 wherein said gate sidewall spacer comprises an insulator having permittivity which is greater than the permittivity of said gate insulating layer.

11. The field effect transistor of claim 10 wherein said gate insulating layer comprises silicon dioxide and wherein said gate sidewall spacer comprises silicon nitride.

12. The field effect transistor of claim 1 wherein said tub extends into said substrate a first predetermined depth from said substrate surface, said field effect transistor further comprising a bottom leakage controlling region of said first conductivity type in said substrate, extending across said substrate between extensions of said source and drain regions, and extending into said substrate from a second depth which is less than said first depth, to a third depth which is greater than said first depth.

13. The field effect transistor of claim 12 wherein said substrate is doped said first conductivity type at a relatively low doping concentration and wherein said bottom leakage control region is doped said first conductivity type at a relatively high doping concentration.

14. The field effect transistor of claim 1 wherein said tub extends into said substrate a first predetermined depth from said substrate surface; wherein said source region extends into said substrate a second predetermined depth from said substrate surface; and wherein said source injector region extends into said substrate a third predetermined depth which is between said second predetermined depth and said first predetermined depth.

15. The field effect transistor of claim 1 wherein said tub extends into said substrate a predetermined depth from said substrate surface and wherein said source injector region also extends into said substrate to said predetermined depth.

16. The field effect transistor of claim 1 further comprising a channel of said second conductivity type in said tub region at said substrate surface, between said spaced apart source and drain regions; wherein said channel extends a first predetermined depth from said substrate surface and said tub region extends a second predetermined depth from said channel, at least one of said first and second predetermined depths being selected to produce zero static electric field perpendicular to said substrate surface at said first predetermined depth.

17. The field effect transistor of claim 1 wherein said tub region extends a predetermined depth from said substrate surface, at least said predetermined depth being selected to produce a threshold voltage for said field effect transistor which is twice the Fermi potential of said semiconductor substrate.

18. The field effect transistor of claim 1 wherein said tub region extends a predetermined depth from said substrate surface, at least said predetermined depth being selected to allow carriers of said second conductivity type to flow from said source region to said drain region in said tub region, extending from a second predetermined depth between said predetermined depth and said substrate surface towards said substrate surface, upon application of voltage to said gate electrode beyond the threshold voltage of said field effect transistor.

19. The field effect transistor of claim 1 wherein said tub region extends a predetermined depth from said substrate surface, at least said predetermined depth being selected to allow carriers of said second conductivity type to flow within said tub region, from said source region to said drain region and beneath said substrate surface, without creating an inversion layer in said tub region.

20. The field effect transistor of claim 1 wherein said tub region extends a predetermined depth from said substrate surface, at least said predetermined depth being selected to produce a first gate capacitance upon biasing said gate electrode from below the threshold voltage of said field effect transistor to said threshold voltage, and to produce a second gate capacitance upon biasing said gate electrode from above said threshold voltage to said threshold voltage.

21. The field effect transistor of claim 1 further comprising a substrate contact for electrically contacting said substrate; wherein said tub region extends a predetermined depth from said substrate surface, wherein said gate electrode includes a polysilicon layer of said first conductivity type and a conductive electrode on said polysilicon layer opposite said gate insulating layer; at least said predetermined depth being selected to produce a voltage at said substrate surface, adjacent said gate insulating layer, which is equal and opposite to the sum of the voltage between said substrate contact and said substrate and between said polysilicon layer and said conductive electrode.

22. The field effect transistor of claim 1 wherein said gate insulating layer is of predetermined thickness, and wherein said tub region extends a predetermined depth from said substrate surface, at least said predetermined depth being selected to produce a threshold voltage for said field effect transistor which is independent of said predetermined thickness, and current for said field effect transistor which increases inversely to said predetermined thickness.

23. A field effect transistor comprising:
a semiconductor substrate of first conductivity type:
a tub region of second conductivity type in said substrate at a surface thereof;
spaced apart source injector tub and drain injector tub regions of said second conductivity type in said tub region at said substrate surface;
a source region of said second conductivity type at least partially within said source injector tub region;
a drain region of said second conductivity type at least partially within said drain injector tub region;
a gate insulating layer on said substrate at said substrate surface, between said source and drain regions;
source, drain and gate electrodes contacting said source and drain regions and said gate insulating layer, respectively; and
a substrate contact region of said first conductivity type in said tub region at said substrate surface.

24. The field effect transistor of claim 23 wherein said tub region is doped said second conductivity type at a relatively low doping concentration, wherein said source and drain regions are doped said second conductivity type at a relatively high doping concentration, and wherein said source and drain injector tub regions are doped said second conductivity type at an intermediate doping concentration between that of said tub region and said source and drain regions.

25. The field effect transistor of claim 23 further comprising at least one gate sidewall spacer on said substrate surface, extending from adjacent said source injector tub region to adjacent said gate electrode, and from adjacent said drain injector tub region to adjacent said gate electrode.

26. The field effect transistor of claim 25 wherein said at least one gate sidewall spacer comprises an insulator having permittivity which is greater than the permittivity of said gate insulating layer.

27. The field effect transistor of claim 26 wherein said gate insulating layer comprises silicon dioxide and wherein said at least one gate sidewall spacer comprises silicon nitride.

28. The field effect transistor of claim 25 wherein said gate electrode includes a polysilicon gate electrode layer of said first conductivity type on said gate insulating layer opposite said substrate surface, said polysilicon gate electrode layer including at least one polysilicon sidewall, and wherein said at least one gate sidewall spacer extends from adjacent said source injector tub region to adjacent said at least one polysilicon sidewall, and from adjacent said drain injector tub region to adjacent said at least one polysilicon sidewall.

29. The field effect transistor of claim 28 wherein said at least one gate sidewall spacer comprises an insulator having permittivity which is greater than the permittivity of said gate insulating layer.

30. The field effect transistor of claim 29 wherein said gate insulating layer comprises silicon dioxide and wherein said at least one gate sidewall spacer comprises silicon nitride.

31. The field effect transistor of claim 25 said source injector tub region extends to said substrate surface, wherein said gate insulating layer extends onto said source injector tub region at said substrate surface, wherein said at least one gate sidewall spacer also extends onto said source injector tub region at said substrate surface, wherein said drain injector tub region extends to said substrate surface, wherein said gate insulating layer extends onto said drain injector tub region at said substrate surface, and wherein said at least one gate sidewall spacer also extends onto said drain injector tub region at said substrate surface.

32. The field effect transistor of claim 31 wherein said at least one gate sidewall spacer comprises an insulator having permittivity which is greater than the permittivity of said gate insulating layer.

33. The field effect transistor of claim 32 wherein said gate insulating layer comprises silicon dioxide and wherein said at least one gate sidewall spacer comprises silicon nitride.

34. The field effect transistor of claim 23 wherein said source region includes a source sidewall and a source bottom, wherein said source sidewall is within said source injector tub region and wherein said source bottom extends outside said source injector tub region.

35. The field effect transistor of claim 23 wherein said tub region extends into said substrate a first predetermined depth from said substrate surface, said field effect transistor further comprising a bottom leakage controlling region of said first conductivity type in said substrate, extending across said substrate between extensions of said source and drain regions, and extending into said substrate from a second depth which is less than said first depth, to a third depth which is greater than said first depth.

36. The field effect transistor of claim 35 wherein said substrate is doped said first conductivity type at a relatively low doping concentration and wherein said bottom leakage control region is doped said first conductivity type at a relatively high doping concentration.

37. The field effect transistor of claim 23 wherein said tub region extends into said substrate a first predetermined depth from said substrate surface; wherein said source region and said drain region extend into said substrate a second predetermined depth from said substrate surface; and wherein said source injector tub region and said drain injector tub region extend into said substrate a third predetermined depth which is between said second predetermined depth and said first predetermined depth.

38. The field effect transistor of claim 23 wherein said tub region extends into said substrate a predetermined depth from said substrate surface and wherein said source injector tub region and said drain injector tub region also extend into said substrate to said predetermined depth.

39. The field effect transistor of claim 23 further comprising a channel of said second conductivity type in said tub region at said substrate surface, between said spaced apart source and drain regions; wherein said channel extends a first predetermined depth from said substrate surface and said tub region extends a second predetermined depth from said channel, at least one of said first and second predetermined depths being selected to produce zero static electric field perpendicular to said substrate surface at said first predetermined depth.

40. The field effect transistor of claim 23 wherein said tub region extends a predetermined depth from said substrate surface, at least said predetermined depth being selected to produce a threshold voltage for said field effect transistor which is twice the Fermi potential of said semiconductor substrate.

41. The field effect transistor of claim 23 wherein said tub region extends a predetermined depth from said substrate surface, at least said predetermined depth being selected to allow carriers of said second conductivity type to flow from said source region to said drain region in said tub region, extending from a second predetermined depth between said predetermined depth and said substrate surface towards said first surface, upon application of voltage to said gate electrode beyond the threshold voltage of said field effect transistor.

42. The field effect transistor of claim 23 wherein said tub region extends a predetermined depth from said substrate surface, at least said predetermined depth being selected to allow carriers of said second conductivity type to flow within said tub region, from said source region to said drain region and beneath said substrate surface, without creating an inversion layer in said tub region.

43. The field effect transistor of claim 23 wherein said tub region extends a predetermined depth from said substrate surface, at least said predetermined depth being selected to produce a first gate capacitance upon biasing said gate electrode from below the threshold voltage of said field effect transistor to said threshold voltage, and to produce a second gate capacitance upon biasing said gate electrode from above said threshold voltage to said threshold voltage.

44. The field effect transistor of claim 23 further comprising a substrate contact for electrically contacting said substrate; wherein said tub region extends a predetermined depth from said substrate surface, wherein said gate electrode includes a polysilicon layer of said first conductivity type and a conductive electrode on said polysilicon layer opposite said gate insulating layer; at least said predetermined depth being selected to produce a voltage at said substrate surface, adjacent said gate insulating layer, which is equal and opposite to the sum of the voltage between said substrate contact and said substrate and between said polysilicon layer and said conductive electrode.

45. The field effect transistor of claim 23 wherein said gate insulating layer is of predetermined thickness, and wherein said tub region extends a predetermined depth from said substrate surface, at least said predetermined depth being selected to produce a threshold voltage for said field effect transistor which is independent of said predetermined thickness, and current for said field effect transistor which increases inversely to said predetermined thickness.

46. A field effect transistor comprising:
a semiconductor substrate of first conductivity type;
a tub region of second conductivity type in said substrate;
spaced apart source and drain regions of said second conductivity type in said tub region;
a channel of said second conductivity type, in said tub region, between said spaced apart source and drain regions;
means for enhancing injection of carriers from said source region into said channel, at a predetermined depth in said channel;
a gate insulating layer on said substrate adjacent said channel, between said spaced apart source and drain regions; and
source, drain and gate electrodes contacting said source and drain regions and said gate insulating layer, respectively, wherein said channel is of a first predetermined depth and said tub region is of a second predetermined depth, at least one of said first and second predetermined depths being selected to produce zero static electric field at the interface of said channel and said tub region, perpendicular thereto.

47. The field effect transistor of claim 46 wherein said injection enhancing means comprises a source injector region of said second conductivity type, adjacent said source region and facing said drain region.

48. The field effect transistor of claim 47 wherein said source region is of a third predetermined depth; and wherein said source injector region is of a fourth predetermined depth which is between said third predetermined depth and said second first predetermined depth.

49. The field effect transistor of claim 47 wherein said source injector region is also of said second predetermined depth.

50. The field effect transistor of claim 46 further comprising a bottom leakage controlling region of said first conductivity type in said substrate, extending between extensions of said source and drain regions, and extending partially into said tub region.

51. The field effect transistor of claim 46 wherein at least said second predetermined depth being selected to produce a threshold voltage for said field effect transistor which is twice the Fermi potential of said semiconductor substrate.

52. A field effect transistor comprising:
a semiconductor substrate of first conductivity type;
a tub region of second conductivity type in said substrate at a surface thereof, and extending into said substrate a first predetermined depth from said substrate surface;
spaced apart source and drain regions of said second conductivity type in said tub region at said substrate surface;
a channel of said second conductivity type, in said tub region, between said spaced apart source and drain regions, and forming an interface with said tub region, at least said first predetermined depth being selected to produce zero static electric field at the interface of said channel and said tub region, perpendicular thereto;
a bottom leakage controlling region of said first conductivity type in said substrate, extending across said substrate between extensions of said source and drain regions and extending into said substrate from a third depth which is less than said first depth to a fourth depth which is greater than said first depth;
a gate insulating layer on said substrate at said substrate surface, between said spaced apart source and drain regions; and
source, drain and gate electrodes contacting said source and drain regions and said gate insulating layer, respectively.

53. The field effect transistor of claim 52 wherein said substrate is doped said first conductivity type at a relatively low doping concentration and wherein said bottom leakage control region is doped said first conductivity type at a relatively high doping concentration.

54. The field effect transistor of claim 52 wherein at least said first predetermined depth is selected to produce a threshold voltage for said field effect transistor which is twice the Fermi potential of said semiconductor substrate.

55. A field effect transistor comprising:
a semiconductor substrate of first conductivity type;
a tub region of second conductivity type in said substrate at a surface thereof;
spaced apart source and drain regions of said second conductivity type in said tub region at said substrate surface;
a source injector region of said second conductivity type, adjacent said source region and facing said drain region;
a channel of said second conductivity type in said tub region at said substrate surface, between said spaced apart source and drain regions, wherein said channel extends a first predetermined depth from said substrate surface and said tub region extends a second predetermined depth from said channel, at least one of said first and second predetermined depths being selected to produce zero static electric field perpendicular to said substrate surface at said first predetermined depth;
a gate insulating layer on said substrate at said substrate surface, between said spaced apart source and drain regions; and
source, drain and gate electrodes contacting said source and drain regions and said gate insulating layer, respectively.

56. The field effect transistor of claim 55 wherein said tub region is doped said second conductivity type at a relatively low doping concentration, wherein said source region is doped said second conductivity type at a relatively high doping concentration, and wherein said source injector region is doped said second conductivity type at an intermediate doping concentration between that of said tub region and said source region.

57. The field effect transistor of claim 55 further comprising a gate sidewall spacer on said substrate surface, extending from adjacent said source injector region to adjacent said gate electrode.

58. The field effect transistor of claim 57 wherein said gate sidewall spacer comprises an insulator having permittivity which is greater than the permittivity of said gate insulating layer.

59. The field effect transistor of claim 58 wherein said gate insulating layer comprises silicon dioxide and wherein said gate sidewall spacer comprises silicon nitride.

60. The field effect transistor of claim 57 wherein said gate electrode includes a polysilicon gate electrode layer of said first conductivity type on said gate insulating layer opposite said substrate surface, said polysilicon gate electrode layer including a polysilicon sidewall, and wherein said gate sidewall spacer extends from adjacent said source injector region to adjacent said polysilicon sidewall.

61. The field effect transistor of claim 60 wherein said gate sidewall spacer comprises an insulator having permittivity which is greater than the permittivity of said gate insulating layer.

62. The field effect transistor of claim 61 wherein said gate insulating layer comprises silicon dioxide and wherein said gate sidewall spacer comprises silicon nitride.

63. The field effect transistor of claim 57 wherein said source injector region extends to said substrate surface, wherein said gate insulating layer extends onto said source injector region at said substrate surface, and wherein said gate sidewall spacer also extends onto said source injector region at said substrate surface.

64. The field effect transistor of claim 63 wherein said gate sidewall spacer comprises an insulator having permittivity which is greater than the permittivity of said gate insulating layer.

65. The field effect transistor of claim 64 wherein said gate insulating layer comprises silicon dioxide and wherein said gate sidewall spacer comprises silicon nitride.

66. The field effect transistor of claim 55 wherein said tub region extends into said substrate a third predetermined depth from said substrate surface, said field effect transistor further comprising a bottom leakage controlling region of said first conductivity type in said substrate, extending across said substrate between extensions of said source and drain regions, and extending into said substrate from a fourth depth which is less than said third depth, to a fifth depth which is greater than said first depth.

67. The field effect transistor of claim 66 wherein said substrate is doped said first conductivity type at a relatively low doping concentration and wherein said bottom leakage control region is doped said first conductivity type at a relatively high doping concentration.

68. The field effect transistor of claim 55 further comprising a substrate contact region of said first conductivity type in said tub region at said substrate surface.

69. The field effect transistor of claim 55 wherein said tub region extends into said substrate a third predetermined depth from said substrate surface; wherein said source region extends into said substrate a fourth predetermined depth from said substrate surface; and wherein said source injector region extends into said substrate a fifth predetermined depth which is between said fourth predetermined depth and said third predetermined depth.

70. The field effect transistor of claim 55 wherein said tub extends into said substrate a third predetermined depth from said substrate surface and wherein said source injector region also extends into said substrate to said third predetermined depth.

71. The field effect transistor of claim 55 wherein said tub region extends a third predetermined depth from said substrate surface, at least said third predetermined depth being selected to produce a threshold voltage for said field effect transistor which is twice the Fermi potential of said semiconductor substrate.

72. The field effect transistor of claim 55 wherein said tub region extends a third predetermined depth from said substrate surface, at least said third predetermined depth being selected to allow carriers of said second conductivity type to flow from said source region to said drain region in said tub region, extending from a fourth predetermined depth between said third predetermined depth and said substrate surface towards said substrate surface, upon application of voltage to said gate electrode beyond the threshold voltage of said field effect transistor.

73. The field effect transistor of claim 55 wherein said tub region extends a third predetermined depth from said substrate surface, at least said third predetermined depth being selected to allow carriers of said second conductivity type to flow within said tub region, from said source region to said drain region and beneath said substrate surface, without creating an inversion layer in said tub region.

74. The field effect transistor of claim 55 wherein said tub region extends a third predetermined depth from said substrate surface, at least said third predetermined depth being selected to produce a first gate capacitance upon biasing said gate electrode from below the threshold voltage of said field effect transistor to said threshold voltage, and to produce a second gate capacitance upon biasing said gate electrode from above said threshold voltage to said threshold voltage.

75. The field effect transistor of claim 55 further comprising a substrate contact for electrically contacting said substrate; wherein said tub region extends a third predetermined depth from said substrate surface, wherein said gate electrode includes a polysilicon layer of said first conductivity type and a conductive electrode on said polysilicon layer opposite said gate insulating layer; at least said third predetermined depth being selected to produce a voltage at said substrate surface, adjacent said gate insulating layer, which is equal and opposite to the sum of the voltage between said substrate contact and said substrate and between said polysilicon layer and said conductive electrode.

76. The field effect transistor of claim 55 wherein said gate insulating layer is of predetermined thickness, and wherein said tub region extends a third predetermined depth from said substrate surface, at least said third predetermined depth being selected to produce a threshold voltage for said field effect transistor which is independent of said predetermined thickness, and current for said field effect transistor which increases inversely to said predetermined thickness.

77. A field effect transistor comprising:
a semiconductor substrate of first conductivity type:
a tub region of second conductivity type in said substrate at a surface thereof;
spaced apart source injector tub and drain injector tub regions of said second conductivity type in said tub region at said substrate surface;
a source region of said second conductivity type at least partially within said source injector tub region;
a drain region of said second conductivity type at least partially within said drain injector tub region;
a channel of said second conductivity type in said tub region at said substrate surface, between said spaced apart source and drain regions, wherein said channel extends a first predetermined depth from said substrate surface and said tub region extends a second predetermined depth from said channel, at least one of said first and second predetermined depths being selected to produce zero static electric field perpendicular to said substrate surface at said first predetermined depth;
a gate insulating layer on said substrate at said substrate surface, between said source and drain regions; and
source, drain and gate electrodes contacting said source and drain regions and said gate insulating layer, respectively.

78. The field effect transistor of claim 77 wherein said tub region is doped said second conductivity type at a relatively low doping concentration, wherein said source and drain regions are doped said second conductivity type at a relatively high doping concentration, and wherein said source and drain injector tub regions are doped said second conductivity type at an intermediate doping concentration between that of said tub region and said source and drain regions.

79. The field effect transistor of claim 77 further comprising at least one gate sidewall spacer on said substrate surface, extending from adjacent said source injector tub region to adjacent said gate electrode, and from adjacent said drain injector tub region to adjacent said gate electrode.

80. The field effect transistor of claim 79 wherein said at least one gate sidewall spacer comprises an insulator having permittivity which is greater than the permittivity of said gate insulating layer.

81. The field effect transistor of claim 80 wherein said gate insulating layer comprises silicon dioxide and wherein said at least one gate sidewall spacer comprises silicon nitride.

82. The field effect transistor of claim 79 wherein said gate electrode includes a polysilicon gate electrode layer of said first conductivity type on said gate insulating layer opposite said substrate surface, said polysilicon gate electrode layer including at least one polysilicon sidewall, and wherein said at least one gate sidewall spacer extends from adjacent said source injector tub region to adjacent said at least one polysilicon sidewall, and from adjacent said drain injector tub region to adjacent said at least one polysilicon sidewall.

83. The field effect transistor of claim 82 wherein said at least one gate sidewall spacer comprises an insulator having permittivity which is greater than the permittivity of said gate insulating layer.

84. The field effect transistor of claim 83 wherein said gate insulating layer comprises silicon dioxide and wherein said at least one gate sidewall spacer comprises silicon nitride.

85. The field effect transistor of claim 79 said source injector tub region extends to said substrate surface, wherein said gate insulating layer extends onto said source injector tub region at said substrate surface, wherein said at least one gate sidewall spacer also extends onto said source injector tub region at said substrate surface, wherein said drain injector tub region extends to said substrate surface, wherein said gate insulating layer extends onto said drain injector tub region at said substrate surface, and wherein said at least one gate sidewall spacer also extends onto said drain injector tub region at said substrate surface.

86. The field effect transistor of claim 85 wherein said at least one gate sidewall spacer comprises an insulator having permittivity which is greater than the permittivity of said gate insulating layer.

87. The field effect transistor of claim 86 wherein said gate insulating layer comprises silicon dioxide and wherein said at least one gate sidewall spacer comprises silicon nitride.

88. The field effect transistor of claim 77 wherein said source region includes a source sidewall and a source bottom, wherein said source sidewall is within said source injector tub region and wherein said source bottom extends outside said source injector tub region.

89. The field effect transistor of claim 77 wherein said tub region extends into said substrate a third predetermined depth from said substrate surface, said field effect transistor further comprising a bottom leakage controlling region of said first conductivity type in said substrate, extending across said substrate between extensions of said source and drain regions, and extending into said substrate from a fourth depth which is less than said first depth, to a fifth depth which is greater than said first depth.

90. The field effect transistor of claim 89 wherein said substrate is doped said first conductivity type at a relatively low doping concentration and wherein said bottom leakage control region is doped said first conductivity type at a relatively high doping concentration.

91. The field effect transistor of claim 77 further comprising a substrate contact region of said first conductivity type in said tub region at said substrate surface.

92. The field effect transistor of claim 77 wherein said tub region extends into said substrate a third predetermined depth from said substrate surface; wherein said source region and said drain region extend into said substrate a fourth predetermined depth from said substrate surface; and wherein said source injector tub region and said drain injector tub region extend into said substrate a fifth predetermined depth which is between said fourth predetermined depth and said third predetermined depth.

93. The field effect transistor of claim 77 wherein said tub region extends into said substrate a third predetermined depth from said substrate surface and wherein said source injector tub region and said drain injector tub region also extend into said substrate to said third predetermined depth.

94. The field effect transistor of claim 77 wherein said tub region extends a third predetermined depth from said substrate surface, at least said third predetermined depth being selected to produce a threshold voltage for said field effect transistor which is twice the Fermi potential of said semiconductor substrate.

95. The field effect transistor of claim 77 wherein said tub region extends a third predetermined depth from said substrate surface, at least said third predetermined depth being selected to allow carriers of said second conductivity type to flow from said source region to said drain region in said tub region, extending from a fourth predetermined depth between said third predetermined depth and said substrate surface towards said first surface, upon application of voltage to said gate electrode beyond the threshold voltage of said field effect transistor.

96. The field effect transistor of claim 77 wherein said tub region extends a third predetermined depth from said substrate surface, at least said third predetermined depth being selected to allow carriers of said second conductivity type to flow within said tub region, from said source region to said drain region and beneath said substrate surface, without creating an inversion layer in said tub region.

97. The field effect transistor of claim 77 wherein said tub region extends a third predetermined depth from said substrate surface, at least said third predetermined depth being selected to produce a first gate capacitance upon biasing said gate electrode from below the threshold voltage of said field effect transistor to said threshold voltage, and to produce a second gate capacitance upon biasing said gate electrode from above said threshold voltage to said threshold voltage.

98. The field effect transistor of claim 77 further comprising a substrate contact for electrically contacting said substrate; wherein said tub region extends a third predetermined depth from said substrate surface, wherein said gate electrode includes a polysilicon layer of said first conductivity type and a conductive electrode on said polysilicon layer opposite said gate insulating layer; at least said third predetermined depth being selected to produce a voltage at said substrate surface, adjacent said gate insulating layer, which is equal and opposite to the sum of the voltage between said substrate contact and said substrate and between said polysilicon layer and said conductive electrode.

99. The field effect transistor of claim 77 wherein said gate insulating layer is of predetermined thickness, and wherein said tub region extends a third predetermined depth from said substrate surface, at least said third predetermined depth being selected to produce a threshold voltage for said field effect transistor which is independent of said predetermined thickness, and current for said field effect transistor which increases inversely to said predetermined thickness.

100. A field effect transistor comprising:
a semiconductor substrate of first conductivity type;
a tub region of second conductivity type in said substrate at a surface thereof;
spaced apart source and drain regions of said second conductivity type in said tub region at said substrate surface;
a source injector region of said second conductivity type, adjacent said source region and facing said drain region;
wherein said tub region extends a predetermined depth from said substrate surface, at least said predetermined depth being selected to allow carriers of said second conductivity type to flow from said source region to said drain region in said tub region, extending from a second predetermined depth between said predetermined depth and said substrate surface towards said substrate surface, upon application of voltage to said gate electrode beyond the threshold voltage of said field effect transistor;
a gate insulating layer on said substrate at said substrate surface, between said spaced apart source and drain regions; and
source, drain and gate electrodes contacting said source and drain regions and said gate insulating layer, respectively.

101. The field effect transistor of claim 100 wherein said tub region is doped said second conductivity type at a relatively low doping concentration, wherein said source region is doped said second conductivity type at a relatively high doping concentration, and wherein said source injector region is doped said second conductivity type at an intermediate doping concentration between that of said tub region and said source region.

102. The field effect transistor of claim 100 further comprising a gate sidewall spacer on said substrate surface, extending from adjacent said source injector region to adjacent said gate electrode.

103. The field effect transistor of claim 102 wherein said gate sidewall spacer comprises an insulator having permittivity which is greater than the permittivity of said gate insulating layer.

104. The field effect transistor of claim 103 wherein said gate insulating layer comprises silicon dioxide and wherein said gate sidewall spacer comprises silicon nitride.

105. The field effect transistor of claim 102 wherein said gate electrode includes a polysilicon gate electrode layer of said first conductivity type on said gate insulating layer opposite said substrate surface, said polysilicon gate electrode layer including a polysilicon sidewall, and wherein said gate sidewall spacer extends from adjacent said source injector region to adjacent said polysilicon sidewall.

106. The field effect transistor of claim 105 wherein said gate sidewall spacer comprises an insulator having permittivity which is greater than the permittivity of said gate insulating layer.

107. The field effect transistor of claim 106 wherein said gate insulating layer comprises silicon dioxide and wherein said gate sidewall spacer comprises silicon nitride.

108. The field effect transistor of claim 102 wherein said source injector region extends to said substrate surface, wherein said gate insulating layer extends onto said source injector region at said substrate surface, and wherein said gate sidewall spacer also extends onto said source injector region at said substrate surface.

109. The field effect transistor of claim 108 wherein said gate sidewall spacer comprises an insulator having permittivity which is greater than the permittivity of said gate insulating layer.

110. The field effect transistor of claim 109 wherein said gate insulating layer comprises silicon dioxide and wherein said gate sidewall spacer comprises silicon nitride.

111. The field effect transistor of claim 100 further comprising a bottom leakage controlling region of said first conductivity type in said substrate, extending across said substrate between extensions of said source and drain regions, and extending into said substrate from a third depth which is less than said predetermined depth, to a fourth depth which is greater than said predetermined depth.

112. The field effect transistor of claim 111 wherein said substrate is doped said first conductivity type at a relatively low doping concentration and wherein said bottom leakage control region is doped said first conductivity type at a relatively high doping concentration.

113. The field effect transistor of claim 100 further comprising a substrate contact region of said first conductivity type in said tub region at said substrate surface.

114. The field effect transistor of claim 100 wherein said source region extends into said substrate a third predetermined depth from said substrate surface; and wherein said source injector region extends into said substrate a fourth predetermined depth which is between said third predetermined depth and said predetermined depth.

115. The field effect transistor of claim 100 wherein said source injector region also extends into said substrate to said predetermined depth.

116. The field effect transistor of claim 100 further comprising a channel of said second conductivity type in said tub region at said substrate surface, between said spaced apart source and drain regions; wherein said channel extends said second predetermined depth from said substrate surface and said tub region extends a third predetermined depth from said channel, at least one of said second and third predetermined depths being selected to produce zero static electric field perpendicular to said substrate surface at said second predetermined depth.

117. The field effect transistor of claim 100 wherein at least said predetermined depth is further selected to produce a threshold voltage for said field effect transistor which is twice the Fermi potential of said semiconductor substrate.

118. The field effect transistor of claim 100 wherein at least said predetermined depth is further selected to allow carriers of said second conductivity type to flow within said tub region, from said source region to said drain region and beneath said substrate surface, without creating an inversion layer in said tub region.

119. The field effect transistor of claim 100 wherein at least said predetermined depth is further selected to produce a first gate capacitance upon biasing said gate electrode from below the threshold voltage of said field effect transistor to said threshold voltage, and to produce a second gate capacitance upon biasing said gate electrode from above said threshold voltage to said threshold voltage.

120. The field effect transistor of claim 100 further comprising a substrate contact for electrically contacting said substrate; wherein said gate electrode includes a polysilicon layer of said first conductivity type and a conductive electrode on said polysilicon layer opposite said gate insulating layer; at least said predetermined depth being further selected to produce a voltage at said substrate surface, adjacent said gate insulating layer, which is equal and opposite to the sum of the voltage between said substrate contact and said substrate and between said polysilicon layer and said gate electrode.

121. The field effect transistor of claim 100 wherein said gate insulating layer is of predetermined thickness, and wherein at least said predetermined depth is further selected to produce a threshold voltage for said field effect transistor which is independent of said predetermined thickness, and current for said field effect transistor which increases inversely to said predetermined thickness.

122. A field effect transistor comprising:
a semiconductor substrate of first conductivity type:
a tub region of second conductivity type in said substrate at a surface thereof;
spaced apart source injector tub and drain injector tub regions of said second conductivity type in said tub region at said substrate surface;
a source region of said second conductivity type at least partially within said source injector tub region;
a drain region of said second conductivity type at least partially within said drain injector tub region;
wherein said tub region extends a predetermined depth from said substrate surface, at least said predetermined depth being selected to allow carriers of said second conductivity type to flow from said source region to said drain region in said tub region, extending from a second predetermined depth between said predetermined depth and said substrate surface towards said first surface, upon application of voltage to said gate electrode beyond the threshold voltage of said field effect transistor;
a gate insulating layer on said substrate at said substrate surface, between said spaced apart source and drain regions; and
source, drain and gate electrodes contacting said source and drain regions and said gate insulating layer, respectively.

123. The field effect transistor of claim 122 wherein said tub region is doped said second conductivity type at a relatively low doping concentration, wherein said source and drain regions are doped said second conductivity type at a relatively high doping concentration, and wherein said source and drain injector tub regions are doped said second conductivity type at an intermediate doping concentration between that of said tub region and said source and drain regions.

124. The field effect transistor of claim 122 further comprising at least one gate sidewall spacer on said substrate surfacer extending from adjacent said source injector tub region to adjacent said gate electrode, and from adjacent said drain injector tub region to adjacent said gate electrode.

125. The field effect transistor of claim 124 wherein said at least one gate sidewall spacer comprises an insulator having permittivity which is greater than the permittivity of said gate insulating layer.

126. The field effect transistor of claim 125 wherein said gate insulating layer comprises silicon dioxide and wherein said at least one gate sidewall spacer comprises silicon nitride.

127. The field effect transistor of claim 124 wherein said gate electrode includes a polysilicon gate electrode layer of said first conductivity type on said gate insulating layer opposite said substrate surface, said polysilicon gate electrode layer including at least one polysilicon sidewall, and wherein said at least one gate sidewall spacer extends from adjacent said source injector tub region to adjacent said at least one polysilicon sidewall, and from adjacent said drain injector tub region to adjacent said at least one polysilicon sidewall.

128. The field effect transistor of claim 127 wherein said at least one gate sidewall spacer comprises an insulator having permittivity which is greater than the permittivity of said gate insulating layer.

129. The field effect transistor of claim 128 wherein said gate insulating layer comprises silicon dioxide and wherein said at least one gate sidewall spacer comprises silicon nitride.

130. The field effect transistor of claim 124 said source injector tub region extends to said substrate surface, wherein said gate insulating layer extends onto said source injector tub region at said substrate surface, wherein said at least one gate sidewall spacer also extends onto said source injector tub region at said substrate surface, wherein said drain injector tub region extends to said substrate surface, wherein said gate insulating layer extends onto said drain injector tub region at said substrate surface, and wherein said at least one gate sidewall spacer also extends onto said drain injector tub region at said substrate surface.

131. The field effect transistor of claim 130 wherein said at least one gate sidewall spacer comprises an insulator having permittivity which is greater than the permittivity of said gate insulating layer.

132. The field effect transistor of claim 131 wherein said gate insulating layer comprises silicon dioxide and wherein said at least one gate sidewall spacer comprises silicon nitride.

133. The field effect transistor of claim 122 wherein said source region includes a source sidewall and a source bottom, wherein said source sidewall is within said source injector tub region and wherein said source bottom extends outside said source injector tub region.

134. The field effect transistor of claim 122 further comprising a bottom leakage controlling region of said first conductivity type in said substrate, extending across said substrate between extensions of said source and drain regions, and extending into said substrate from a third depth which is less than said predetermined depth, to a fourth depth which is greater than said predetermined depth.

135. The field effect transistor of claim 134 wherein said substrate is doped said first conductivity type at a relatively low doping concentration and wherein said bottom leakage control region is doped said first conductivity type at a relatively high doping concentration.

136. The field effect transistor of claim 122 further comprising a substrate contact region of said first conductivity type in said tub region at said substrate surface.

137. The field effect transistor of claim 122 wherein said source region and said drain region extend into said substrate a third predetermined depth from said substrate surface; and wherein said source injector tub region and said drain injector tub region extend into said substrate a fourth predetermined depth which is between said third predetermined depth and said predetermined depth.

138. The field effect transistor of claim 122 wherein said source injector tub region and said drain injector tub region also extend into said substrate to said predetermined depth.

139. The field effect transistor of claim 122 wherein at least said predetermined depth is further selected to produce a threshold voltage for said field effect transistor which is twice the Fermi potential of said semiconductor substrate.

140. The field effect transistor of claim 122 wherein at least said predetermined depth is further selected to allow carriers of said second conductivity type to flow within said tub region, from said source region to said drain region and beneath said substrate surface, without creating an inversion layer in said tub region.

141. The field effect transistor of claim 122 wherein at least said predetermined depth is further selected to produce a first gate capacitance upon biasing said gate electrode from below the threshold voltage of said field effect transistor to said threshold voltage, and to produce a second gate capacitance upon biasing said gate electrode from above said threshold voltage to said threshold voltage.

142. The field effect transistor of claim 122 further comprising a substrate contact for electrically contacting said substrate; wherein said gate electrode includes a polysilicon layer of said first conductivity type and a conductive electrode on said polysilicon layer opposite said gate insulating layer; at least said predetermined depth being selected to produce a voltage at said substrate surface, adjacent said gate insulating layer, which is equal and opposite to the sum of the voltage between said substrate contact and said substrate and between said polysilicon layer and said conductive electrode.

143. The field effect transistor of claim 122 wherein said gate insulating layer is of predetermined thickness, and wherein at least said predetermined depth is further selected to produce a threshold voltage for said field effect transistor which is independent of said predetermined thickness, and current for said field effect transistor which increases inversely to said predetermined thickness.

144. A field effect transistor comprising:
a semiconductor substrate of first conductivity type;
a tub region of second conductivity type in said substrate at a surface thereof, and extending into said substrate a first predetermined depth from said substrate surface;
spaced apart source and drain regions of said second conductivity type in said tub region at said substrate surface;

a bottom leakage controlling region of said first conductivity type in said substrate, extending across said substrate between extensions of said source and drain regions and extending into said substrate from a second depth which is less than said first predetermined depth to a third depth which is greater than said first predetermined depth;

a gate insulating layer on said substrate at said substrate surfacer between said spaced apart source and drain regions; and source, drain and gate electrodes contacting said source and drain regions and said gate insulating layer, respectively;

wherein at least said first predetermined depth being selected to allow carriers of said second conductivity type to flow from said source region to said drain region in said tub region, extending from a fourth predetermined depth between said first predetermined depth and said substrate surface towards said surface, upon application of voltage to said gate electrode beyond the threshold voltage of said field effect transistor.

145. The field effect transistor of claim 144 wherein said substrate is doped said first conductivity type at a relatively low doping concentration and wherein said bottom leakage control region is doped said first conductivity type at a relatively high doping concentration.

146. The field effect transistor of claim 144 wherein at least said first predetermined depth is selected to produce a threshold voltage for said field effect transistor which is twice the Fermi potential of said semiconductor substrate.

* * * * *

UNITED STATES PATENT AND TRADEMARK OFFICE
CERTIFICATE OF CORRECTION

PATENT NO. : 5,374,836
DATED : December 20, 1994
INVENTOR(S) : Vinal et al.

It is certified that error appears in the above-identified patent and that said Letters Patent is hereby corrected as shown below:

Column 13, line 45, Equation (21) should appear as follows:

$$I_{satp} = \frac{C_g^* Z (V_g - V_t)^2 \mu_{po}}{2L_o \left[ 1 + \frac{(V_g - V_t) \mu_{po}}{2L_o V_{sat}} \right]}$$

Column 23, line 3, "Y^/=δ2" should be --Y^=δ/2--.

Column 27, lines 3-4, Equation (C19) should appear as follows:

$$\overline{U} \cdot [D_1 - D_2] = Q_s = qN^{2/3}$$

UNITED STATES PATENT AND TRADEMARK OFFICE
CERTIFICATE OF CORRECTION

PATENT NO. : 5,374,836
DATED : December 20, 1994
INVENTOR(S) : Vinal et al.

It is certified that error appears in the above-indentified patent and that said Letters Patent is hereby corrected as shown below:

Column 27, line 8, "vector D2" should be --vector $D_2$--.

Column 28, lines 20-24, Equation (C28) should be Equation (C29) and should appear as follows:

$$W_{d1li}^* = f(Vfb) = \sqrt{\frac{2e_s \frac{KT}{q} \ln\left(\frac{N_d N_c}{N_i^2 e^{qVfb/KT}}\right)}{qN_{do}}}$$

UNITED STATES PATENT AND TRADEMARK OFFICE
CERTIFICATE OF CORRECTION

PATENT NO. : 5,374,836
DATED : December 20, 1994
INVENTOR(S) : Vinal et al

It is certified that error appears in the above-indentified patent and that said Letters Patent is hereby corrected as shown below:

<u>In the Claims</u>:

```
Column 42, line 24, "at least one" should be --a--.
Column 42, line 27, "at least one" should be --a--.
Column 42, line 29, "at least one" should be --a--.
Column 47, line 23, "at least one" should be --a--.
Column 47, line 25, "at least one" should be --a--.
Column 49, line  9, "surfacer" should be --surface--.
```

Signed and Sealed this

Thirtieth Day of April, 1996

Attest:

BRUCE LEHMAN

Attesting Officer

Commissioner of Patents and Trademarks

UNITED STATES PATENT AND TRADEMARK OFFICE
CERTIFICATE OF CORRECTION

PATENT NO.    : 5,374,836
DATED         : December 20,1994
INVENTOR(S)   : Albert W. Vinal et al.

It is certified that error appears in the above-identified patent and that said Letters Patent is hereby corrected as shown below:

<u>Title page,</u>
Item [*] Notice, should be corrected as appear below:
-- The portion of the term of this patent subsequent to March 16, 2010 has been disclaimed. --

Signed and Sealed this

Twenty-fourth Day of February, 2004

JON W. DUDAS
*Acting Director of the United States Patent and Trademark Office*